(12) United States Patent
Bhattacharyya

(10) Patent No.: US 11,216,742 B2
(45) Date of Patent: Jan. 4, 2022

(54) DATA COMPRESSION AND COMMUNICATION USING MACHINE LEARNING

(71) Applicant: ioCurrents, Inc., Seattle, WA (US)

(72) Inventor: Bhaskar Bhattacharyya, Seattle, WA (US)

(73) Assignee: IOCURRENTS, INC., Seattle, WA (US)

(*) Notice: Subject to any disclaimer, the term of this patent is extended or adjusted under 35 U.S.C. 154(b) by 0 days.

(21) Appl. No.: 16/776,221

(22) Filed: Jan. 29, 2020

(65) Prior Publication Data

US 2020/0285983 A1   Sep. 10, 2020

Related U.S. Application Data

(60) Provisional application No. 62/813,664, filed on Mar. 4, 2019.

(51) Int. Cl.
*G06N 7/00* (2006.01)
*G06N 20/00* (2019.01)
*G06F 16/2458* (2019.01)

(52) U.S. Cl.
CPC ......... *G06N 7/005* (2013.01); *G06F 16/2474* (2019.01); *G06N 20/00* (2019.01)

(58) Field of Classification Search
CPC .... G06N 7/005; G06N 20/00; G06F 16/2474; G01W 1/10
See application file for complete search history.

(56) References Cited

U.S. PATENT DOCUMENTS

| | | |
|---|---|---|
| 5,243,546 A | 9/1993 | Maggard |
| 5,486,762 A | 1/1996 | Freedman et al. |
| 5,515,477 A | 5/1996 | Sutherland |
| 5,529,901 A | 6/1996 | Van Doorn et al. |
| 5,561,421 A | 10/1996 | Smith et al. |
| 5,641,689 A | 6/1997 | Van Doorn et al. |
| 5,659,362 A | 8/1997 | Kovac et al. |
| 5,667,541 A | 9/1997 | Klun et al. |
| 5,682,317 A | 10/1997 | Keeler et al. |
| 5,770,606 A | 6/1998 | El-Rashidy et al. |

(Continued)

OTHER PUBLICATIONS

Rune Prytz, ("Machine learning methods for vehicle predictive maintenance using off-board and on-board data"), 2014, Halmstad University Dissertations No. 9, Halmstad University Press, pp. 1-96. (Year: 2014).*

(Continued)

*Primary Examiner* — Kamran Afshar
*Assistant Examiner* — Ying Yu Chen
(74) *Attorney, Agent, or Firm* — Seed IP Law Group LLP

(57) ABSTRACT

A method of communicating information, comprising modeling a stream of sensor data, to produce parameters of a predictive statistical model; communicating information defining the predictive statistical model from a transmitter to a receiver; and after communicating the information defining the predictive statistical model to the receiver, communicating information characterizing subsequent sensor data from the transmitter to the receiver, dependent on an error of the subsequent sensor data with respect to a prediction of the subsequent sensor data by the statistical model. A corresponding method is also encompassed.

29 Claims, 2 Drawing Sheets

(56) References Cited

U.S. PATENT DOCUMENTS

| | | | |
|---|---|---|---|
| 5,915,036 | A | 6/1999 | Grunkin et al. |
| 5,985,889 | A | 11/1999 | El-Rashidy et al. |
| 6,006,182 | A | 12/1999 | Fakhr et al. |
| 6,043,037 | A | 3/2000 | Lucas |
| 6,064,960 | A | 5/2000 | Bellegarda et al. |
| 6,081,211 | A | 6/2000 | De Queiroz et al. |
| 6,121,276 | A | 9/2000 | El-Rashidy et al. |
| 6,132,974 | A | 10/2000 | Lucas |
| 6,140,057 | A | 10/2000 | Lucas |
| 6,200,983 | B1 | 3/2001 | El-Rashidy et al. |
| 6,219,457 | B1 | 4/2001 | Potu |
| 6,223,162 | B1 | 4/2001 | Chen et al. |
| 6,226,393 | B1 | 5/2001 | Grunkin et al. |
| 6,300,888 | B1 | 10/2001 | Chen et al. |
| 6,306,437 | B1 | 10/2001 | El-Rashidy et al. |
| 6,356,363 | B1 | 3/2002 | Cooper et al. |
| 6,362,756 | B1 | 3/2002 | Shannon |
| 6,366,884 | B1 | 4/2002 | Bellegarda et al. |
| 6,389,389 | B1 | 5/2002 | Meunier et al. |
| 6,401,070 | B1 | 6/2002 | McManus et al. |
| 6,404,925 | B1 | 6/2002 | Foote et al. |
| 6,404,932 | B1 | 6/2002 | Hata et al. |
| 6,411,729 | B1 | 6/2002 | Grunkin |
| 6,444,870 | B1 | 9/2002 | Zhang et al. |
| 6,490,373 | B2 | 12/2002 | Hata et al. |
| 6,510,250 | B2 | 1/2003 | Hata et al. |
| 6,519,599 | B1 | 2/2003 | Chickering et al. |
| 6,553,344 | B2 | 4/2003 | Bellegarda et al. |
| 6,566,368 | B2 | 5/2003 | El-Rashidy et al. |
| 6,606,037 | B2 | 8/2003 | Ekstrand et al. |
| 6,633,857 | B1 | 10/2003 | Tipping |
| 6,662,185 | B1 | 12/2003 | Stark et al. |
| 6,664,902 | B2 | 12/2003 | Andrew et al. |
| 6,671,414 | B1 | 12/2003 | Micchelli et al. |
| 6,675,185 | B1 | 1/2004 | Mitchell et al. |
| 6,678,423 | B1 | 1/2004 | Trenary et al. |
| 6,684,252 | B1 | 1/2004 | Chow |
| 6,703,231 | B2 | 3/2004 | Elbers et al. |
| 6,704,718 | B2 | 3/2004 | Burges et al. |
| 6,735,630 | B1 | 5/2004 | Gelvin et al. |
| 6,751,354 | B2 | 6/2004 | Foote et al. |
| 6,757,439 | B2 | 6/2004 | Leeder et al. |
| 6,760,480 | B2 | 7/2004 | Hata et al. |
| 6,774,917 | B1 | 8/2004 | Foote et al. |
| 6,785,652 | B2 | 8/2004 | Bellegarda et al. |
| 6,795,506 | B1 | 9/2004 | Zhang et al. |
| 6,795,786 | B2 | 9/2004 | LaMarca et al. |
| 6,801,668 | B2 | 10/2004 | Fröjdh et al. |
| 6,804,600 | B1 | 10/2004 | Uluyol et al. |
| 6,826,607 | B1 | 11/2004 | Gelvin et al. |
| 6,832,006 | B2 | 12/2004 | Savakis et al. |
| 6,832,251 | B1 | 12/2004 | Gelvin et al. |
| 6,839,003 | B2 | 1/2005 | Soliman et al. |
| 6,859,831 | B1 | 2/2005 | Gelvin et al. |
| 6,879,944 | B1 | 4/2005 | Tipping et al. |
| 6,895,083 | B1 | 5/2005 | Bers et al. |
| 6,895,101 | B2 | 5/2005 | Celik et al. |
| 6,895,121 | B2 | 5/2005 | Joshi et al. |
| 6,927,710 | B2 | 8/2005 | Linzer et al. |
| 6,939,670 | B2 | 9/2005 | Pressman et al. |
| 6,941,019 | B1 | 9/2005 | Mitchell et al. |
| 7,006,568 | B1 | 2/2006 | Gu et al. |
| 7,020,578 | B2 | 3/2006 | Sorensen et al. |
| 7,020,701 | B1 | 3/2006 | Gelvin et al. |
| 7,039,654 | B1 | 5/2006 | Eder |
| 7,043,287 | B1 | 5/2006 | Khalil et al. |
| 7,050,646 | B2 | 5/2006 | Xu et al. |
| 7,068,641 | B1 | 6/2006 | Allan et al. |
| 7,069,258 | B1 | 6/2006 | Bothwell |
| 7,081,693 | B2 | 7/2006 | Hamel et al. |
| 7,099,523 | B2 | 8/2006 | Martens et al. |
| 7,117,185 | B1 | 10/2006 | Aliferis et al. |
| 7,126,500 | B2 | 10/2006 | Adams et al. |
| 7,144,869 | B2 | 12/2006 | Wolff et al. |
| 7,146,053 | B1 | 12/2006 | Rijavec et al. |
| 7,170,201 | B2 | 1/2007 | Hamel et al. |
| 7,179,797 | B2 | 2/2007 | McNeel |
| 7,207,041 | B2 | 4/2007 | Elson et al. |
| 7,208,517 | B1 | 4/2007 | Winn et al. |
| 7,228,171 | B2 | 6/2007 | Lesser et al. |
| 7,231,180 | B2 | 6/2007 | Benson et al. |
| 7,238,799 | B2 | 7/2007 | Hadjiargyrou et al. |
| 7,246,314 | B2 | 7/2007 | Foote et al. |
| 7,256,505 | B2 | 8/2007 | Arms et al. |
| 7,266,661 | B2 | 9/2007 | Walmsley |
| 7,268,137 | B2 | 9/2007 | Campochiaro |
| 7,298,925 | B2 | 11/2007 | Nowicki et al. |
| 7,306,913 | B2 | 12/2007 | Devlin et al. |
| 7,309,598 | B2 | 12/2007 | Elbers et al. |
| 7,328,625 | B2 | 2/2008 | Sundermeyer et al. |
| 7,336,720 | B2 | 2/2008 | Martemyanov et al. |
| 7,337,033 | B1 | 2/2008 | Ontalus et al. |
| 7,339,957 | B2 | 3/2008 | Hitt |
| 7,346,507 | B1 | 3/2008 | Natarajan et al. |
| 7,361,998 | B2 | 4/2008 | Hamel et al. |
| 7,365,455 | B2 | 4/2008 | Hamel et al. |
| 7,379,890 | B2 | 5/2008 | Myr et al. |
| 7,385,503 | B1 | 6/2008 | Wells et al. |
| 7,389,114 | B2 | 6/2008 | Ju et al. |
| 7,398,164 | B2 | 7/2008 | Ogushi et al. |
| 7,401,057 | B2 | 7/2008 | Eder |
| 7,426,499 | B2 | 9/2008 | Eder |
| 7,429,805 | B2 | 9/2008 | Hamel et al. |
| 7,443,509 | B1 | 10/2008 | Burns |
| 7,445,896 | B2 | 11/2008 | Rieder et al. |
| 7,473,687 | B2 | 1/2009 | Hoffman et al. |
| 7,474,805 | B2 | 1/2009 | Nowicki et al. |
| 7,482,117 | B2 | 1/2009 | Cargill et al. |
| 7,483,871 | B2 | 1/2009 | Herz |
| 7,487,066 | B2 | 2/2009 | Sundermeyer et al. |
| 7,494,783 | B2 | 2/2009 | Soreq et al. |
| 7,504,970 | B2 | 3/2009 | Fulcomer |
| 7,516,572 | B2 | 4/2009 | Yang et al. |
| 7,518,538 | B1 | 4/2009 | Schneider |
| 7,532,763 | B2 | 5/2009 | Yu et al. |
| 7,538,697 | B1 | 5/2009 | Schneider |
| 7,547,683 | B2 | 6/2009 | Wolff et al. |
| 7,550,504 | B2 | 6/2009 | Pablos |
| 7,561,972 | B1 | 7/2009 | Welch et al. |
| 7,561,973 | B1 | 7/2009 | Welch et al. |
| 7,564,383 | B2 | 7/2009 | Schneider |
| 7,578,793 | B2 | 8/2009 | Todros et al. |
| 7,583,961 | B2 | 9/2009 | Kappes et al. |
| 7,590,516 | B2 | 9/2009 | Jourdan et al. |
| 7,592,507 | B2 | 9/2009 | Beeckman et al. |
| 7,593,815 | B2 | 9/2009 | Willen et al. |
| 7,605,485 | B2 | 10/2009 | Pitchford et al. |
| 7,605,721 | B2 | 10/2009 | Schneider |
| 7,609,838 | B2 | 10/2009 | Westhoff et al. |
| 7,612,692 | B2 | 11/2009 | Schneider |
| 7,625,699 | B2 | 12/2009 | Devlin et al. |
| 7,629,901 | B1 | 12/2009 | Schneider |
| 7,630,563 | B2 | 12/2009 | Irvine et al. |
| 7,630,736 | B2 | 12/2009 | Wang |
| 7,645,984 | B2 | 1/2010 | Gorenstein et al. |
| 7,646,814 | B2 | 1/2010 | Winger et al. |
| 7,651,840 | B2 | 1/2010 | Li et al. |
| 7,653,491 | B2 | 1/2010 | Schadt et al. |
| 7,660,203 | B2 | 2/2010 | Barakat et al. |
| 7,660,295 | B2 | 2/2010 | Allan et al. |
| 7,660,355 | B2 | 2/2010 | Winger et al. |
| 7,662,564 | B2 | 2/2010 | Jiang et al. |
| 7,671,480 | B2 | 3/2010 | Pitchford et al. |
| 7,685,084 | B2 | 3/2010 | Sisk et al. |
| 7,693,683 | B2 | 4/2010 | Ihara |
| 7,695,911 | B2 | 4/2010 | Li et al. |
| 7,695,916 | B2 | 4/2010 | Iakoubova et al. |
| 7,698,213 | B2 | 4/2010 | Lancaster |
| 7,700,074 | B2 | 4/2010 | Pettegrew et al. |
| 7,702,482 | B2 | 4/2010 | Graepel et al. |
| 7,702,576 | B2 | 4/2010 | Fahner et al. |
| 7,709,460 | B2 | 5/2010 | McCaddon |
| 7,710,455 | B2 | 5/2010 | Aramaki et al. |
| 7,711,488 | B2 | 5/2010 | Hsu et al. |

(56) References Cited

U.S. PATENT DOCUMENTS

| | | |
|---|---|---|
| 7,719,416 B2 | 5/2010 | Arms et al. |
| 7,719,448 B2 | 5/2010 | Schneider |
| 7,727,725 B2 | 6/2010 | Huang et al. |
| 7,729,864 B2 | 6/2010 | Schadt |
| 7,730,063 B2 | 6/2010 | Eder |
| 7,743,009 B2 | 6/2010 | Hangartner et al. |
| 7,743,309 B2 | 6/2010 | Li et al. |
| 7,747,392 B2 | 6/2010 | Ruaño et al. |
| 7,751,984 B2 | 7/2010 | Tang |
| 7,764,958 B2 | 7/2010 | Townsend et al. |
| 7,774,272 B2 | 8/2010 | Fahner et al. |
| 7,781,168 B2 | 8/2010 | Iakoubova et al. |
| 7,788,970 B2 | 9/2010 | Hitt et al. |
| 7,797,367 B1 | 9/2010 | Gelvin et al. |
| 7,799,530 B2 | 9/2010 | Iakoubova et al. |
| 7,802,015 B2 | 9/2010 | Cheifot et al. |
| 7,805,405 B2 | 9/2010 | Fernandez |
| 7,807,138 B2 | 10/2010 | Berger et al. |
| 7,811,794 B2 | 10/2010 | Cargill et al. |
| 7,813,981 B2 | 10/2010 | Fahner et al. |
| 7,816,083 B2 | 10/2010 | Grupe et al. |
| 7,820,380 B2 | 10/2010 | Huang |
| 7,821,426 B2 | 10/2010 | Schneider |
| 7,829,282 B2 | 11/2010 | Rieder et al. |
| 7,833,706 B2 | 11/2010 | Begovich et al. |
| 7,840,408 B2 | 11/2010 | Yi et al. |
| 7,844,687 B1 | 11/2010 | Gelvin et al. |
| 7,853,456 B2 | 12/2010 | Soto et al. |
| 7,863,021 B2 | 1/2011 | Schrodi et al. |
| 7,873,567 B2 | 1/2011 | Eder |
| 7,873,634 B2 | 1/2011 | Desbiens |
| 7,873,673 B2 | 1/2011 | Cleveland et al. |
| 7,881,206 B2 | 2/2011 | St. Pierre et al. |
| 7,881,544 B2 | 2/2011 | Bashyam et al. |
| 7,885,988 B2 | 2/2011 | Bashyam et al. |
| 7,888,016 B2 | 2/2011 | Rieder et al. |
| 7,888,461 B2 | 2/2011 | Firestein-Miller |
| 7,888,486 B2 | 2/2011 | Walsh et al. |
| 7,890,403 B1 | 2/2011 | Smith et al. |
| 7,893,041 B2 | 2/2011 | Morrow et al. |
| 7,904,135 B2 | 3/2011 | Menezes et al. |
| 7,908,928 B2 | 3/2011 | Vik et al. |
| 7,910,107 B2 | 3/2011 | Walsh et al. |
| 7,910,303 B2 | 3/2011 | Bare et al. |
| 7,913,556 B2 | 3/2011 | Hsu et al. |
| 7,915,244 B2 | 3/2011 | Hoffman et al. |
| 7,921,069 B2 | 4/2011 | Canny et al. |
| 7,933,741 B2 | 4/2011 | Willen et al. |
| 7,936,932 B2 | 5/2011 | Bashyam et al. |
| 7,947,451 B2 | 5/2011 | Li et al. |
| 7,953,559 B2 | 5/2011 | Sundermeyer et al. |
| 7,953,676 B2 | 5/2011 | Agarwal et al. |
| 7,957,222 B2 | 6/2011 | Souders et al. |
| 7,961,959 B2 | 6/2011 | Bashyam et al. |
| 7,961,960 B2 | 6/2011 | Bashyam et al. |
| 7,970,216 B2 | 6/2011 | Bashyam et al. |
| 7,970,640 B2 | 6/2011 | Eder |
| 7,974,478 B2 | 7/2011 | Bashyam et al. |
| 7,977,052 B2 | 7/2011 | Luke et al. |
| 7,987,148 B2 | 7/2011 | Hangartner et al. |
| 7,990,262 B2 | 8/2011 | Weaver et al. |
| 7,993,833 B2 | 8/2011 | Begovich et al. |
| 7,996,342 B2 | 8/2011 | Grabarnik et al. |
| 8,000,314 B2 | 8/2011 | Brownrigg et al. |
| 8,005,140 B2 | 8/2011 | Yang et al. |
| 8,005,620 B2 | 8/2011 | Gustafsson et al. |
| 8,010,319 B2 | 8/2011 | Walters et al. |
| 8,010,476 B2 | 8/2011 | Fung et al. |
| 8,011,255 B2 | 9/2011 | Arms et al. |
| 8,013,731 B2 | 9/2011 | Weaver et al. |
| 8,013,732 B2 | 9/2011 | Petite et al. |
| 8,017,317 B2 | 9/2011 | Elbers et al. |
| 8,017,908 B2 | 9/2011 | Gorenstein et al. |
| 8,024,125 B2 | 9/2011 | Hsu et al. |
| 8,024,980 B2 | 9/2011 | Arms et al. |
| 8,026,113 B2 | 9/2011 | Kaushal et al. |
| 8,026,808 B2 | 9/2011 | Weaver et al. |
| 8,027,947 B2 | 9/2011 | Hinsz et al. |
| 8,031,650 B2 | 10/2011 | Petite et al. |
| 8,035,511 B2 | 10/2011 | Weaver et al. |
| 8,037,043 B2 | 10/2011 | Zoeter et al. |
| 8,039,212 B2 | 10/2011 | Li et al. |
| 8,044,812 B2 | 10/2011 | Harres |
| 8,064,412 B2 | 11/2011 | Petite |
| 8,071,291 B2 | 12/2011 | Bare et al. |
| 8,071,302 B2 | 12/2011 | Huang |
| 8,073,331 B1 | 12/2011 | Mazed |
| 8,086,864 B2 | 12/2011 | Kim et al. |
| 8,094,713 B2 | 1/2012 | Clark |
| 8,098,485 B2 | 1/2012 | Weaver et al. |
| 8,103,537 B2 | 1/2012 | Chickering et al. |
| 8,104,993 B2 | 1/2012 | Hitt et al. |
| 8,111,156 B2 | 2/2012 | Song et al. |
| 8,112,381 B2 | 2/2012 | Yuan et al. |
| 8,112,624 B2 | 2/2012 | Parkinson et al. |
| 8,126,653 B2 | 2/2012 | Welch et al. |
| 8,135,548 B2 | 3/2012 | Breton et al. |
| 8,140,658 B1 | 3/2012 | Gelvin et al. |
| 8,148,070 B2 | 4/2012 | Iakoubova et al. |
| 8,152,750 B2 | 4/2012 | Vournakis et al. |
| 8,153,366 B2 | 4/2012 | Rieder et al. |
| 8,160,136 B2 | 4/2012 | Sezer |
| 8,171,136 B2 | 5/2012 | Petite |
| 8,175,403 B1 | 5/2012 | Alakuijala |
| 8,178,834 B2 | 5/2012 | Gorenstein et al. |
| 8,185,316 B2 | 5/2012 | Alam et al. |
| 8,185,486 B2 | 5/2012 | Eder |
| 8,193,929 B1 | 6/2012 | Siu et al. |
| 8,193,930 B2 | 6/2012 | Petite et al. |
| 8,194,655 B2 | 6/2012 | Pister |
| 8,194,858 B2 | 6/2012 | Bukshpun et al. |
| 8,195,814 B2 | 6/2012 | Shelby |
| 8,199,635 B2 | 6/2012 | Taylor et al. |
| 8,204,224 B2 | 6/2012 | Xiao et al. |
| 8,211,638 B2 | 7/2012 | Huang et al. |
| 8,212,667 B2 | 7/2012 | Petite et al. |
| 8,214,082 B2 | 7/2012 | Tsai et al. |
| 8,214,315 B2 | 7/2012 | Hangartner et al. |
| 8,214,370 B1 | 7/2012 | Turon et al. |
| 8,216,786 B2 | 7/2012 | Shiffman et al. |
| 8,217,078 B1 | 7/2012 | Singh et al. |
| 8,219,848 B2 | 7/2012 | Branson et al. |
| 8,221,273 B2 | 7/2012 | Donahoe |
| 8,222,270 B2 | 7/2012 | Nordsiek et al. |
| 8,223,010 B2 | 7/2012 | Petite et al. |
| 8,225,129 B2 | 7/2012 | Douglis et al. |
| 8,227,189 B2 | 7/2012 | Bare et al. |
| 8,233,471 B2 | 7/2012 | Brownrigg et al. |
| 8,234,150 B1 | 7/2012 | Pickton et al. |
| 8,234,151 B1 | 7/2012 | Pickton et al. |
| 8,236,816 B2 | 8/2012 | Nordsiek et al. |
| 8,238,290 B2 | 8/2012 | Ordentlich et al. |
| 8,260,575 B2 | 9/2012 | Walters et al. |
| 8,264,401 B1 | 9/2012 | Kavaler |
| 8,265,657 B2 | 9/2012 | Shao et al. |
| 8,270,745 B2 | 9/2012 | Fuchie et al. |
| 8,279,067 B2 | 10/2012 | Berger et al. |
| 8,279,080 B2 | 10/2012 | Pitchford et al. |
| 8,280,671 B2 | 10/2012 | Luo et al. |
| 8,282,517 B2 | 10/2012 | Donahoe |
| 8,283,440 B2 | 10/2012 | Firestein-Miller |
| 8,289,184 B2 | 10/2012 | Strohm |
| 8,291,069 B1 | 10/2012 | Phillips |
| 8,299,109 B2 | 10/2012 | Nordsiek et al. |
| 8,305,899 B2 | 11/2012 | Luo et al. |
| 8,306,340 B2 | 11/2012 | Ceperkovic et al. |
| 8,311,849 B2 | 11/2012 | Soto et al. |
| 8,325,030 B2 | 12/2012 | Townsend et al. |
| 8,328,950 B2 | 12/2012 | Baseman et al. |
| 8,330,596 B2 | 12/2012 | Tanaka et al. |
| 8,331,441 B2 | 12/2012 | Yang et al. |
| 8,335,304 B2 | 12/2012 | Petite |
| 8,346,688 B2 | 1/2013 | Carroll et al. |
| 8,349,327 B2 | 1/2013 | Walsh et al. |

(56) References Cited

U.S. PATENT DOCUMENTS

| | | |
|---|---|---|
| 8,350,750 B2 | 1/2013 | Paek et al. |
| 8,351,688 B2 | 1/2013 | Hancock et al. |
| 8,359,347 B2 | 1/2013 | Branson et al. |
| 8,364,627 B2 | 1/2013 | Canny et al. |
| 8,370,935 B1 | 2/2013 | Jakobsson et al. |
| 8,372,625 B2 | 2/2013 | Walsh et al. |
| 8,373,576 B2 | 2/2013 | Strohm |
| 8,374,451 B2 | 2/2013 | Shibata et al. |
| 8,374,837 B2 | 2/2013 | De Winter et al. |
| 8,375,442 B2 | 2/2013 | Jakobsson et al. |
| 8,379,564 B2 | 2/2013 | Petite et al. |
| 8,383,338 B2 | 2/2013 | Kitzman et al. |
| 8,395,496 B2 | 3/2013 | Joshi et al. |
| 8,401,798 B2 | 3/2013 | Welch et al. |
| 8,410,931 B2 | 4/2013 | Petite et al. |
| 8,411,742 B2 | 4/2013 | Yang et al. |
| 8,412,461 B2 | 4/2013 | Gustafsson et al. |
| 8,412,465 B2 | 4/2013 | Fu et al. |
| 8,415,093 B2 | 4/2013 | Pribenszky et al. |
| 8,417,762 B2 | 4/2013 | Branson et al. |
| 8,421,274 B2 | 4/2013 | Sun et al. |
| 8,434,356 B2 | 5/2013 | Hsu et al. |
| 8,446,884 B2 | 5/2013 | Petite et al. |
| 8,451,766 B2 | 5/2013 | Lee et al. |
| 8,452,621 B1 | 5/2013 | Leong et al. |
| 8,452,638 B2 | 5/2013 | Pickton et al. |
| 8,455,468 B2 | 6/2013 | Hoffman et al. |
| 8,458,457 B2 | 6/2013 | Parkinson |
| 8,461,849 B1 | 6/2013 | Almonte et al. |
| 8,463,582 B2 | 6/2013 | Song et al. |
| 8,465,980 B2 | 6/2013 | Lin et al. |
| 8,473,249 B2 | 6/2013 | Handley et al. |
| 8,476,077 B2 | 7/2013 | Lin et al. |
| 8,480,110 B2 | 7/2013 | Gorenstein et al. |
| 8,489,063 B2 | 7/2013 | Petite |
| 8,489,499 B2 | 7/2013 | Yan et al. |
| 8,493,601 B2 | 7/2013 | Hull et al. |
| 8,496,934 B2 | 7/2013 | Walsh et al. |
| 8,497,084 B2 | 7/2013 | Markowitz et al. |
| 8,498,915 B2 | 7/2013 | Eder |
| 8,501,718 B2 | 8/2013 | Gleicher et al. |
| 8,501,719 B2 | 8/2013 | Gleicher et al. |
| 8,509,555 B2 | 8/2013 | Meany |
| 8,514,928 B2 | 8/2013 | Clark |
| 8,515,719 B2 | 8/2013 | Tamaki et al. |
| 8,521,294 B2 | 8/2013 | Sarma et al. |
| 8,527,352 B2 | 9/2013 | Chatwin et al. |
| 8,529,383 B2 | 9/2013 | Donahoe |
| 8,530,831 B1 | 9/2013 | Coon et al. |
| 8,533,473 B2 | 9/2013 | Gupta et al. |
| 8,536,998 B1 | 9/2013 | Siu et al. |
| 8,540,644 B2 | 9/2013 | Husheer |
| 8,543,428 B1 | 9/2013 | Jones, III et al. |
| 8,544,089 B2 | 9/2013 | Jakobsson et al. |
| 8,552,861 B2 | 10/2013 | Bastide et al. |
| 8,559,271 B2 | 10/2013 | Barakat et al. |
| 8,563,295 B2 | 10/2013 | Davis et al. |
| 8,566,070 B2 | 10/2013 | Tamaki et al. |
| 8,568,995 B2 | 10/2013 | Lopes-Virella et al. |
| 8,569,574 B2 | 10/2013 | Khatib et al. |
| 8,572,290 B1 | 10/2013 | Mukhopadhyay et al. |
| 8,582,481 B2 | 11/2013 | Kim et al. |
| 8,585,517 B2 | 11/2013 | Donahoe |
| 8,585,606 B2 | 11/2013 | McDonald et al. |
| 8,600,560 B2 | 12/2013 | Smith et al. |
| 8,600,870 B2 | 12/2013 | Milana |
| 8,614,060 B2 | 12/2013 | Rieder et al. |
| 8,615,374 B1 | 12/2013 | Discenzo |
| 8,618,164 B2 | 12/2013 | Singh et al. |
| 8,625,496 B2 | 1/2014 | Brownrigg et al. |
| 8,626,697 B1 | 1/2014 | Chaine et al. |
| 8,630,965 B2 | 1/2014 | Savvides et al. |
| 8,635,029 B2 | 1/2014 | Gustafsson et al. |
| 8,635,654 B2 | 1/2014 | Correa et al. |
| 8,638,217 B2 | 1/2014 | Arms et al. |
| 8,639,618 B2 | 1/2014 | Yan et al. |
| 8,644,171 B2 | 2/2014 | Meany et al. |
| 8,645,298 B2 | 2/2014 | Hennig et al. |
| 8,647,819 B2 | 2/2014 | Khatib |
| 8,652,776 B2 | 2/2014 | Lavedan et al. |
| 8,660,786 B2 | 2/2014 | Bengtson et al. |
| 8,666,357 B2 | 3/2014 | Petite |
| 8,669,063 B2 | 3/2014 | Weinschenk et al. |
| 8,682,812 B1 | 3/2014 | Ranjan |
| 8,682,876 B2 | 3/2014 | Shamlin et al. |
| 8,687,810 B2 | 4/2014 | Bukshpun et al. |
| 8,688,850 B2 | 4/2014 | Branson et al. |
| 8,694,455 B2 | 4/2014 | Eder |
| 8,694,474 B2 | 4/2014 | Wu |
| 8,700,064 B2 | 4/2014 | Shao et al. |
| 8,704,656 B2 | 4/2014 | Abedi |
| 8,706,589 B1 | 4/2014 | Smith et al. |
| 8,711,743 B2 | 4/2014 | De Poorter et al. |
| 8,712,937 B1 | 4/2014 | Bacus et al. |
| 8,713,025 B2 | 4/2014 | Eder |
| 8,715,704 B2 | 5/2014 | Skelton et al. |
| 8,715,943 B2 | 5/2014 | Princen et al. |
| 8,718,140 B1 | 5/2014 | Cai et al. |
| 8,718,958 B2 | 5/2014 | Breton et al. |
| 8,724,866 B2 | 5/2014 | Wu et al. |
| 8,725,456 B1 | 5/2014 | Saha et al. |
| 8,725,541 B2 | 5/2014 | Andrist et al. |
| 8,731,052 B2 | 5/2014 | Fuchie |
| 8,731,728 B2 | 5/2014 | Milosevic et al. |
| 8,731,977 B1 | 5/2014 | Hardin et al. |
| 8,732,534 B2 | 5/2014 | Kini et al. |
| 8,733,168 B2 | 5/2014 | Donahoe et al. |
| 8,741,635 B2 | 6/2014 | Lindeman et al. |
| 8,741,956 B2 | 6/2014 | Singh et al. |
| 8,754,805 B2 | 6/2014 | Wang et al. |
| 8,756,173 B2 | 6/2014 | Hunzinger et al. |
| 8,766,172 B2 | 7/2014 | Gorenstein et al. |
| 8,769,094 B2 | 7/2014 | Phillips |
| 8,776,062 B2 | 7/2014 | Garbow et al. |
| 8,781,768 B2 | 7/2014 | Gershinsky et al. |
| 8,787,246 B2 | 7/2014 | Brownrigg |
| 8,787,638 B2 | 7/2014 | Zee et al. |
| 8,795,172 B2 | 8/2014 | Abolfathi et al. |
| 8,799,202 B2 | 8/2014 | Carroll et al. |
| 8,805,579 B2 | 8/2014 | Skrinde |
| 8,805,619 B2 | 8/2014 | Sorensen et al. |
| 8,810,429 B2 | 8/2014 | Gershinsky et al. |
| 8,811,670 B2 | 8/2014 | Mundhenk et al. |
| 8,812,007 B2 | 8/2014 | Hitt et al. |
| 8,812,362 B2 | 8/2014 | Agarwal et al. |
| 8,812,654 B2 | 8/2014 | Gelvin et al. |
| 8,816,850 B2 | 8/2014 | Bandyopadhyay et al. |
| 8,822,149 B2 | 9/2014 | Black et al. |
| 8,822,924 B2 | 9/2014 | Valentino et al. |
| 8,824,762 B2 | 9/2014 | Rivaz et al. |
| 8,832,244 B2 | 9/2014 | Gelvin et al. |
| 8,836,503 B2 | 9/2014 | Gelvin et al. |
| 8,843,356 B2 | 9/2014 | Schadt et al. |
| 8,855,011 B2 | 10/2014 | Ortega et al. |
| 8,855,245 B2 | 10/2014 | Lee et al. |
| 8,867,309 B2 | 10/2014 | Ray et al. |
| 8,867,310 B1 | 10/2014 | Ray et al. |
| 8,871,901 B2 | 10/2014 | Samoylova et al. |
| 8,873,335 B1 | 10/2014 | Ray et al. |
| 8,873,336 B1 | 10/2014 | Ray et al. |
| 8,877,174 B2 | 11/2014 | Suckling et al. |
| 8,879,356 B1 | 11/2014 | Ray et al. |
| 8,885,441 B1 | 11/2014 | Ray et al. |
| 8,889,662 B2 | 11/2014 | Navara |
| 8,892,409 B2 | 11/2014 | Mun |
| 8,892,624 B2 | 11/2014 | Branson et al. |
| 8,892,704 B2 | 11/2014 | Bronez et al. |
| 8,903,192 B2 | 12/2014 | Malik et al. |
| 8,903,531 B2 | 12/2014 | Pharand et al. |
| 8,911,958 B2 | 12/2014 | Lopes-Virella et al. |
| 8,912,512 B1 | 12/2014 | Langoju et al. |
| 8,922,065 B2 | 12/2014 | Sun et al. |
| 8,923,144 B2 | 12/2014 | Shao et al. |
| 8,924,587 B2 | 12/2014 | Petite |

(56) References Cited

U.S. PATENT DOCUMENTS

| | | |
|---|---|---|
| 8,924,588 B2 | 12/2014 | Petite |
| 8,929,568 B2 | 1/2015 | Grancharov et al. |
| 8,930,571 B2 | 1/2015 | Petite |
| 8,949,989 B2 | 2/2015 | Jakobsson et al. |
| 8,954,377 B1 | 2/2015 | Turon et al. |
| 8,956,608 B2 | 2/2015 | Walsh et al. |
| 8,962,680 B2 | 2/2015 | Forbes et al. |
| 8,964,708 B2 | 2/2015 | Petite |
| 8,964,727 B2 | 2/2015 | Allan et al. |
| 8,965,625 B2 | 2/2015 | Dvorak et al. |
| 8,971,432 B2 | 3/2015 | Murakami et al. |
| 8,975,022 B2 | 3/2015 | Begovich et al. |
| 8,977,421 B2 | 3/2015 | Dvorak et al. |
| 8,982,856 B2 | 3/2015 | Brownrigg |
| 8,983,793 B2 | 3/2015 | Luo et al. |
| 8,987,686 B2 | 3/2015 | Rizkallah et al. |
| 8,987,973 B2 | 3/2015 | Mukter-Uz-Zaman et al. |
| 8,990,032 B2 | 3/2015 | Bajwa et al. |
| 8,992,453 B2 | 3/2015 | Vournakis et al. |
| 8,994,551 B2 | 3/2015 | Pitchford et al. |
| 9,004,320 B2 | 4/2015 | Keating et al. |
| 9,011,877 B2 | 4/2015 | Davis et al. |
| 9,017,255 B2 | 4/2015 | Raptis et al. |
| 9,020,866 B1 | 4/2015 | Zhou et al. |
| 9,026,273 B2 | 5/2015 | Ziarno |
| 9,026,279 B2 | 5/2015 | Ziarno |
| 9,026,336 B2 | 5/2015 | Ziarno |
| 9,028,404 B2 | 5/2015 | DeRemer et al. |
| 9,030,565 B2 | 5/2015 | Yang et al. |
| 9,032,058 B2 | 5/2015 | Guthery |
| 9,034,401 B1 | 5/2015 | Clarot et al. |
| 9,035,807 B2 | 5/2015 | Jiang et al. |
| 9,036,910 B1 | 5/2015 | Mundhenk et al. |
| 9,037,256 B2 | 5/2015 | Bokil |
| 9,040,023 B2 | 5/2015 | Durham et al. |
| 9,053,537 B2 | 6/2015 | Stein et al. |
| 9,056,115 B2 | 6/2015 | Gleicher et al. |
| 9,061,004 B2 | 6/2015 | Markowitz et al. |
| 9,061,055 B2 | 6/2015 | Fueyo et al. |
| 9,063,165 B2 | 6/2015 | Valentino et al. |
| 9,065,699 B2 | 6/2015 | Stratigos, Jr. |
| 9,069,352 B2 | 6/2015 | Trumble |
| 9,072,114 B2 | 6/2015 | Abedi |
| 9,072,496 B2 | 7/2015 | Rao et al. |
| 9,074,257 B2 | 7/2015 | Rieder et al. |
| 9,074,731 B2 | 7/2015 | Barrett |
| 9,075,146 B1 | 7/2015 | Valentino et al. |
| 9,075,796 B2 | 7/2015 | Markatou et al. |
| 9,080,212 B2 | 7/2015 | Khatib |
| 9,090,339 B2 | 7/2015 | Arms et al. |
| 9,092,391 B2 | 7/2015 | Stephan et al. |
| 9,103,826 B2 | 8/2015 | Kochel et al. |
| 9,103,920 B2 | 8/2015 | Valentino et al. |
| 9,105,181 B2 | 8/2015 | Pitchford et al. |
| 9,106,718 B2 | 8/2015 | Bonasera et al. |
| 9,111,240 B2 | 8/2015 | Petite |
| 9,111,333 B2 | 8/2015 | Jiang et al. |
| 9,115,989 B2 | 8/2015 | Valentino et al. |
| 9,116,722 B2 | 8/2015 | Shenfield et al. |
| 9,119,019 B2 | 8/2015 | Murias et al. |
| 9,128,991 B2 | 9/2015 | Shamlin et al. |
| 9,129,497 B2 | 9/2015 | Petite |
| 9,130,651 B2 | 9/2015 | Tabe |
| 9,132,110 B2 | 9/2015 | Singh et al. |
| 9,141,215 B2 | 9/2015 | Donahoe |
| 9,148,849 B2 | 9/2015 | Akhlaq et al. |
| 9,152,146 B2 | 10/2015 | Ziarno |
| 9,154,263 B1 | 10/2015 | Muqaibel et al. |
| 9,164,292 B2 | 10/2015 | Brooke |
| 9,179,147 B2 | 11/2015 | Yang et al. |
| 9,179,161 B2 | 11/2015 | Blum |
| 9,186,107 B2 | 11/2015 | Towler et al. |
| 9,191,037 B2 | 11/2015 | Lascari et al. |
| 9,200,324 B2 | 12/2015 | Cavet et al. |
| 9,202,051 B2 | 12/2015 | Jakobsson et al. |
| 9,204,319 B2 | 12/2015 | Ouyang et al. |
| 9,205,064 B2 | 12/2015 | Narain et al. |
| 9,205,092 B2 | 12/2015 | Gleicher et al. |
| 9,207,247 B2 | 12/2015 | Kraus et al. |
| 9,208,209 B1 | 12/2015 | Katz |
| 9,210,436 B2 | 12/2015 | Jeon et al. |
| 9,210,446 B2 | 12/2015 | Kumar et al. |
| 9,210,938 B2 | 12/2015 | Chan et al. |
| 9,211,103 B2 | 12/2015 | Kraus et al. |
| 9,216,010 B2 | 12/2015 | Ostroverkhov et al. |
| 9,216,213 B2 | 12/2015 | Maki et al. |
| 9,226,304 B2 | 12/2015 | Chen et al. |
| 9,226,518 B2 | 1/2016 | Llagostera et al. |
| 9,232,217 B2 | 1/2016 | Argyropoulos et al. |
| 9,232,407 B2 | 1/2016 | Stanczak et al. |
| 9,233,466 B2 | 1/2016 | Skrinde |
| 9,239,215 B2 | 1/2016 | Donahoe |
| 9,240,955 B1 | 1/2016 | Mukhopadhyay et al. |
| 9,243,493 B2 | 1/2016 | Hsu et al. |
| 9,275,353 B2 | 3/2016 | Lu et al. |
| 9,282,029 B2 | 3/2016 | Petite |
| 9,288,743 B2 | 3/2016 | Yang et al. |
| 9,292,550 B2 | 3/2016 | Yarmus |
| 9,297,814 B2 | 3/2016 | Skinner et al. |
| 9,297,915 B2 | 3/2016 | Koh et al. |
| 9,305,275 B2 | 4/2016 | McLachlan |
| 9,311,808 B2 | 4/2016 | Nurmela et al. |
| 9,325,396 B2 | 4/2016 | Murakami et al. |
| 9,339,202 B2 | 5/2016 | Brockway et al. |
| 9,356,776 B2 | 5/2016 | Ko et al. |
| 9,361,274 B2 | 6/2016 | Chu et al. |
| 9,363,175 B2 | 6/2016 | Chu et al. |
| 9,370,501 B2 | 6/2016 | Singh et al. |
| 9,370,509 B2 | 6/2016 | Nordsiek et al. |
| 9,371,565 B2 | 6/2016 | Begovich et al. |
| 9,372,213 B2 | 6/2016 | Auguste et al. |
| 9,374,671 B1 | 6/2016 | Zhyshko et al. |
| 9,374,677 B2 | 6/2016 | Tarlazzi et al. |
| 9,375,412 B2 | 6/2016 | Singh et al. |
| 9,375,436 B2 | 6/2016 | Gleicher et al. |
| 9,386,522 B2 | 7/2016 | San Vicente et al. |
| 9,386,553 B2 | 7/2016 | Berger et al. |
| 9,387,940 B2 | 7/2016 | Godzdanker et al. |
| 9,389,235 B2 | 7/2016 | Weinschenk et al. |
| 9,390,622 B2 * | 7/2016 | Kamarianakis ...... G08G 1/0129 |
| 9,394,345 B2 | 7/2016 | Cong et al. |
| 9,397,795 B2 | 7/2016 | Choi |
| 9,398,576 B2 | 7/2016 | Calcev et al. |
| 9,399,061 B2 | 7/2016 | Kupper et al. |
| 9,402,245 B2 | 7/2016 | Chen et al. |
| 9,402,871 B2 | 8/2016 | Davis et al. |
| 9,413,571 B2 | 8/2016 | Jin et al. |
| 9,415,029 B2 | 8/2016 | Singh et al. |
| 9,417,331 B2 | 8/2016 | Valentino et al. |
| 9,428,767 B2 | 8/2016 | Minshull et al. |
| 9,429,661 B2 | 8/2016 | Valentino et al. |
| 9,430,936 B2 | 8/2016 | Petite |
| 9,439,126 B2 | 9/2016 | Petite |
| 9,445,445 B2 | 9/2016 | Miller et al. |
| 9,451,920 B2 | 9/2016 | Khair |
| 9,455,763 B2 | 9/2016 | Muqaibel et al. |
| 9,459,360 B2 | 10/2016 | Ray et al. |
| 9,468,541 B2 | 10/2016 | Contreras-Vidal et al. |
| 9,470,809 B2 | 10/2016 | Ray |
| 9,470,818 B2 | 10/2016 | Akhlaq et al. |
| 9,471,884 B2 | 10/2016 | Hamann et al. |
| 9,478,224 B2 | 10/2016 | Kjoerling et al. |
| 9,483,531 B2 | 11/2016 | Zhou et al. |
| 9,492,086 B2 | 11/2016 | Ewers et al. |
| 9,492,096 B2 | 11/2016 | Brockway et al. |
| 9,495,860 B2 | 11/2016 | Lett |
| 9,500,757 B2 | 11/2016 | Ray |
| 9,503,467 B2 | 11/2016 | Lefebvre et al. |
| 9,515,691 B2 | 12/2016 | Petite |
| 9,529,210 B2 | 12/2016 | Brooke |
| 9,534,234 B2 | 1/2017 | Minshull et al. |
| 9,534,258 B2 | 1/2017 | Black et al. |
| 9,536,214 B2 | 1/2017 | Heng et al. |
| 9,539,223 B2 | 1/2017 | Page et al. |

(56) References Cited

U.S. PATENT DOCUMENTS

| | | |
|---|---|---|
| 9,542,939 B1 | 1/2017 | Hoffmeister |
| 9,555,069 B2 | 1/2017 | Clarot et al. |
| 9,555,251 B2 | 1/2017 | Stein |
| 9,563,921 B2 | 2/2017 | Shi et al. |
| 9,571,582 B2 | 2/2017 | Petite et al. |
| 9,574,209 B2 | 2/2017 | Minshull et al. |
| 9,576,404 B2 | 2/2017 | Ziarno et al. |
| 9,576,694 B2 | 2/2017 | Gogotsi et al. |
| 9,579,337 B2 | 2/2017 | Stover et al. |
| 9,580,697 B2 | 2/2017 | Minshull et al. |
| 9,583,967 B2 | 2/2017 | Moss |
| 9,584,193 B2 | 2/2017 | Stratigos, Jr. |
| 9,585,620 B2 | 3/2017 | Paquet et al. |
| 9,585,868 B2 | 3/2017 | Forbes et al. |
| 9,590,772 B2 | 3/2017 | Choi et al. |
| 9,605,857 B2 | 3/2017 | Secor |
| 9,608,740 B2 | 3/2017 | Henry et al. |
| 9,609,810 B2 | 4/2017 | Chan et al. |
| 9,615,226 B2 | 4/2017 | Petite |
| 9,615,269 B2 | 4/2017 | Henry et al. |
| 9,615,585 B2 | 4/2017 | Iatrou et al. |
| 9,615,792 B2 | 4/2017 | Raptis et al. |
| 9,619,883 B2 | 4/2017 | Yudovsky |
| 9,621,959 B2 | 4/2017 | Mountain |
| 9,625,646 B2 | 4/2017 | Molin et al. |
| 9,628,165 B2 | 4/2017 | Murakami et al. |
| 9,628,286 B1 | 4/2017 | Nguyen et al. |
| 9,628,365 B2 | 4/2017 | Gelvin et al. |
| 9,632,746 B2 | 4/2017 | Keipert et al. |
| 9,633,401 B2 | 4/2017 | Curtis |
| 9,639,100 B2 | 5/2017 | Storm et al. |
| 9,639,807 B2 | 5/2017 | Berengueres et al. |
| 9,639,902 B2 | 5/2017 | Huehn et al. |
| 9,640,850 B2 | 5/2017 | Henry et al. |
| 9,650,678 B2 | 5/2017 | Bhatia |
| 9,651,400 B2 | 5/2017 | Pitchford et al. |
| 9,656,389 B2 | 5/2017 | Skrinde |
| 9,661,205 B2 | 5/2017 | Athan |
| 9,662,392 B2 | 5/2017 | Altschul et al. |
| 9,663,824 B2 | 5/2017 | Chilton et al. |
| 9,666,042 B2 | 5/2017 | Wedig et al. |
| 9,667,317 B2 | 5/2017 | Gross et al. |
| 9,667,653 B2 | 5/2017 | Barabash et al. |
| 9,668,104 B1 | 5/2017 | Ching et al. |
| 9,672,474 B2 | 6/2017 | Dirac et al. |
| 9,674,210 B1 | 6/2017 | Oprea et al. |
| 9,674,711 B2 | 6/2017 | Bennett et al. |
| 9,675,642 B2 | 6/2017 | Braughler et al. |
| 9,679,378 B2 | 6/2017 | Mouridsen et al. |
| 9,681,807 B2 | 6/2017 | Miller et al. |
| 9,681,835 B2 | 6/2017 | Karmali et al. |
| 9,683,832 B2 | 6/2017 | Wang et al. |
| 9,685,992 B2 | 6/2017 | Bennett et al. |
| 9,691,263 B2 | 6/2017 | Petite |
| 9,699,768 B2 | 7/2017 | Werb |
| 9,699,785 B2 | 7/2017 | Henry et al. |
| 9,701,325 B2 | 7/2017 | Kim et al. |
| 9,701,721 B2 | 7/2017 | Bunnik et al. |
| 9,705,526 B1 | 7/2017 | Veernapu |
| 9,705,561 B2 | 7/2017 | Henry et al. |
| 9,705,610 B2 | 7/2017 | Barzegar et al. |
| 9,710,767 B1 | 7/2017 | Dietrich et al. |
| 9,711,038 B1 | 7/2017 | Pennebaker, III |
| 9,717,459 B2 | 8/2017 | Sereno et al. |
| 9,721,210 B1 | 8/2017 | Brown |
| 9,722,318 B2 | 8/2017 | Adriazola et al. |
| 9,727,115 B1 | 8/2017 | Brown et al. |
| 9,727,616 B2 | 8/2017 | Wu et al. |
| 9,728,063 B1 | 8/2017 | Fu et al. |
| 9,729,197 B2 | 8/2017 | Gross et al. |
| 9,729,568 B2 | 8/2017 | Lefebvre et al. |
| 9,730,160 B2 | 8/2017 | San Vicente et al. |
| 9,734,122 B2 | 8/2017 | Vuskovic et al. |
| 9,734,290 B2 | 8/2017 | Srinivas et al. |
| 9,735,833 B2 | 8/2017 | Gross et al. |
| 9,740,979 B2 | 8/2017 | Dubey et al. |
| 9,742,462 B2 | 8/2017 | Bennett et al. |
| 9,742,521 B2 | 8/2017 | Henry et al. |
| 9,743,370 B2 | 8/2017 | Davis et al. |
| 9,746,452 B2 | 8/2017 | Worden et al. |
| 9,746,479 B2 | 8/2017 | Suthanthiran et al. |
| 9,748,626 B2 | 8/2017 | Henry et al. |
| 9,749,013 B2 | 8/2017 | Barnickel et al. |
| 9,749,053 B2 | 8/2017 | Henry et al. |
| 9,749,083 B2 | 8/2017 | Henry et al. |
| 9,753,022 B2 | 9/2017 | Squartini et al. |
| 9,753,164 B2 | 9/2017 | Barakat et al. |
| 9,757,388 B2 | 9/2017 | Kreppner et al. |
| 9,758,828 B2 | 9/2017 | Suthanthiran et al. |
| 9,760,907 B2 | 9/2017 | Canny et al. |
| 9,762,289 B2 | 9/2017 | Henry et al. |
| 9,766,320 B2 | 9/2017 | Lazik et al. |
| 9,766,619 B2 | 9/2017 | Ziarno |
| 9,768,833 B2 | 9/2017 | Fuchs et al. |
| 9,769,020 B2 | 9/2017 | Henry et al. |
| 9,769,128 B2 | 9/2017 | Gross et al. |
| 9,769,522 B2 | 9/2017 | Richardson |
| 9,769,619 B2 | 9/2017 | Zhyshko et al. |
| 9,772,612 B2 | 9/2017 | McCarthy, III et al. |
| 9,775,818 B2 | 10/2017 | Page et al. |
| 9,776,725 B2 | 10/2017 | Fox et al. |
| 9,777,327 B2 | 10/2017 | Akoulitchev et al. |
| 9,780,834 B2 | 10/2017 | Henry et al. |
| 9,781,700 B2 | 10/2017 | Chen et al. |
| 9,786,012 B2 | 10/2017 | Besman et al. |
| 9,787,412 B2 | 10/2017 | Henry et al. |
| 9,788,326 B2 | 10/2017 | Henry et al. |
| 9,788,354 B2 | 10/2017 | Miller et al. |
| 9,790,256 B2 | 10/2017 | Bunnik et al. |
| 9,791,460 B2 | 10/2017 | Tseng et al. |
| 9,791,910 B1 | 10/2017 | Brown et al. |
| 9,792,741 B2 | 10/2017 | Rabenoro et al. |
| 9,793,951 B2 | 10/2017 | Henry et al. |
| 9,793,954 B2 | 10/2017 | Bennett et al. |
| 9,793,955 B2 | 10/2017 | Henry et al. |
| 9,795,335 B2 | 10/2017 | Merfeld et al. |
| 9,800,327 B2 | 10/2017 | Gerszberg et al. |
| 9,801,857 B2 | 10/2017 | Sarpotdar et al. |
| 9,801,920 B2 | 10/2017 | Kim et al. |
| 9,806,818 B2 | 10/2017 | Henry et al. |
| 9,809,854 B2 | 11/2017 | Crow et al. |
| 9,811,794 B2 | 11/2017 | Mun |
| 9,812,136 B2 | 11/2017 | Kjoerling et al. |
| 9,812,754 B2 | 11/2017 | Parsche |
| 9,816,373 B2 | 11/2017 | Howell et al. |
| 9,816,897 B2 | 11/2017 | Ziarno |
| 9,820,146 B2 | 11/2017 | Gross et al. |
| 9,824,578 B2 | 11/2017 | Burton et al. |
| 9,831,912 B2 | 11/2017 | Henry et al. |
| 9,836,577 B2 | 12/2017 | Beim et al. |
| 9,838,078 B2 | 12/2017 | Bennett et al. |
| 9,838,736 B2 | 12/2017 | Smith et al. |
| 9,838,760 B2 | 12/2017 | Seema et al. |
| 9,838,896 B1 | 12/2017 | Barnickel et al. |
| 9,846,479 B1 | 12/2017 | Brown et al. |
| 9,847,566 B2 | 12/2017 | Henry et al. |
| 9,847,850 B2 | 12/2017 | Henry et al. |
| 9,853,342 B2 | 12/2017 | Henry et al. |
| 9,854,551 B2 | 12/2017 | Davis et al. |
| 9,854,994 B2 | 1/2018 | Ashe et al. |
| 9,858,681 B2 | 1/2018 | Rhoads |
| 9,860,075 B1 | 1/2018 | Gerszberg et al. |
| 9,860,820 B2 | 1/2018 | Petite |
| 9,863,222 B2 | 1/2018 | Morrow et al. |
| 9,865,911 B2 | 1/2018 | Henry et al. |
| 9,866,276 B2 | 1/2018 | Henry et al. |
| 9,866,306 B2 | 1/2018 | Murakami et al. |
| 9,866,309 B2 | 1/2018 | Bennett et al. |
| 9,870,519 B2 | 1/2018 | Ning et al. |
| 9,871,282 B2 | 1/2018 | Henry et al. |
| 9,871,283 B2 | 1/2018 | Henry et al. |
| 9,871,558 B2 | 1/2018 | Henry et al. |
| 9,871,927 B2 | 1/2018 | Perez et al. |
| 9,874,923 B1 | 1/2018 | Brown et al. |

(56) References Cited

U.S. PATENT DOCUMENTS

| | | |
|---|---|---|
| 9,876,264 B2 | 1/2018 | Barnickel et al. |
| 9,876,570 B2 | 1/2018 | Henry et al. |
| 9,876,571 B2 | 1/2018 | Henry et al. |
| 9,876,587 B2 | 1/2018 | Barzegar et al. |
| 9,876,605 B1 | 1/2018 | Henry et al. |
| 9,878,138 B2 | 1/2018 | Altschul et al. |
| 9,878,139 B2 | 1/2018 | Altschul et al. |
| 9,881,339 B2 | 1/2018 | Mun |
| 9,882,257 B2 | 1/2018 | Henry et al. |
| 9,882,660 B2 | 1/2018 | Breton et al. |
| 9,884,281 B2 | 2/2018 | Fox et al. |
| 9,886,545 B2 | 2/2018 | Narain et al. |
| 9,886,771 B1 | 2/2018 | Chen et al. |
| 9,887,447 B2 | 2/2018 | Henry et al. |
| 9,888,081 B1 | 2/2018 | Farinelli et al. |
| 9,891,883 B2 | 2/2018 | Sharma et al. |
| 9,892,420 B2 | 2/2018 | Sterns et al. |
| 9,893,795 B1 | 2/2018 | Henry et al. |
| 9,894,852 B2 | 2/2018 | Gilbert et al. |
| 9,896,215 B2 | 2/2018 | Fox et al. |
| 9,900,177 B2 | 2/2018 | Holley |
| 9,900,790 B1 | 2/2018 | Sheen et al. |
| 9,902,499 B2 | 2/2018 | Fox et al. |
| 9,903,193 B2 | 2/2018 | Harding et al. |
| 9,904,535 B2 | 2/2018 | Gross et al. |
| 9,906,269 B2 | 2/2018 | Fuchs et al. |
| 9,911,020 B1 | 3/2018 | Liu et al. |
| 9,912,027 B2 | 3/2018 | Henry et al. |
| 9,912,033 B2 | 3/2018 | Henry et al. |
| 9,912,381 B2 | 3/2018 | Bennett et al. |
| 9,912,382 B2 | 3/2018 | Bennett et al. |
| 9,912,419 B1 | 3/2018 | Blandino et al. |
| 9,913,006 B1 | 3/2018 | Wascat et al. |
| 9,913,139 B2 | 3/2018 | Gross et al. |
| 9,917,341 B2 | 3/2018 | Henry et al. |
| 9,926,368 B2 | 3/2018 | Walsh et al. |
| 9,926,593 B2 | 3/2018 | Ehrich et al. |
| 9,927,512 B2 | 3/2018 | Rowe et al. |
| 9,927,517 B1 | 3/2018 | Bennett et al. |
| 9,929,755 B2 | 3/2018 | Henry et al. |
| 9,930,668 B2 | 3/2018 | Barzegar et al. |
| 9,931,036 B2 | 4/2018 | Miller et al. |
| 9,931,037 B2 | 4/2018 | Miller et al. |
| 9,932,637 B2 | 4/2018 | Iakoubova et al. |
| 9,934,239 B2 | 4/2018 | Gkoulalas-Divanis et al. |
| 9,935,703 B2 | 4/2018 | Bennett et al. |
| 9,938,576 B1 | 4/2018 | Sadee et al. |
| 9,940,942 B2 | 4/2018 | Klejsa et al. |
| 9,946,571 B1 | 4/2018 | Brown et al. |
| 9,948,333 B2 | 4/2018 | Henry et al. |
| 9,948,354 B2 | 4/2018 | Bennett et al. |
| 9,948,355 B2 | 4/2018 | Gerszberg et al. |
| 9,948,477 B2 | 4/2018 | Marten |
| 9,949,659 B2 | 4/2018 | Armoundas |
| 9,949,693 B2 | 4/2018 | Sereno et al. |
| 9,951,348 B2 | 4/2018 | Cong et al. |
| 9,953,448 B2 | 4/2018 | Eslami et al. |
| 9,954,286 B2 | 4/2018 | Henry et al. |
| 9,954,287 B2 | 4/2018 | Henry et al. |
| 9,955,190 B2 | 4/2018 | Reibman et al. |
| 9,955,488 B2 | 4/2018 | Ouyang et al. |
| 9,957,052 B2 | 5/2018 | Fox et al. |
| 9,959,285 B2 | 5/2018 | Gkoulalas-Divanis et al. |
| 9,960,808 B2 | 5/2018 | Henry et al. |
| 9,960,980 B2 | 5/2018 | Wilson |
| 9,961,488 B2 | 5/2018 | D'Alberto et al. |
| 9,965,813 B2 | 5/2018 | Martin et al. |
| 9,967,002 B2 | 5/2018 | Bennett et al. |
| 9,967,173 B2 | 5/2018 | Gross et al. |
| 9,967,714 B2 | 5/2018 | Ching et al. |
| 9,969,329 B2 | 5/2018 | Shenoy et al. |
| 9,970,993 B1 | 5/2018 | Mensah-Brown et al. |
| 9,972,014 B2 | 5/2018 | McCord et al. |
| 9,973,299 B2 | 5/2018 | Henry et al. |
| 9,973,416 B2 | 5/2018 | Henry et al. |
| 9,973,940 B1 | 5/2018 | Rappaport |
| 9,974,018 B2 | 5/2018 | San Vicente et al. |
| 9,974,773 B2 | 5/2018 | Sarpotdar et al. |
| 9,976,182 B2 | 5/2018 | Khatib |
| 9,980,223 B2 | 5/2018 | San Vicente et al. |
| 9,982,301 B2 | 5/2018 | Muthukumar et al. |
| 9,983,011 B2 | 5/2018 | Mountain |
| 9,983,216 B2 | 5/2018 | Tseng et al. |
| 9,986,527 B2 | 5/2018 | D'Alberto et al. |
| 9,988,624 B2 | 6/2018 | Serber et al. |
| 9,990,648 B2 | 6/2018 | Sterns et al. |
| 9,990,649 B2 | 6/2018 | Sterns et al. |
| 9,990,818 B2 | 6/2018 | Wedig et al. |
| 9,991,580 B2 | 6/2018 | Henry et al. |
| 9,992,123 B2 | 6/2018 | Ouyang et al. |
| 9,993,735 B2 | 6/2018 | Aghdaie et al. |
| 9,997,819 B2 | 6/2018 | Bennett et al. |
| 9,998,870 B1 | 6/2018 | Bennett et al. |
| 9,998,932 B2 | 6/2018 | Henry et al. |
| 9,999,038 B2 | 6/2018 | Barzegar et al. |
| 10,002,367 B2 | 6/2018 | Sterns et al. |
| 10,003,794 B2 | 6/2018 | Jiang et al. |
| 10,004,183 B2 | 6/2018 | Britt et al. |
| 10,006,088 B2 | 6/2018 | Begovich et al. |
| 10,006,779 B2 | 6/2018 | Takahashi |
| 10,007,592 B2 | 6/2018 | Bagchi et al. |
| 10,008,052 B2 | 6/2018 | Wilson et al. |
| 10,009,063 B2 | 6/2018 | Gerszberg et al. |
| 10,009,067 B2 | 6/2018 | Birk et al. |
| 10,009,366 B2 | 6/2018 | Lefebvre et al. |
| 10,010,703 B2 | 7/2018 | Altschul et al. |
| 10,013,701 B2 | 7/2018 | Sterns et al. |
| 10,013,721 B1 | 7/2018 | Laaser et al. |
| 10,018,631 B2 | 7/2018 | Thorne et al. |
| 10,019,727 B2 | 7/2018 | Sterns et al. |
| 10,020,844 B2 | 7/2018 | Bogdan et al. |
| 10,021,426 B2 | 7/2018 | Hu et al. |
| 10,023,877 B2 | 7/2018 | Cong et al. |
| 10,024,187 B2 | 7/2018 | Soares et al. |
| 10,027,397 B2 | 7/2018 | Kim |
| 10,027,398 B2 | 7/2018 | Bennett et al. |
| 10,028,706 B2 | 7/2018 | Brockway et al. |
| 10,032,123 B2 | 7/2018 | Mejegård et al. |
| 10,032,309 B2 | 7/2018 | Jiang et al. |
| 10,033,108 B2 | 7/2018 | Henry et al. |
| 10,035,609 B2 | 7/2018 | Ziarno |
| 10,036,074 B2 | 7/2018 | Pichaud et al. |
| 10,036,638 B2 | 7/2018 | D'Alberto et al. |
| 10,037,393 B1 | 7/2018 | Polovick et al. |
| 10,038,697 B2 | 7/2018 | Dotan et al. |
| 10,038,765 B2 | 7/2018 | Park et al. |
| 10,043,527 B1 | 8/2018 | Gurijala et al. |
| 10,044,409 B2 | 8/2018 | Barzegar et al. |
| 10,046,779 B2 | 8/2018 | Kim |
| 10,047,358 B1 | 8/2018 | Serber et al. |
| 10,050,697 B2 | 8/2018 | Bennett et al. |
| 10,051,403 B2 | 8/2018 | Eronen et al. |
| 10,051,630 B2 | 8/2018 | Barzegar et al. |
| 10,051,663 B2 | 8/2018 | Biswas et al. |
| 10,058,519 B2 | 8/2018 | Singh et al. |
| 10,061,887 B2 | 8/2018 | Vishnudas et al. |
| 10,062,121 B2 | 8/2018 | Besman et al. |
| 10,063,280 B2 | 8/2018 | Fuchs et al. |
| 10,063,861 B2 | 8/2018 | Chen et al. |
| 10,068,467 B1 | 9/2018 | Pennebaker |
| 10,069,185 B2 | 9/2018 | Henry et al. |
| 10,069,535 B2 | 9/2018 | Vannucci et al. |
| 10,069,547 B2 | 9/2018 | Wang et al. |
| 10,070,166 B2 | 9/2018 | Chaar et al. |
| 10,070,220 B2 | 9/2018 | Shields et al. |
| 10,070,321 B2 | 9/2018 | Li et al. |
| 10,070,381 B2 | 9/2018 | Noh et al. |
| 10,071,151 B2 | 9/2018 | Bunnik et al. |
| 10,079,661 B2 | 9/2018 | Gerszberg et al. |
| 10,080,774 B2 | 9/2018 | Fueyo et al. |
| 10,084,223 B2 | 9/2018 | Corum et al. |
| 10,084,868 B2 | 9/2018 | Chandra et al. |
| 10,085,425 B2 | 10/2018 | Funaya et al. |
| 10,085,697 B1 | 10/2018 | Evans |

(56) References Cited

U.S. PATENT DOCUMENTS

| | | |
|---|---|---|
| 10,089,716 B2 | 10/2018 | Chandra et al. |
| 10,090,594 B2 | 10/2018 | Henry et al. |
| 10,090,606 B2 | 10/2018 | Henry et al. |
| 10,091,017 B2 | 10/2018 | Landow et al. |
| 10,091,512 B2 | 10/2018 | Xu et al. |
| 10,091,787 B2 | 10/2018 | Barzegar et al. |
| 10,092,509 B2 | 10/2018 | Maisel et al. |
| 10,098,569 B2 | 10/2018 | Abeyratne et al. |
| 10,098,908 B2 | 10/2018 | Durham et al. |
| 10,100,092 B2 | 10/2018 | Atkinson et al. |
| 10,101,340 B2 | 10/2018 | Lin et al. |
| 10,103,422 B2 | 10/2018 | Britz et al. |
| 10,103,801 B2 | 10/2018 | Bennett et al. |
| 10,111,169 B2 | 10/2018 | San Vicente et al. |
| 10,111,888 B2 | 10/2018 | Kreppner et al. |
| 10,113,198 B2 | 10/2018 | Begovich et al. |
| 10,113,200 B2 | 10/2018 | Danila et al. |
| 10,114,915 B2 | 10/2018 | Polovick et al. |
| 10,116,697 B2 | 10/2018 | Beckman et al. |
| 10,117,868 B2 | 11/2018 | Palczewski et al. |
| 10,121,338 B2 | 11/2018 | Ellers et al. |
| 10,121,339 B2 | 11/2018 | Strulovitch et al. |
| 10,122,218 B2 | 11/2018 | Corum et al. |
| 10,126,309 B2 | 11/2018 | Wiktorowicz |
| 10,131,949 B2 | 11/2018 | Li et al. |
| 10,133,989 B1 | 11/2018 | Brown |
| 10,135,145 B2 | 11/2018 | Henry et al. |
| 10,135,146 B2 | 11/2018 | Henry et al. |
| 10,135,147 B2 | 11/2018 | Henry et al. |
| 10,135,499 B2 | 11/2018 | Stratigos |
| 10,136,434 B2 | 11/2018 | Gerszberg et al. |
| 10,137,288 B2 | 11/2018 | Altschul et al. |
| 10,139,820 B2 | 11/2018 | Liu et al. |
| 10,141,622 B2 | 11/2018 | Corum et al. |
| 10,142,010 B2 | 11/2018 | Bennett et al. |
| 10,142,086 B2 | 11/2018 | Bennett et al. |
| 10,142,788 B2 | 11/2018 | Zhyshko et al. |
| 10,144,036 B2 | 12/2018 | Fuchs et al. |
| 10,147,173 B2 | 12/2018 | Huang et al. |
| 10,148,016 B2 | 12/2018 | Johnson et al. |
| 10,149,129 B2 | 12/2018 | Petite |
| 10,149,131 B2 | 12/2018 | Natarajan et al. |
| 10,153,823 B2 | 12/2018 | Murakami et al. |
| 10,153,892 B2 | 12/2018 | Kliewer et al. |
| 10,154,326 B2 | 12/2018 | Mazed |
| 10,154,624 B2 | 12/2018 | Guan et al. |
| 10,155,651 B2 | 12/2018 | Keating et al. |
| 10,157,509 B2 | 12/2018 | Dolan et al. |
| 10,168,337 B2 | 1/2019 | Brasier et al. |
| 10,168,695 B2 | 1/2019 | Barnickel et al. |
| 10,170,840 B2 | 1/2019 | Henry et al. |
| 10,171,501 B2 | 1/2019 | Beckman et al. |
| 10,172,363 B2 | 1/2019 | Wakefield |
| 10,175,387 B2 | 1/2019 | Kleeman et al. |
| 10,178,445 B2 | 1/2019 | Lubranski et al. |
| 10,181,010 B2 | 1/2019 | Patel et al. |
| 10,187,850 B2 | 1/2019 | San Vicente et al. |
| 10,187,899 B2 | 1/2019 | Ouyang et al. |
| 10,194,437 B2 | 1/2019 | Henry et al. |
| 10,200,752 B2 | 2/2019 | Richardson |
| 10,535,138 B2 * | 1/2020 | Pfeiffer ..................... G06T 7/11 |
| 2001/0009904 A1 | 7/2001 | Wolff et al. |
| 2001/0024525 A1 | 9/2001 | Hata et al. |
| 2001/0031089 A1 | 10/2001 | Hata et al. |
| 2001/0034686 A1 | 10/2001 | Eder |
| 2002/0001574 A1 | 1/2002 | Woiff et al. |
| 2002/0016699 A1 | 2/2002 | Hoggart et al. |
| 2002/0028021 A1 | 3/2002 | Foote et al. |
| 2002/0055457 A1 | 5/2002 | Janus et al. |
| 2002/0076115 A1 | 6/2002 | Leeder et al. |
| 2002/0090139 A1 | 7/2002 | Hata et al. |
| 2002/0091972 A1 | 7/2002 | Harris et al. |
| 2002/0099686 A1 | 7/2002 | Schwartz et al. |
| 2002/0131084 A1 | 9/2002 | Andrew et al. |
| 2002/0138012 A1 | 9/2002 | Hodges et al. |
| 2002/0138270 A1 | 9/2002 | Bellegarda et al. |
| 2002/0175921 A1 | 11/2002 | Xu et al. |
| 2002/0176633 A1 | 11/2002 | Frojdh et al. |
| 2002/0184272 A1 | 12/2002 | Burges et al. |
| 2003/0009295 A1 | 1/2003 | Markowitz et al. |
| 2003/0018647 A1 | 1/2003 | Bialkowski |
| 2003/0021848 A1 | 1/2003 | Johnson et al. |
| 2003/0023951 A1 | 1/2003 | Rosenberg |
| 2003/0050265 A1 | 3/2003 | Dean et al. |
| 2003/0059121 A1 | 3/2003 | Savakis et al. |
| 2003/0065409 A1 | 4/2003 | Raeth et al. |
| 2003/0073715 A1 | 4/2003 | El-Rashidy et al. |
| 2003/0078738 A1 | 4/2003 | Wouters et al. |
| 2003/0086621 A1 | 5/2003 | Hata et al. |
| 2003/0093277 A1 | 5/2003 | Bellegarda et al. |
| 2003/0098804 A1 | 5/2003 | Ekstrand et al. |
| 2003/0104499 A1 | 6/2003 | Pressman et al. |
| 2003/0107488 A1 | 6/2003 | van Putten |
| 2003/0139963 A1 | 7/2003 | Chickering et al. |
| 2003/0151513 A1 | 8/2003 | Herrmann et al. |
| 2003/0166017 A1 | 9/2003 | McCarthy |
| 2003/0166026 A1 | 9/2003 | Goodman et al. |
| 2003/0170660 A1 | 9/2003 | Sondergaard et al. |
| 2003/0170700 A1 | 9/2003 | Shang et al. |
| 2003/0171685 A1 | 9/2003 | Lesser et al. |
| 2003/0171876 A1 | 9/2003 | Markowitz et al. |
| 2003/0180764 A1 | 9/2003 | Shang et al. |
| 2003/0190602 A1 | 10/2003 | Pressman et al. |
| 2003/0198650 A1 | 10/2003 | Elbers et al. |
| 2003/0199685 A1 | 10/2003 | Pressman et al. |
| 2003/0220775 A1 | 11/2003 | Jourdan et al. |
| 2004/0001543 A1 | 1/2004 | Adams et al. |
| 2004/0001611 A1 | 1/2004 | Celik et al. |
| 2004/0015525 A1 | 1/2004 | Martens et al. |
| 2004/0027259 A1 | 2/2004 | Soliman et al. |
| 2004/0063095 A1 | 4/2004 | Fibers et al. |
| 2004/0063655 A1 | 4/2004 | Dean et al. |
| 2004/0073414 A1 | 4/2004 | Bienenstock et al. |
| 2004/0083833 A1 | 5/2004 | Hitt et al. |
| 2004/0085233 A1 | 5/2004 | Linzer et al. |
| 2004/0088239 A1 | 5/2004 | Eder |
| 2004/0090329 A1 | 5/2004 | Hitt |
| 2004/0090345 A1 | 5/2004 | Hitt |
| 2004/0092493 A1 | 5/2004 | El-Rashidy et al. |
| 2004/0100394 A1 | 5/2004 | Hitt |
| 2004/0110697 A1 | 6/2004 | Wolff et al. |
| 2004/0115688 A1 | 6/2004 | Cheung et al. |
| 2004/0116409 A1 | 6/2004 | Campochiaro |
| 2004/0116434 A1 | 6/2004 | Campochiaro |
| 2004/0127799 A1 | 7/2004 | Sorensen et al. |
| 2004/0128097 A1 | 7/2004 | LaMarca et al. |
| 2004/0138826 A1 | 7/2004 | Carter et al. |
| 2004/0139110 A1 | 7/2004 | LaMarca et al. |
| 2004/0142890 A1 | 7/2004 | McNeel |
| 2004/0157783 A1 | 8/2004 | McCaddon |
| 2004/0165527 A1 | 8/2004 | Gu et al. |
| 2004/0166519 A1 | 8/2004 | Cargill et al. |
| 2004/0172319 A1 | 9/2004 | Eder |
| 2004/0199445 A1 | 10/2004 | Eder |
| 2004/0210509 A1 | 10/2004 | Eder |
| 2004/0215551 A1 | 10/2004 | Eder |
| 2004/0221237 A1 | 11/2004 | Foote et al. |
| 2004/0225629 A1 | 11/2004 | Eder |
| 2004/0265849 A1 | 12/2004 | Cargill et al. |
| 2005/0002950 A1 | 1/2005 | Rubens et al. |
| 2005/0017602 A1 | 1/2005 | Arms et al. |
| 2005/0026169 A1 | 2/2005 | Cargill et al. |
| 2005/0069224 A1 | 3/2005 | Nowicki et al. |
| 2005/0071266 A1 | 3/2005 | Eder |
| 2005/0075597 A1 | 4/2005 | Vournakis et al. |
| 2005/0080613 A1 | 4/2005 | Colledge et al. |
| 2005/0090936 A1 | 4/2005 | Hitt et al. |
| 2005/0096360 A1 | 5/2005 | Salte et al. |
| 2005/0096963 A1 | 5/2005 | Myr et al. |
| 2005/0113306 A1 | 5/2005 | Janus et al. |
| 2005/0113307 A1 | 5/2005 | Janus et al. |
| 2005/0144106 A1 | 6/2005 | Eder |
| 2005/0147172 A1 | 7/2005 | Winger et al. |
| 2005/0147173 A1 | 7/2005 | Winger et al. |

(56) References Cited

U.S. PATENT DOCUMENTS

| | | |
|---|---|---|
| 2005/0164206 A1 | 7/2005 | Hadjiargyrou et al. |
| 2005/0171923 A1 | 8/2005 | Kiiveri et al. |
| 2005/0176442 A1 | 8/2005 | Ju et al. |
| 2005/0210340 A1 | 9/2005 | Townsend et al. |
| 2005/0213548 A1 | 9/2005 | Benson et al. |
| 2005/0245252 A1 | 11/2005 | Kappes et al. |
| 2005/0246314 A1 | 11/2005 | Eder |
| 2005/0251468 A1 | 11/2005 | Eder |
| 2005/0272054 A1 | 12/2005 | Cargill et al. |
| 2005/0276323 A1 | 12/2005 | Martemyanov et al. |
| 2005/0282201 A1 | 12/2005 | Pressman et al. |
| 2005/0287559 A1 | 12/2005 | Cargill et al. |
| 2006/0024700 A1 | 2/2006 | Cargill et al. |
| 2006/0026017 A1 | 2/2006 | Walker |
| 2006/0029060 A1 | 2/2006 | Pister |
| 2006/0035867 A1 | 2/2006 | Janus et al. |
| 2006/0036403 A1 | 2/2006 | Wegerich et al. |
| 2006/0036497 A1 | 2/2006 | Chickering et al. |
| 2006/0053004 A1 | 3/2006 | Ceperkovic et al. |
| 2006/0059028 A1 | 3/2006 | Eder |
| 2006/0061795 A1 | 3/2006 | Walmsley |
| 2006/0084070 A1 | 4/2006 | Rieder et al. |
| 2006/0084081 A1 | 4/2006 | Rieder et al. |
| 2006/0101017 A1 | 5/2006 | Eder |
| 2006/0111635 A1 | 5/2006 | Todros et al. |
| 2006/0111849 A1 | 5/2006 | Schadt et al. |
| 2006/0122816 A1 | 6/2006 | Schadt et al. |
| 2006/0136184 A1 | 6/2006 | Gustafsson et al. |
| 2006/0142983 A1 | 6/2006 | Sorensen et al. |
| 2006/0143071 A1 | 6/2006 | Hofmann |
| 2006/0143454 A1 | 6/2006 | Walmsley |
| 2006/0147420 A1 | 7/2006 | Fueyo et al. |
| 2006/0149522 A1 | 7/2006 | Tang |
| 2006/0164997 A1 | 7/2006 | Graepel et al. |
| 2006/0165163 A1 | 7/2006 | Burazerovic et al. |
| 2006/0175606 A1 | 8/2006 | Wang et al. |
| 2006/0184473 A1 | 8/2006 | Eder |
| 2006/0189553 A9 | 8/2006 | Wolff et al. |
| 2006/0200709 A1 | 9/2006 | Yu et al. |
| 2006/0206246 A1 | 9/2006 | Walker |
| 2006/0223093 A1 | 10/2006 | Luke et al. |
| 2006/0228715 A1 | 10/2006 | Shiffman et al. |
| 2006/0234262 A1 | 10/2006 | Ruano et al. |
| 2006/0241869 A1 | 10/2006 | Schadt et al. |
| 2006/0243055 A1 | 11/2006 | Sundermeyer et al. |
| 2006/0243056 A1 | 11/2006 | Sundermeyer et al. |
| 2006/0243180 A1 | 11/2006 | Sundermeyer et al. |
| 2006/0278241 A1 | 12/2006 | Ruano |
| 2006/0286571 A1 | 12/2006 | Dervieux |
| 2006/0292547 A1 | 12/2006 | Pettegrew et al. |
| 2007/0000423 A1 | 2/2007 | Cargill et al. |
| 2007/0026426 A1 | 2/2007 | Fuernkranz et al. |
| 2007/0031846 A1 | 2/2007 | Cargill et al. |
| 2007/0031847 A1 | 2/2007 | Cargill et al. |
| 2007/0031848 A1 | 2/2007 | Cargill et al. |
| 2007/0036773 A1 | 2/2007 | Cooper et al. |
| 2007/0037208 A1 | 2/2007 | Foote et al. |
| 2007/0037241 A1 | 2/2007 | Soreq et al. |
| 2007/0038346 A1 | 2/2007 | Ehrlich et al. |
| 2007/0038386 A1 | 2/2007 | Schadt et al. |
| 2007/0043656 A1 | 2/2007 | Lancaster |
| 2007/0049644 A1 | 3/2007 | Bedoukian et al. |
| 2007/0054278 A1 | 3/2007 | Cargill |
| 2007/0059710 A1 | 3/2007 | Luke et al. |
| 2007/0065843 A1 | 3/2007 | Jiang et al. |
| 2007/0067195 A1 | 3/2007 | Fahner et al. |
| 2007/0072821 A1 | 3/2007 | Iakoubova et al. |
| 2007/0078117 A1 | 4/2007 | Hoffman et al. |
| 2007/0078434 A1 | 4/2007 | Keusch et al. |
| 2007/0083491 A1 | 4/2007 | Walmsley et al. |
| 2007/0087000 A1 | 4/2007 | Walsh et al. |
| 2007/0088248 A1 | 4/2007 | Glenn et al. |
| 2007/0090996 A1 | 4/2007 | Wang |
| 2007/0101382 A1 | 5/2007 | Aramaki et al. |
| 2007/0105804 A1 | 5/2007 | Wolff et al. |
| 2007/0112521 A1 | 5/2007 | Akimov et al. |
| 2007/0123487 A1 | 5/2007 | McNeel |
| 2007/0129948 A1 | 6/2007 | Yi et al. |
| 2007/0166707 A1 | 7/2007 | Schadt et al. |
| 2007/0167727 A1 | 7/2007 | Menezes et al. |
| 2007/0185656 A1 | 8/2007 | Schadt |
| 2007/0190056 A1 | 8/2007 | Kambadur et al. |
| 2007/0195808 A1 | 8/2007 | Ehrlich et al. |
| 2007/0202518 A1 | 8/2007 | Ruano et al. |
| 2007/0208600 A1 | 9/2007 | Babus et al. |
| 2007/0208640 A1 | 9/2007 | Banasiak et al. |
| 2007/0210916 A1 | 9/2007 | Ogushi et al. |
| 2007/0210929 A1 | 9/2007 | Sabata et al. |
| 2007/0216545 A1 | 9/2007 | Li et al. |
| 2007/0217506 A1 | 9/2007 | Yang et al. |
| 2007/0221125 A1 | 9/2007 | Kaushal et al. |
| 2007/0223582 A1 | 9/2007 | Borer |
| 2007/0224712 A1 | 9/2007 | Kaushal et al. |
| 2007/0233679 A1 | 10/2007 | Liu et al. |
| 2007/0239439 A1 | 10/2007 | Yi et al. |
| 2007/0239862 A1 | 10/2007 | Bronez et al. |
| 2007/0254289 A1 | 11/2007 | Li et al. |
| 2007/0254369 A1 | 11/2007 | Grimes et al. |
| 2007/0255113 A1 | 11/2007 | Grimes |
| 2007/0259954 A1 | 11/2007 | Pablos |
| 2007/0275881 A1 | 11/2007 | Morrow et al. |
| 2007/0278395 A1 | 12/2007 | Gorenstein et al. |
| 2007/0297394 A1 | 12/2007 | Allan et al. |
| 2008/0015871 A1 | 1/2008 | Eder |
| 2008/0027769 A1 | 1/2008 | Eder |
| 2008/0027841 A1 | 1/2008 | Eder |
| 2008/0031213 A1 | 2/2008 | Kaiser et al. |
| 2008/0031545 A1 | 2/2008 | Nowicki et al. |
| 2008/0032628 A1 | 2/2008 | Vehvilainen et al. |
| 2008/0033589 A1 | 2/2008 | Ontalus et al. |
| 2008/0037880 A1 | 2/2008 | Lai |
| 2008/0038230 A1 | 2/2008 | Lindeman et al. |
| 2008/0050025 A1 | 2/2008 | Bashyam et al. |
| 2008/0050026 A1 | 2/2008 | Bashyam et al. |
| 2008/0050027 A1 | 2/2008 | Bashyam et al. |
| 2008/0050029 A1 | 2/2008 | Bashyam et al. |
| 2008/0050047 A1 | 2/2008 | Bashyam et al. |
| 2008/0050357 A1 | 2/2008 | Gustafsson et al. |
| 2008/0050732 A1 | 2/2008 | Rieder et al. |
| 2008/0050733 A1 | 2/2008 | Rieder et al. |
| 2008/0051318 A1 | 2/2008 | Li et al. |
| 2008/0055121 A1 | 3/2008 | Fulcomer |
| 2008/0057500 A1 | 3/2008 | Rieder et al. |
| 2008/0059072 A1 | 3/2008 | Willen et al. |
| 2008/0074254 A1 | 3/2008 | Townsend et al. |
| 2008/0076120 A1 | 3/2008 | Donaldson et al. |
| 2008/0103892 A1 | 5/2008 | Chatwin et al. |
| 2008/0108081 A1 | 5/2008 | Luke et al. |
| 2008/0108713 A1 | 5/2008 | Begovich et al. |
| 2008/0114564 A1 | 5/2008 | Ihara |
| 2008/0122938 A1 | 5/2008 | Broberg et al. |
| 2008/0126378 A1 | 5/2008 | Parkinson et al. |
| 2008/0127545 A1 | 6/2008 | Yang et al. |
| 2008/0129495 A1 | 6/2008 | Hitt |
| 2008/0139402 A1 | 6/2008 | Pressman et al. |
| 2008/0140549 A1 | 6/2008 | Eder |
| 2008/0152235 A1 | 6/2008 | Bashyam et al. |
| 2008/0154928 A1 | 6/2008 | Bashyam et al. |
| 2008/0160046 A1 | 7/2008 | Elbers et al. |
| 2008/0166348 A1 | 7/2008 | Kupper et al. |
| 2008/0172205 A1 | 7/2008 | Breton et al. |
| 2008/0176266 A1 | 7/2008 | Berger et al. |
| 2008/0177592 A1 | 7/2008 | Masuyama et al. |
| 2008/0183394 A1 | 7/2008 | Woodward |
| 2008/0189545 A1 | 8/2008 | Parkinson |
| 2008/0195596 A1 | 8/2008 | Sisk et al. |
| 2008/0213745 A1 | 9/2008 | Berger et al. |
| 2008/0215609 A1 | 9/2008 | Cleveland et al. |
| 2008/0219094 A1 | 9/2008 | Barakat |
| 2008/0228744 A1 | 9/2008 | Desbiens |
| 2008/0241846 A1 | 10/2008 | Iakoubova et al. |
| 2008/0248476 A1 | 10/2008 | Cargill et al. |
| 2008/0253283 A1 | 10/2008 | Douglis et al. |
| 2008/0256069 A1 | 10/2008 | Eder |

(56) References Cited

U.S. PATENT DOCUMENTS

| | | |
|---|---|---|
| 2008/0256166 A1 | 10/2008 | Branson et al. |
| 2008/0256167 A1 | 10/2008 | Branson et al. |
| 2008/0256253 A1 | 10/2008 | Branson et al. |
| 2008/0256384 A1 | 10/2008 | Branson et al. |
| 2008/0256548 A1 | 10/2008 | Branson et al. |
| 2008/0256549 A1 | 10/2008 | Liu et al. |
| 2008/0286796 A1 | 11/2008 | Grupe et al. |
| 2008/0299554 A1 | 12/2008 | Huang et al. |
| 2008/0301077 A1 | 12/2008 | Fung et al. |
| 2008/0305967 A1 | 12/2008 | Ward et al. |
| 2008/0306034 A1 | 12/2008 | Ward |
| 2008/0306804 A1 | 12/2008 | Opdycke et al. |
| 2008/0309481 A1 | 12/2008 | Tanaka et al. |
| 2008/0311572 A1 | 12/2008 | Ahuja et al. |
| 2008/0313073 A1 | 12/2008 | Fahner et al. |
| 2008/0318219 A1 | 12/2008 | Rieder et al. |
| 2008/0318914 A1 | 12/2008 | Hoffman et al. |
| 2008/0319897 A1 | 12/2008 | Fahner et al. |
| 2009/0006363 A1 | 1/2009 | Canny et al. |
| 2009/0007706 A1 | 1/2009 | Hitt et al. |
| 2009/0009317 A1 | 1/2009 | Weaver et al. |
| 2009/0009323 A1 | 1/2009 | Weaver et al. |
| 2009/0009339 A1 | 1/2009 | Gorrell et al. |
| 2009/0009340 A1 | 1/2009 | Weaver et al. |
| 2009/0018891 A1 | 1/2009 | Eder |
| 2009/0030771 A1 | 1/2009 | Eder |
| 2009/0035768 A1 | 2/2009 | Nelson et al. |
| 2009/0035769 A1 | 2/2009 | Nelson et al. |
| 2009/0035772 A1 | 2/2009 | Nelson et al. |
| 2009/0037402 A1 | 2/2009 | Jones et al. |
| 2009/0037410 A1 | 2/2009 | Jones et al. |
| 2009/0041021 A1 | 2/2009 | Meany et al. |
| 2009/0043637 A1 | 2/2009 | Eder |
| 2009/0050492 A1 | 2/2009 | Alocilja et al. |
| 2009/0053745 A1 | 2/2009 | Firestein-Miller |
| 2009/0055139 A1 | 2/2009 | Agarwal et al. |
| 2009/0058088 A1 | 3/2009 | Pitchford et al. |
| 2009/0058639 A1 | 3/2009 | Tanaka et al. |
| 2009/0059827 A1 | 3/2009 | Liu et al. |
| 2009/0070081 A1 | 3/2009 | Saenz et al. |
| 2009/0070182 A1 | 3/2009 | Eder |
| 2009/0070767 A1 | 3/2009 | Garbow et al. |
| 2009/0076890 A1 | 3/2009 | Dixon et al. |
| 2009/0087909 A1 | 4/2009 | Carpenter et al. |
| 2009/0089022 A1 | 4/2009 | Song et al. |
| 2009/0104620 A1 | 4/2009 | Schramm et al. |
| 2009/0107510 A1 | 4/2009 | Cornish et al. |
| 2009/0112752 A1 | 4/2009 | Milana |
| 2009/0118217 A1 | 5/2009 | Cargill et al. |
| 2009/0119357 A1 | 5/2009 | Rice et al. |
| 2009/0123441 A1 | 5/2009 | Braughler et al. |
| 2009/0125466 A1 | 5/2009 | Hinsz et al. |
| 2009/0125916 A1 | 5/2009 | Lu et al. |
| 2009/0130682 A1 | 5/2009 | Li et al. |
| 2009/0131702 A1 | 5/2009 | Pablos |
| 2009/0132448 A1 | 5/2009 | Eder |
| 2009/0132453 A1 | 5/2009 | Hangartner et al. |
| 2009/0136481 A1 | 5/2009 | Kambadur et al. |
| 2009/0137417 A1 | 5/2009 | Fu et al. |
| 2009/0138715 A1 | 5/2009 | Xiao et al. |
| 2009/0140893 A1 | 6/2009 | Schneider |
| 2009/0140894 A1 | 6/2009 | Schneider |
| 2009/0146833 A1 | 6/2009 | Lee et al. |
| 2009/0149722 A1 | 6/2009 | Abolfathi et al. |
| 2009/0157409 A1 | 6/2009 | Lifu et al. |
| 2009/0161581 A1 | 6/2009 | Kim |
| 2009/0162346 A1 | 6/2009 | Schrodi et al. |
| 2009/0162348 A1 | 6/2009 | Li et al. |
| 2009/0168653 A1 | 6/2009 | St. Pierre et al. |
| 2009/0170111 A1 | 7/2009 | Luke et al. |
| 2009/0171740 A1 | 7/2009 | Eder |
| 2009/0175830 A1 | 7/2009 | Fueyo et al. |
| 2009/0176235 A1 | 7/2009 | Cargill et al. |
| 2009/0176857 A1 | 7/2009 | Levy |
| 2009/0181384 A1 | 7/2009 | Nekarda et al. |
| 2009/0186352 A1 | 7/2009 | Akoulitchev et al. |
| 2009/0196206 A1 | 8/2009 | Weaver et al. |
| 2009/0196875 A1 | 8/2009 | Cargill et al. |
| 2009/0198374 A1 | 8/2009 | Tsai et al. |
| 2009/0210173 A1 | 8/2009 | Arms et al. |
| 2009/0210363 A1 | 8/2009 | Grabarnik et al. |
| 2009/0212981 A1 | 8/2009 | Schneider |
| 2009/0220965 A1 | 9/2009 | Frackelton, Jr. et al. |
| 2009/0221438 A1 | 9/2009 | Kitzman et al. |
| 2009/0221620 A1 | 9/2009 | Luke et al. |
| 2009/0226420 A1 | 9/2009 | Hauser et al. |
| 2009/0232408 A1 | 9/2009 | Meany |
| 2009/0233299 A1 | 9/2009 | Ruano et al. |
| 2009/0234200 A1 | 9/2009 | Husheer |
| 2009/0253952 A1 | 10/2009 | Khatib et al. |
| 2009/0258003 A1 | 10/2009 | Bare |
| 2009/0262929 A1 | 10/2009 | Walmsley |
| 2009/0264453 A1 | 10/2009 | Shiffman et al. |
| 2009/0270332 A1 | 10/2009 | Bare et al. |
| 2009/0271342 A1 | 10/2009 | Eder |
| 2009/0276189 A1 | 11/2009 | Willen et al. |
| 2009/0280566 A1 | 11/2009 | Carpenter et al. |
| 2009/0284399 A1 | 11/2009 | Schneider |
| 2009/0285827 A1 | 11/2009 | Walsh et al. |
| 2009/0289820 A1 | 11/2009 | Schneider |
| 2009/0292475 A1 | 11/2009 | Alam et al. |
| 2009/0294645 A1 | 12/2009 | Gorenstein et al. |
| 2009/0296670 A1 | 12/2009 | Luo et al. |
| 2009/0298082 A1 | 12/2009 | Klee et al. |
| 2009/0303042 A1 | 12/2009 | Song et al. |
| 2009/0306950 A1 | 12/2009 | De Winter et al. |
| 2009/0308600 A1 | 12/2009 | Hsu et al. |
| 2009/0312410 A1 | 12/2009 | Shiffman et al. |
| 2009/0313041 A1 | 12/2009 | Eder |
| 2009/0322510 A1 | 12/2009 | Berger et al. |
| 2009/0322570 A1 | 12/2009 | Schneider |
| 2009/0325920 A1 | 12/2009 | Hoffman et al. |
| 2010/0003691 A1 | 1/2010 | Chettier et al. |
| 2010/0008934 A1 | 1/2010 | Schrodi et al. |
| 2010/0010336 A1 | 1/2010 | Pettegrew et al. |
| 2010/0004243 A1 | 2/2010 | Moore et al. |
| 2010/0028870 A1 | 2/2010 | Welch et al. |
| 2010/0029493 A1 | 2/2010 | Welch et al. |
| 2010/0031052 A1 | 2/2010 | Kim et al. |
| 2010/0035983 A1 | 2/2010 | Shiffman et al. |
| 2010/0039933 A1 | 2/2010 | Taylor et al. |
| 2010/0047798 A1 | 2/2010 | Feldman et al. |
| 2010/0048525 A1 | 2/2010 | Gleicher et al. |
| 2010/0048679 A1 | 2/2010 | Garren et al. |
| 2010/0054307 A1 | 3/2010 | Strohm |
| 2010/0063851 A1 | 3/2010 | Andrist et al. |
| 2010/0070455 A1 | 3/2010 | Halperin et al. |
| 2010/0074054 A1 | 3/2010 | Barakat et al. |
| 2010/0076949 A1 | 3/2010 | Zoeter et al. |
| 2010/0082617 A1 | 4/2010 | Liu et al. |
| 2010/0100331 A1 | 4/2010 | Gustafsson et al. |
| 2010/0100338 A1 | 4/2010 | Vik et al. |
| 2010/0109853 A1 | 5/2010 | Strohm |
| 2010/0113407 A1 | 5/2010 | Gleicher et al. |
| 2010/0114581 A1 | 5/2010 | Li et al. |
| 2010/0114793 A1 | 5/2010 | Eder |
| 2010/0120040 A1 | 5/2010 | Iakoubova et al. |
| 2010/0125641 A1 | 5/2010 | Shelby |
| 2010/0132058 A1 | 5/2010 | Diatchenko et al. |
| 2010/0136553 A1 | 6/2010 | Black et al. |
| 2010/0136579 A1 | 6/2010 | Tseng et al. |
| 2010/0137409 A1 | 6/2010 | Plotnikova et al. |
| 2010/0148940 A1 | 6/2010 | Gelvin et al. |
| 2010/0151468 A1 | 6/2010 | Esteller et al. |
| 2010/0152619 A1 | 6/2010 | Kalpaxis et al. |
| 2010/0152909 A1 | 6/2010 | Hitt et al. |
| 2010/0174336 A1 | 7/2010 | Stein |
| 2010/0176939 A1 | 7/2010 | Harres |
| 2010/0183574 A1 | 7/2010 | Davis et al. |
| 2010/0183610 A1 | 7/2010 | Li et al. |
| 2010/0184040 A1 | 7/2010 | Kirkpatrick et al. |
| 2010/0187414 A1 | 7/2010 | Gorenstein et al. |
| 2010/0190172 A1 | 7/2010 | Cargill et al. |
| 2010/0191216 A1 | 7/2010 | Keusch et al. |

(56) References Cited

U.S. PATENT DOCUMENTS

| | | |
|---|---|---|
| 2010/0196400 A1 | 8/2010 | Li et al. |
| 2010/0197033 A1 | 8/2010 | Lin et al. |
| 2010/0201516 A1 | 8/2010 | Gelvin et al. |
| 2010/0202442 A1 | 8/2010 | Allan et al. |
| 2010/0203507 A1 | 8/2010 | Dervieux |
| 2010/0203508 A1 | 8/2010 | Dervieux |
| 2010/0211787 A1 | 8/2010 | Bukshpun et al. |
| 2010/0215645 A1 | 8/2010 | Cargill et al. |
| 2010/0216154 A1 | 8/2010 | Huang et al. |
| 2010/0216655 A1 | 8/2010 | Sulem |
| 2010/0217648 A1 | 8/2010 | Agarwal et al. |
| 2010/0222225 A1 | 9/2010 | Fu et al. |
| 2010/0249188 A1 | 9/2010 | Lavedan et al. |
| 2010/0254312 A1 | 10/2010 | Kennedy |
| 2010/0261187 A1 | 10/2010 | Iakoubova et al. |
| 2010/0268680 A1 | 10/2010 | Hangartner et al. |
| 2010/0272713 A1 | 10/2010 | Ward et al. |
| 2010/0278060 A1 | 11/2010 | Lee et al. |
| 2010/0278796 A1 | 11/2010 | Berger |
| 2010/0284989 A1 | 11/2010 | Markowitz et al. |
| 2010/0285579 A1 | 11/2010 | Lim et al. |
| 2010/0293130 A1 | 11/2010 | Stephan et al. |
| 2010/0310499 A1 | 12/2010 | Skelton et al. |
| 2010/0310543 A1 | 12/2010 | Farinelli et al. |
| 2010/0312128 A1 | 12/2010 | Karst et al. |
| 2010/0330187 A1 | 12/2010 | Bravo et al. |
| 2011/0004509 A1 | 1/2011 | Wu et al. |
| 2011/0019737 A1 | 1/2011 | Yang et al. |
| 2011/0021555 A1 | 1/2011 | Nordsiek et al. |
| 2011/0027275 A1 | 2/2011 | Ferrara et al. |
| 2011/0028333 A1 | 2/2011 | Christensen et al. |
| 2011/0032983 A1 | 2/2011 | Sezer |
| 2011/0035271 A1 | 2/2011 | Weaver et al. |
| 2011/0035491 A1 | 2/2011 | Gelvin et al. |
| 2011/0045818 A1 | 2/2011 | Banks et al. |
| 2011/0054356 A1 | 3/2011 | Merfeld |
| 2011/0054949 A1 | 3/2011 | Joye et al. |
| 2011/0059860 A1 | 3/2011 | Gustafsson et al. |
| 2011/0064747 A1 | 3/2011 | Sarangarajan et al. |
| 2011/0065981 A1 | 3/2011 | Khatib |
| 2011/0070587 A1 | 3/2011 | Fuernkranz et al. |
| 2011/0071033 A1 | 3/2011 | Yurttas et al. |
| 2011/0075920 A1 | 3/2011 | Wu et al. |
| 2011/0077194 A1 | 3/2011 | McCaddon |
| 2011/0077215 A1 | 3/2011 | Yu et al. |
| 2011/0077931 A1 | 3/2011 | Grimes |
| 2011/0079077 A1 | 4/2011 | Lin et al. |
| 2011/0086349 A1 | 4/2011 | Anjomshoaa et al. |
| 2011/0086371 A1 | 4/2011 | Lin et al. |
| 2011/0086796 A1 | 4/2011 | Wang et al. |
| 2011/0091994 A1 | 4/2011 | Lotteau |
| 2011/0093288 A1 | 4/2011 | Soto et al. |
| 2011/0101788 A1 | 5/2011 | Sun et al. |
| 2011/0104121 A1 | 5/2011 | Wira et al. |
| 2011/0106736 A1 | 5/2011 | Aharonson et al. |
| 2011/0111419 A1 | 5/2011 | Stefansson et al. |
| 2011/0118539 A1 | 5/2011 | Khatib |
| 2011/0123100 A1 | 5/2011 | Carroll et al. |
| 2011/0123986 A1 | 5/2011 | Narain et al. |
| 2011/0123987 A1 | 5/2011 | Narain et al. |
| 2011/0124119 A1 | 5/2011 | Lopes-Virella et al. |
| 2011/0129831 A1 | 6/2011 | Cargill et al. |
| 2011/0130303 A1 | 6/2011 | Sanche Fueyo et al. |
| 2011/0131160 A1 | 6/2011 | Canny et al. |
| 2011/0135637 A1 | 6/2011 | Sampson et al. |
| 2011/0136260 A1 | 6/2011 | Firestein-Miller |
| 2011/0137472 A1 | 6/2011 | Hitt et al. |
| 2011/0137851 A1 | 6/2011 | Cavet et al. |
| 2011/0150323 A1 | 6/2011 | Hancock et al. |
| 2011/0158806 A1 | 6/2011 | Arms et al. |
| 2011/0166844 A1 | 7/2011 | Gustafsson et al. |
| 2011/0173116 A1 | 7/2011 | Yan et al. |
| 2011/0176469 A1 | 7/2011 | Kim et al. |
| 2011/0176606 A1 | 7/2011 | Fuchie |
| 2011/0182524 A1 | 7/2011 | Shibata et al. |
| 2011/0189648 A1 | 8/2011 | Pribenszky et al. |
| 2011/0191496 A1 | 8/2011 | Luo et al. |
| 2011/0200266 A1 | 8/2011 | Fuchie et al. |
| 2011/0207659 A1 | 8/2011 | Morrow et al. |
| 2011/0207708 A1 | 8/2011 | Gleicher et al. |
| 2011/0208738 A1 | 8/2011 | Bar et al. |
| 2011/0213746 A1 | 9/2011 | Botonjic-Sehic et al. |
| 2011/0224181 A1 | 9/2011 | Hoffman et al. |
| 2011/0225037 A1 | 9/2011 | Tunca et al. |
| 2011/0230366 A1 | 9/2011 | Gudmundsson et al. |
| 2011/0248846 A1 | 10/2011 | Belov et al. |
| 2011/0251272 A1 | 10/2011 | Rieder et al. |
| 2011/0251995 A1 | 10/2011 | Hangartner et al. |
| 2011/0257216 A1 | 10/2011 | Nordsiek et al. |
| 2011/0257217 A1 | 10/2011 | Nordsiek et al. |
| 2011/0257218 A1 | 10/2011 | Nordsiek et al. |
| 2011/0257219 A1 | 10/2011 | Nordsiek et al. |
| 2011/0263633 A1 | 10/2011 | Nordsiek et al. |
| 2011/0263634 A1 | 10/2011 | Nordsiek et al. |
| 2011/0263635 A1 | 10/2011 | Nordsiek et al. |
| 2011/0263636 A1 | 10/2011 | Nordsiek et al. |
| 2011/0263637 A1 | 10/2011 | Nordsiek et al. |
| 2011/0263967 A1 | 10/2011 | Bailey et al. |
| 2011/0269735 A1 | 11/2011 | Shiffman et al. |
| 2011/0276828 A1 | 11/2011 | Tamaki et al. |
| 2011/0284029 A1 | 11/2011 | Baseman et al. |
| 2011/0287946 A1 | 11/2011 | Gudmundsson et al. |
| 2011/0293278 A1 | 12/2011 | Mazed |
| 2011/0293626 A1 | 12/2011 | Schrodi et al. |
| 2011/0299455 A1 | 12/2011 | Ordentlich et al. |
| 2011/0302823 A1 | 12/2011 | Bruck et al. |
| 2011/0307303 A1 | 12/2011 | Dutta et al. |
| 2011/0310779 A1 | 12/2011 | De Poorter et al. |
| 2011/0311565 A1 | 12/2011 | Samoylova et al. |
| 2011/0319811 A1 | 12/2011 | Nordsiek et al. |
| 2012/0003212 A1 | 1/2012 | Walsh et al. |
| 2012/0010274 A1 | 1/2012 | Begovich et al. |
| 2012/0010867 A1 | 1/2012 | Eder |
| 2012/0014289 A1 | 1/2012 | Ortega et al. |
| 2012/0014435 A1 | 1/2012 | Yang et al. |
| 2012/0016106 A1 | 1/2012 | Walsh et al. |
| 2012/0016436 A1 | 1/2012 | Sarma et al. |
| 2012/0030082 A1 | 2/2012 | Voltz et al. |
| 2012/0039864 A1 | 2/2012 | Bare et al. |
| 2012/0046263 A1 | 2/2012 | Navara |
| 2012/0051434 A1 | 3/2012 | Blum |
| 2012/0064512 A1 | 3/2012 | Li et al. |
| 2012/0065758 A1 | 3/2012 | Pharand et al. |
| 2012/0066217 A1 | 3/2012 | Eder |
| 2012/0069895 A1 | 3/2012 | Blum |
| 2012/0071357 A1 | 3/2012 | Kitzman et al. |
| 2012/0072781 A1 | 3/2012 | Kini et al. |
| 2012/0082678 A1 | 4/2012 | Li et al. |
| 2012/0089370 A1 | 4/2012 | Chebbo et al. |
| 2012/0092155 A1 | 4/2012 | Abedi |
| 2012/0093376 A1 | 4/2012 | Malik et al. |
| 2012/0101965 A1 | 4/2012 | Hennig et al. |
| 2012/0106397 A1 | 5/2012 | Abedi |
| 2012/0107370 A1 | 5/2012 | Forbes et al. |
| 2012/0108651 A1 | 5/2012 | Bare et al. |
| 2012/0114211 A1 | 5/2012 | Kraus et al. |
| 2012/0114620 A1 | 5/2012 | Braughler et al. |
| 2012/0121618 A1 | 5/2012 | Kantoff et al. |
| 2012/0123284 A1 | 5/2012 | Kheradvar |
| 2012/0127020 A1 | 5/2012 | Paek et al. |
| 2012/0127924 A1 | 5/2012 | Bandyopadhyay et al. |
| 2012/0128223 A1 | 5/2012 | Rivaz et al. |
| 2012/0128702 A1 | 5/2012 | Weinschenk et al. |
| 2012/0136629 A1 | 5/2012 | Tamaki et al. |
| 2012/0143510 A1 | 6/2012 | Alam |
| 2012/0150032 A1 | 6/2012 | Gudmundsson et al. |
| 2012/0154149 A1 | 6/2012 | Trumble |
| 2012/0156215 A1 | 6/2012 | Samoylova et al. |
| 2012/0158633 A1 | 6/2012 | Eder |
| 2012/0163656 A1 | 6/2012 | Wang et al. |
| 2012/0165221 A1 | 6/2012 | Landstein et al. |
| 2012/0166291 A1 | 6/2012 | Broder et al. |
| 2012/0173171 A1 | 7/2012 | Bajwa et al. |
| 2012/0173200 A1 | 7/2012 | Breton et al. |

(56) References Cited

U.S. PATENT DOCUMENTS

| | | |
|---|---|---|
| 2012/0178486 A1 | 7/2012 | Kaufmann |
| 2012/0184605 A1 | 7/2012 | Forbes et al. |
| 2012/0190386 A1 | 7/2012 | Anderson |
| 2012/0207771 A1 | 8/2012 | O'Shannessy et al. |
| 2012/0209565 A1 | 8/2012 | Handley et al. |
| 2012/0209697 A1 | 8/2012 | Agresti et al. |
| 2012/0215348 A1 | 8/2012 | Skrinde |
| 2012/0218376 A1 | 8/2012 | Athan |
| 2012/0220055 A1 | 8/2012 | Foote et al. |
| 2012/0220958 A1 | 8/2012 | Vournakis et al. |
| 2012/0230515 A1 | 9/2012 | Grancharov et al. |
| 2012/0239489 A1 | 9/2012 | Peretti et al. |
| 2012/0244145 A1 | 9/2012 | Sampson et al. |
| 2012/0245133 A1 | 9/2012 | Hoffman et al. |
| 2012/0250863 A1 | 10/2012 | Bukshpun et al. |
| 2012/0250963 A1 | 10/2012 | Carroll et al. |
| 2012/0252050 A1 | 10/2012 | Towler et al. |
| 2012/0252695 A1 | 10/2012 | Aerssens et al. |
| 2012/0257164 A1 | 10/2012 | Zee et al. |
| 2012/0257530 A1 | 10/2012 | Bijwaard et al. |
| 2012/0258874 A1 | 10/2012 | Narain et al. |
| 2012/0258884 A1 | 10/2012 | Schramm et al. |
| 2012/0259557 A1 | 10/2012 | Gorenstein et al. |
| 2012/0262291 A1 | 10/2012 | Bastide et al. |
| 2012/0264692 A1 | 10/2012 | Bare et al. |
| 2012/0265716 A1 | 10/2012 | Hunzinger et al. |
| 2012/0265978 A1 | 10/2012 | Shenfield et al. |
| 2012/0269846 A1 | 10/2012 | Maki et al. |
| 2012/0276528 A1 | 11/2012 | Cargill et al. |
| 2012/0280146 A1 | 11/2012 | Rizkallah et al. |
| 2012/0283885 A1 | 11/2012 | Mannar et al. |
| 2012/0284207 A1 | 11/2012 | Eder |
| 2012/0290505 A1 | 11/2012 | Eder |
| 2012/0301407 A1 | 11/2012 | Durham et al. |
| 2012/0303408 A1 | 11/2012 | Eder |
| 2012/0303504 A1 | 11/2012 | Eder |
| 2012/0310619 A1 | 12/2012 | McConaghy |
| 2012/0315655 A1 | 12/2012 | Kraus et al. |
| 2012/0316833 A1 | 12/2012 | Lovick |
| 2012/0316835 A1 | 12/2012 | Maeda et al. |
| 2012/0330720 A1 | 12/2012 | Pickton et al. |
| 2013/0004473 A1 | 1/2013 | Kochel et al. |
| 2013/0012860 A1 | 1/2013 | Suthanthiran et al. |
| 2013/0013574 A1 | 1/2013 | Wu |
| 2013/0016625 A1 | 1/2013 | Murias et al. |
| 2013/0016636 A1 | 1/2013 | Berger et al. |
| 2013/0024124 A1 | 1/2013 | Collazo et al. |
| 2013/0024269 A1 | 1/2013 | Farahat et al. |
| 2013/0029327 A1 | 1/2013 | Huang et al. |
| 2013/0029384 A1 | 1/2013 | Cerdobbel et al. |
| 2013/0030051 A1 | 1/2013 | Shiffman et al. |
| 2013/0030584 A1 | 1/2013 | Milosevic et al. |
| 2013/0040922 A1 | 2/2013 | Kreppner et al. |
| 2013/0040923 A1 | 2/2013 | Kreppner et al. |
| 2013/0041034 A1 | 2/2013 | Singh et al. |
| 2013/0041627 A1 | 2/2013 | Luo et al. |
| 2013/0044183 A1 | 2/2013 | Jeon et al. |
| 2013/0045198 A1 | 2/2013 | Bare et al. |
| 2013/0045958 A1 | 2/2013 | Kreppner et al. |
| 2013/0046463 A1 | 2/2013 | Bengtson et al. |
| 2013/0048436 A1 | 2/2013 | Chan |
| 2013/0054486 A1 | 2/2013 | Eder |
| 2013/0058914 A1 | 3/2013 | Iakoubova et al. |
| 2013/0059827 A1 | 3/2013 | Kreppner et al. |
| 2013/0059915 A1 | 3/2013 | Singh et al. |
| 2013/0060305 A1 | 3/2013 | Bokil |
| 2013/0060549 A1 | 3/2013 | Grimes |
| 2013/0061339 A1 | 3/2013 | Garner et al. |
| 2013/0065870 A1 | 3/2013 | Singh et al. |
| 2013/0071033 A1 | 3/2013 | Stein et al. |
| 2013/0073213 A1 | 3/2013 | Centola et al. |
| 2013/0073442 A1 | 3/2013 | Eder |
| 2013/0076531 A1 | 3/2013 | San Vicente et al. |
| 2013/0076532 A1 | 3/2013 | San Vicente et al. |
| 2013/0078627 A1 | 3/2013 | Li et al. |
| 2013/0078912 A1 | 3/2013 | San Vicente et al. |
| 2013/0080073 A1 | 3/2013 | de Corral |
| 2013/0080101 A1 | 3/2013 | Vuskovic et al. |
| 2013/0081158 A1 | 3/2013 | Paterson et al. |
| 2013/0096892 A1 | 4/2013 | Essa et al. |
| 2013/0097276 A1 | 4/2013 | Sridhar |
| 2013/0102918 A1 | 4/2013 | Etkin et al. |
| 2013/0103570 A1 | 4/2013 | Shi et al. |
| 2013/0103615 A1 | 4/2013 | Mun |
| 2013/0107041 A1 | 5/2013 | Norem et al. |
| 2013/0109583 A1 | 5/2013 | Beim |
| 2013/0112895 A1 | 5/2013 | Birlouez-Aragon et al. |
| 2013/0113631 A1 | 5/2013 | Pitchford et al. |
| 2013/0118532 A1 | 5/2013 | Baltsen et al. |
| 2013/0129764 A1 | 5/2013 | Atkinson et al. |
| 2013/0130923 A1 | 5/2013 | Ehrich et al. |
| 2013/0132163 A1 | 5/2013 | Eder |
| 2013/0138481 A1 | 5/2013 | Handley |
| 2013/0143215 A1 | 6/2013 | Dervieux |
| 2013/0148713 A1 | 6/2013 | Lee et al. |
| 2013/0149290 A1 | 6/2013 | Braughler et al. |
| 2013/0151429 A1 | 6/2013 | Cao et al. |
| 2013/0153060 A1 | 6/2013 | Barrett |
| 2013/0155952 A1 | 6/2013 | Chu et al. |
| 2013/0156767 A1 | 6/2013 | Walsh et al. |
| 2013/0171296 A1 | 7/2013 | Isaksen |
| 2013/0176872 A1 | 7/2013 | Stanczak et al. |
| 2013/0180336 A1 | 7/2013 | Koh et al. |
| 2013/0183664 A1 | 7/2013 | Welch et al. |
| 2013/0185226 A1 | 7/2013 | Hardman et al. |
| 2013/0197081 A1 | 8/2013 | Powers et al. |
| 2013/0197738 A1 | 8/2013 | Dvorak et al. |
| 2013/0197830 A1 | 8/2013 | Dvorak et al. |
| 2013/0198203 A1 | 8/2013 | Bates et al. |
| 2013/0201316 A1 | 8/2013 | Binder et al. |
| 2013/0204664 A1 | 8/2013 | Romagnolo et al. |
| 2013/0204833 A1 | 8/2013 | Pang et al. |
| 2013/0207815 A1 | 8/2013 | Pitchford et al. |
| 2013/0209486 A1 | 8/2013 | Li et al. |
| 2013/0210855 A1 | 8/2013 | Nordsiek et al. |
| 2013/0211229 A1 | 8/2013 | Rao et al. |
| 2013/0212168 A1 | 8/2013 | Bonasera et al. |
| 2013/0216551 A1 | 8/2013 | Begovich et al. |
| 2013/0225439 A1 | 8/2013 | Princen et al. |
| 2013/0237438 A1 | 9/2013 | Ruano et al. |
| 2013/0237447 A1 | 9/2013 | Nelson et al. |
| 2013/0240722 A1 | 9/2013 | Coon et al. |
| 2013/0244121 A1 | 9/2013 | Gogotsi et al. |
| 2013/0244233 A1 | 9/2013 | Diatchenko et al. |
| 2013/0244902 A1 | 9/2013 | Thibodeau et al. |
| 2013/0244965 A1 | 9/2013 | Williams et al. |
| 2013/0252267 A1 | 9/2013 | Lin et al. |
| 2013/0252822 A1 | 9/2013 | Weber et al. |
| 2013/0258904 A1 | 10/2013 | Kaufmann |
| 2013/0259847 A1 | 10/2013 | Vishnudas et al. |
| 2013/0262425 A1 | 10/2013 | Shamlin et al. |
| 2013/0265874 A1 | 10/2013 | Zhu et al. |
| 2013/0265915 A1 | 10/2013 | Choi et al. |
| 2013/0265981 A1 | 10/2013 | Yang et al. |
| 2013/0266557 A1 | 10/2013 | Sarangarajan et al. |
| 2013/0271668 A1 | 10/2013 | Argyropoulos et al. |
| 2013/0273103 A1 | 10/2013 | Liao et al. |
| 2013/0274195 A1 | 10/2013 | Bare et al. |
| 2013/0280241 A1 | 10/2013 | Markowitz et al. |
| 2013/0288913 A1 | 10/2013 | Schramm et al. |
| 2013/0289424 A1 | 10/2013 | Brockway et al. |
| 2013/0303558 A1 | 11/2013 | Luke et al. |
| 2013/0303939 A1 | 11/2013 | Karmali et al. |
| 2013/0310261 A1 | 11/2013 | Schramm et al. |
| 2013/0314273 A1 | 11/2013 | Kavaler et al. |
| 2013/0315885 A1 | 11/2013 | Narain et al. |
| 2013/0315894 A1 | 11/2013 | Schrodi et al. |
| 2013/0320212 A1 | 12/2013 | Valentino et al. |
| 2013/0325498 A1 | 12/2013 | Muza, Jr. et al. |
| 2013/0332010 A1 | 12/2013 | Ziarno |
| 2013/0332011 A1 | 12/2013 | Ziarno |
| 2013/0332025 A1 | 12/2013 | Ziarno |
| 2013/0332231 A1 | 12/2013 | Pickton et al. |
| 2013/0332338 A1 | 12/2013 | Yan et al. |

(56) References Cited

U.S. PATENT DOCUMENTS

| | | |
|---|---|---|
| 2013/0346023 A1 | 12/2013 | Novo et al. |
| 2013/0346039 A1 | 12/2013 | Song et al. |
| 2013/0346844 A1 | 12/2013 | Graepel et al. |
| 2014/0004075 A1 | 1/2014 | Suckling et al. |
| 2014/0004510 A1 | 1/2014 | DeAngelis et al. |
| 2014/0006013 A1 | 1/2014 | Markatou et al. |
| 2014/0010047 A1 | 1/2014 | Barakat et al. |
| 2014/0010288 A1 | 1/2014 | Yang et al. |
| 2014/0011206 A1 | 1/2014 | Latham et al. |
| 2014/0011787 A1 | 1/2014 | Gleicher et al. |
| 2014/0025342 A1 | 1/2014 | Gorenstein et al. |
| 2014/0032186 A1 | 1/2014 | Gustafsson et al. |
| 2014/0038930 A1 | 2/2014 | Gleicher et al. |
| 2014/0058528 A1 | 2/2014 | Contreras-Vidal et al. |
| 2014/0062212 A1 | 3/2014 | Sun et al. |
| 2014/0072550 A1 | 3/2014 | Iakoubova et al. |
| 2014/0072957 A1 | 3/2014 | Huang et al. |
| 2014/0080784 A1 | 3/2014 | Stover et al. |
| 2014/0081675 A1 | 3/2014 | Ives et al. |
| 2014/0086920 A1 | 3/2014 | Walsh et al. |
| 2014/0087960 A1 | 3/2014 | Seddon et al. |
| 2014/0088406 A1 | 3/2014 | Dharmakumar et al. |
| 2014/0093127 A1 | 4/2014 | Mundhenk et al. |
| 2014/0093974 A1 | 4/2014 | Lopes-Virella et al. |
| 2014/0095251 A1 | 4/2014 | Huovilainen |
| 2014/0100128 A1 | 4/2014 | Narain et al. |
| 2014/0100989 A1 | 4/2014 | Zhang et al. |
| 2014/0106370 A1 | 4/2014 | Tseng et al. |
| 2014/0107850 A1 | 4/2014 | Curtis |
| 2014/0114549 A1 | 4/2014 | Ziarno |
| 2014/0114746 A1 | 4/2014 | Pani et al. |
| 2014/0114880 A1 | 4/2014 | Breeden |
| 2014/0120137 A1 | 5/2014 | Davis et al. |
| 2014/0120533 A1 | 5/2014 | Shiffman et al. |
| 2014/0124621 A1 | 5/2014 | Godzdanker et al. |
| 2014/0127213 A1 | 5/2014 | Schrodi et al. |
| 2014/0128362 A1 | 5/2014 | Bare et al. |
| 2014/0134186 A1 | 5/2014 | Li et al. |
| 2014/0134625 A1 | 5/2014 | Haddad et al. |
| 2014/0135225 A1 | 5/2014 | Crow et al. |
| 2014/0141988 A1 | 5/2014 | Thorne et al. |
| 2014/0142861 A1 | 5/2014 | Hagstrom et al. |
| 2014/0143134 A1 | 5/2014 | Yan et al. |
| 2014/0148505 A1 | 5/2014 | Rieder et al. |
| 2014/0153674 A1 | 6/2014 | Stratigos, Jr. |
| 2014/0156231 A1 | 6/2014 | Guo et al. |
| 2014/0156571 A1 | 6/2014 | Hennig et al. |
| 2014/0163096 A1 | 6/2014 | Golden et al. |
| 2014/0170069 A1 | 6/2014 | Dharmakumar et al. |
| 2014/0171337 A1 | 6/2014 | Beim |
| 2014/0171382 A1 | 6/2014 | Bhatia |
| 2014/0172444 A1 | 6/2014 | Moore et al. |
| 2014/0172507 A1 | 6/2014 | Menon |
| 2014/0178348 A1 | 6/2014 | Kelsey et al. |
| 2014/0184430 A1 | 7/2014 | Jiang et al. |
| 2014/0186333 A1 | 7/2014 | Bare et al. |
| 2014/0188918 A1 | 7/2014 | Shamlin et al. |
| 2014/0191875 A1 | 7/2014 | Wedig et al. |
| 2014/0192689 A1 | 7/2014 | De Poorter et al. |
| 2014/0193919 A1 | 7/2014 | Skinner et al. |
| 2014/0199290 A1 | 7/2014 | Grupe et al. |
| 2014/0200953 A1 | 7/2014 | Mun |
| 2014/0200999 A1 | 7/2014 | Canny et al. |
| 2014/0213533 A1 | 7/2014 | Suthanthiran et al. |
| 2014/0216144 A1 | 8/2014 | Squartini et al. |
| 2014/0219968 A1 | 8/2014 | Llagostera et al. |
| 2014/0221484 A1 | 8/2014 | Cargill et al. |
| 2014/0225603 A1 | 8/2014 | Auguste et al. |
| 2014/0234291 A1 | 8/2014 | Cargill et al. |
| 2014/0234347 A1 | 8/2014 | Weinschenk et al. |
| 2014/0235605 A1 | 8/2014 | Shiffman et al. |
| 2014/0236965 A1 | 8/2014 | Yarmus |
| 2014/0242180 A1 | 8/2014 | Lavik et al. |
| 2014/0244216 A1 | 8/2014 | Breton et al. |
| 2014/0249447 A1 | 9/2014 | Sereno et al. |
| 2014/0249862 A1 | 9/2014 | Andrist et al. |
| 2014/0253733 A1 | 9/2014 | Norem et al. |
| 2014/0256576 A1 | 9/2014 | Li et al. |
| 2014/0258355 A1 | 9/2014 | Chu et al. |
| 2014/0263418 A1 | 9/2014 | Keating et al. |
| 2014/0263430 A1 | 9/2014 | Keating et al. |
| 2014/0263989 A1 | 9/2014 | Valentino et al. |
| 2014/0264047 A1 | 9/2014 | Valentino et al. |
| 2014/0266776 A1 | 9/2014 | Miller et al. |
| 2014/0266785 A1 | 9/2014 | Miller et al. |
| 2014/0267700 A1 | 9/2014 | Wang et al. |
| 2014/0268601 A1 | 9/2014 | Valentino et al. |
| 2014/0271672 A1 | 9/2014 | Iakoubova et al. |
| 2014/0273821 A1 | 9/2014 | Miller et al. |
| 2014/0274885 A1 | 9/2014 | Cong et al. |
| 2014/0275849 A1 | 9/2014 | Acquista |
| 2014/0278148 A1 | 9/2014 | Ziegel et al. |
| 2014/0278967 A1 | 9/2014 | Pal et al. |
| 2014/0279053 A1 | 9/2014 | Lee |
| 2014/0279306 A1 | 9/2014 | Shi et al. |
| 2014/0286935 A1 | 9/2014 | Hamblin et al. |
| 2014/0294903 A1 | 10/2014 | Forbes et al. |
| 2014/0299783 A1 | 10/2014 | Valentino et al. |
| 2014/0301217 A1 | 10/2014 | Choi et al. |
| 2014/0303481 A1 | 10/2014 | Sorensen et al. |
| 2014/0303944 A1 | 10/2014 | Jiang et al. |
| 2014/0307770 A1 | 10/2014 | Jiang et al. |
| 2014/0312242 A1 | 10/2014 | Valentino et al. |
| 2014/0316217 A1 | 10/2014 | Purdon et al. |
| 2014/0323897 A1 | 10/2014 | Brown et al. |
| 2014/0324521 A1 | 10/2014 | Mun |
| 2014/0336965 A1 | 11/2014 | Mori et al. |
| 2014/0343786 A1 | 11/2014 | Dvorak et al. |
| 2014/0343959 A1 | 11/2014 | Hasegawa et al. |
| 2014/0349597 A1 | 11/2014 | Abolfathi et al. |
| 2014/0349984 A1 | 11/2014 | Hoffman et al. |
| 2014/0350722 A1 | 11/2014 | Skrinde |
| 2014/0351183 A1 | 11/2014 | Germain et al. |
| 2014/0355499 A1 | 12/2014 | Akhlaq et al. |
| 2014/0358442 A1 | 12/2014 | Akhlaq et al. |
| 2014/0365144 A1 | 12/2014 | Dvorak et al. |
| 2014/0365276 A1 | 12/2014 | Harsha et al. |
| 2014/0370836 A1 | 12/2014 | Gladstone |
| 2014/0376645 A1 | 12/2014 | Kumar et al. |
| 2014/0376827 A1 | 12/2014 | Jiang et al. |
| 2014/0378334 A1 | 12/2014 | Galichon et al. |
| 2015/0001420 A1 | 1/2015 | Langoju et al. |
| 2015/0002845 A1 | 1/2015 | Ostroverkhov et al. |
| 2015/0004641 A1 | 1/2015 | Dylov et al. |
| 2015/0005176 A1 | 1/2015 | Kim et al. |
| 2015/0006605 A1 | 1/2015 | Chu et al. |
| 2015/0007181 A1 | 1/2015 | Saraschandra et al. |
| 2015/0018632 A1 | 1/2015 | Khair |
| 2015/0019262 A1 | 1/2015 | Du et al. |
| 2015/0023949 A1 | 1/2015 | Narain et al. |
| 2015/0025328 A1 | 1/2015 | Khair |
| 2015/0031578 A1 | 1/2015 | Black et al. |
| 2015/0031969 A1 | 1/2015 | Khair |
| 2015/0032598 A1 | 1/2015 | Fleming et al. |
| 2015/0032675 A1 | 1/2015 | Huehn et al. |
| 2015/0039265 A1 | 2/2015 | Acharid et al. |
| 2015/0046582 A1 | 2/2015 | Gelvin et al. |
| 2015/0049650 A1 | 2/2015 | Choi |
| 2015/0051896 A1 | 2/2015 | Simard et al. |
| 2015/0051949 A1 | 2/2015 | Pickton |
| 2015/0056212 A1 | 2/2015 | Kupper et al. |
| 2015/0064194 A1 | 3/2015 | Kupper et al. |
| 2015/0064195 A1 | 3/2015 | Kupper et al. |
| 2015/0064670 A1 | 3/2015 | Merfeld et al. |
| 2015/0066738 A1 | 3/2015 | Tian et al. |
| 2015/0072434 A1 | 3/2015 | Towler et al. |
| 2015/0072879 A1 | 3/2015 | Princen et al. |
| 2015/0073306 A1 | 3/2015 | Abeyratne et al. |
| 2015/0078460 A1 | 3/2015 | Hu et al. |
| 2015/0078738 A1 | 3/2015 | Brooke |
| 2015/0081247 A1 | 3/2015 | Valentino et al. |
| 2015/0082754 A1 | 3/2015 | Jasiulek et al. |
| 2015/0086013 A1 | 3/2015 | Metzler et al. |
| 2015/0088783 A1 | 3/2015 | Mun |

(56) References Cited

U.S. PATENT DOCUMENTS

| | | |
|---|---|---|
| 2015/0089399 A1 | 3/2015 | Megill et al. |
| 2015/0094618 A1 | 4/2015 | Russell et al. |
| 2015/0100244 A1 | 4/2015 | Hannum |
| 2015/0100407 A1 | 4/2015 | Sterns et al. |
| 2015/0100408 A1 | 4/2015 | Sterns et al. |
| 2015/0100409 A1 | 4/2015 | Sterns et al. |
| 2015/0100410 A1 | 4/2015 | Sterns et al. |
| 2015/0100411 A1 | 4/2015 | Sterns et al. |
| 2015/0100412 A1 | 4/2015 | Sterns et al. |
| 2015/0111775 A1 | 4/2015 | Iakoubova et al. |
| 2015/0112874 A1 | 4/2015 | Serio et al. |
| 2015/0119079 A1 | 4/2015 | Tarlazzi et al. |
| 2015/0119759 A1 | 4/2015 | Gonzales et al. |
| 2015/0120758 A1 | 4/2015 | Cichosz et al. |
| 2015/0139425 A1 | 5/2015 | Ko et al. |
| 2015/0142331 A1 | 5/2015 | Beim et al. |
| 2015/0152176 A1 | 6/2015 | Walsh et al. |
| 2015/0164408 A1 | 6/2015 | Russell et al. |
| 2015/0167062 A1 | 6/2015 | Young et al. |
| 2015/0169840 A1 | 6/2015 | Kupfer et al. |
| 2015/0178620 A1 | 6/2015 | Ascari et al. |
| 2015/0178756 A1 | 6/2015 | Chao et al. |
| 2015/0190367 A1 | 7/2015 | Forbes et al. |
| 2015/0190436 A1 | 7/2015 | Davis et al. |
| 2015/0191787 A1 | 7/2015 | Muthukumar et al. |
| 2015/0192682 A1 | 7/2015 | Valentino et al. |
| 2015/0205756 A1 | 7/2015 | Bouchard |
| 2015/0209586 A1 | 7/2015 | Silva et al. |
| 2015/0213192 A1 | 7/2015 | Patel et al. |
| 2015/0215127 A1 | 7/2015 | Sabottke |
| 2015/0216164 A1 | 8/2015 | Bedoukian et al. |
| 2015/0216922 A1 | 8/2015 | Kim et al. |
| 2015/0220487 A1 | 8/2015 | Lovick |
| 2015/0228031 A1 | 8/2015 | Emison et al. |
| 2015/0228076 A1 | 8/2015 | Mouridsen et al. |
| 2015/0231191 A1 | 8/2015 | Clarot et al. |
| 2015/0232944 A1 | 8/2015 | De Reynies et al. |
| 2015/0235143 A1 | 8/2015 | Eder |
| 2015/0240304 A1 | 8/2015 | Cervino et al. |
| 2015/0240305 A1 | 8/2015 | Suthanthiran et al. |
| 2015/0240314 A1 | 8/2015 | Danila et al. |
| 2015/0249486 A1 | 9/2015 | Stratigos, Jr. |
| 2015/0250816 A1 | 9/2015 | Durham et al. |
| 2015/0259744 A1 | 9/2015 | Begovich et al. |
| 2015/0262511 A1 | 9/2015 | Lin et al. |
| 2015/0268355 A1 | 9/2015 | Valentino et al. |
| 2015/0272464 A1 | 10/2015 | Armoundas |
| 2015/0280863 A1 | 10/2015 | Muqaibel et al. |
| 2015/0286933 A1 | 10/2015 | Trivelpiece |
| 2015/0287143 A1 | 10/2015 | Gabriel et al. |
| 2015/0288604 A1 | 10/2015 | Boudreaux |
| 2015/0289149 A1 | 10/2015 | Ouyang et al. |
| 2015/0291975 A1 | 10/2015 | Minshull et al. |
| 2015/0291976 A1 | 10/2015 | Minshull et al. |
| 2015/0291977 A1 | 10/2015 | Minshull et al. |
| 2015/0292010 A1 | 10/2015 | Khatib |
| 2015/0292016 A1 | 10/2015 | Bureau et al. |
| 2015/0294431 A1 | 10/2015 | Fiorucci et al. |
| 2015/0299798 A1 | 10/2015 | De Reynies et al. |
| 2015/0302529 A1 | 10/2015 | Jagannathan |
| 2015/0306160 A1 | 10/2015 | Fueyo et al. |
| 2015/0307614 A1 | 10/2015 | Sampson et al. |
| 2015/0316562 A1 | 11/2015 | Kochel et al. |
| 2015/0316926 A1 | 11/2015 | Ziarno |
| 2015/0317449 A1 | 11/2015 | Eder |
| 2015/0320707 A1 | 11/2015 | Singh et al. |
| 2015/0320708 A1 | 11/2015 | Singh et al. |
| 2015/0324548 A1 | 11/2015 | Eder |
| 2015/0328174 A1 | 11/2015 | Singh et al. |
| 2015/0330869 A1 | 11/2015 | Ziarno |
| 2015/0332013 A1 | 11/2015 | Lee et al. |
| 2015/0337373 A1 | 11/2015 | Chettier et al. |
| 2015/0338525 A1 | 11/2015 | Valentino et al. |
| 2015/0341379 A1 | 11/2015 | Lefebvre et al. |
| 2015/0341643 A1 | 11/2015 | Xu et al. |
| 2015/0343144 A1 | 12/2015 | Altschul et al. |
| 2015/0347922 A1 | 12/2015 | Hamann et al. |
| 2015/0348095 A1 | 12/2015 | Dixon et al. |
| 2015/0351084 A1 | 12/2015 | Werb |
| 2015/0351336 A1 | 12/2015 | Gilbert et al. |
| 2015/0356458 A1 | 12/2015 | Berengueres et al. |
| 2015/0359781 A1 | 12/2015 | Sarpotdar et al. |
| 2015/0361494 A1 | 12/2015 | Ward et al. |
| 2015/0363981 A1 | 12/2015 | Ziarno et al. |
| 2015/0366830 A1 | 12/2015 | Singh et al. |
| 2015/0377909 A1 | 12/2015 | Cavet et al. |
| 2015/0378807 A1 | 12/2015 | Ball et al. |
| 2015/0379428 A1 | 12/2015 | Dirac et al. |
| 2015/0379429 A1 | 12/2015 | Lee et al. |
| 2015/0379430 A1 | 12/2015 | Dirac et al. |
| 2015/0381994 A1 | 12/2015 | Yu et al. |
| 2016/0000045 A1 | 1/2016 | Funaya et al. |
| 2016/0003845 A1 | 1/2016 | Brasier et al. |
| 2016/0010162 A1 | 1/2016 | Klee et al. |
| 2016/0012334 A1 | 1/2016 | Ning et al. |
| 2016/0012465 A1 | 1/2016 | Sharp |
| 2016/0017037 A1 | 1/2016 | Hamblin et al. |
| 2016/0017426 A1 | 1/2016 | Beim et al. |
| 2016/0024575 A1 | 1/2016 | Spindler et al. |
| 2016/0025514 A1 | 1/2016 | Pitchford et al. |
| 2016/0029643 A1 | 2/2016 | Iatrou et al. |
| 2016/0029945 A1 | 2/2016 | Merfeld et al. |
| 2016/0032388 A1 | 2/2016 | Huang et al. |
| 2016/0034640 A1 | 2/2016 | Zhao et al. |
| 2016/0034664 A1 | 2/2016 | Santos et al. |
| 2016/0038538 A1 | 2/2016 | Keyser et al. |
| 2016/0040184 A1 | 2/2016 | Cong et al. |
| 2016/0040236 A1 | 2/2016 | Hosur et al. |
| 2016/0042009 A1 | 2/2016 | Gkoulalas-Divanis et al. |
| 2016/0042197 A1 | 2/2016 | Gkoulalas-Divanis et al. |
| 2016/0042513 A1 | 2/2016 | Yudovsky |
| 2016/0042744 A1 | 2/2016 | Klejsa et al. |
| 2016/0044035 A1 | 2/2016 | Huang |
| 2016/0045466 A1 | 2/2016 | Singh et al. |
| 2016/0046991 A1 | 2/2016 | Huang et al. |
| 2016/0048925 A1 | 2/2016 | Emison et al. |
| 2016/0051791 A1 | 2/2016 | Ewers et al. |
| 2016/0051806 A1 | 2/2016 | Goldsmith |
| 2016/0053322 A1 | 2/2016 | Nelson et al. |
| 2016/0055855 A1 | 2/2016 | Kjoerling et al. |
| 2016/0058717 A1 | 3/2016 | Page et al. |
| 2016/0063144 A1 | 3/2016 | Cooke et al. |
| 2016/0068890 A1 | 3/2016 | Pichaud et al. |
| 2016/0068916 A1 | 3/2016 | Nekarda et al. |
| 2016/0072547 A1 | 3/2016 | Muqaibel et al. |
| 2016/0075665 A1 | 3/2016 | Page et al. |
| 2016/0078361 A1 | 3/2016 | Brueckner et al. |
| 2016/0081551 A1 | 3/2016 | Miller et al. |
| 2016/0081586 A1 | 3/2016 | Miller et al. |
| 2016/0082589 A1 | 3/2016 | Skrinde |
| 2016/0088517 A1 | 3/2016 | Akyurek et al. |
| 2016/0091730 A1 | 3/2016 | Brooke |
| 2016/0097082 A1 | 4/2016 | Georganopoulou |
| 2016/0100444 A1 | 4/2016 | San Vicente et al. |
| 2016/0100445 A1 | 4/2016 | San Vicente et al. |
| 2016/0105801 A1 | 4/2016 | Wittenberg et al. |
| 2016/0108473 A1 | 4/2016 | Shiffman et al. |
| 2016/0108476 A1 | 4/2016 | Schweiger et al. |
| 2016/0110657 A1 | 4/2016 | Gibiansky et al. |
| 2016/0110812 A1 | 4/2016 | Mun |
| 2016/0117327 A1 | 4/2016 | Zhou et al. |
| 2016/0122396 A1 | 5/2016 | Bunnik et al. |
| 2016/0124933 A1 | 5/2016 | Takeuchi et al. |
| 2016/0125292 A1 | 5/2016 | Seo et al. |
| 2016/0138105 A1 | 5/2016 | Mccoy et al. |
| 2016/0139122 A1 | 5/2016 | Degauque et al. |
| 2016/0145693 A1 | 5/2016 | Narain et al. |
| 2016/0147013 A1 | 5/2016 | Molin et al. |
| 2016/0148237 A1 | 5/2016 | Ifrach et al. |
| 2016/0152252 A1 | 6/2016 | Kim et al. |
| 2016/0152538 A1 | 6/2016 | Plettner et al. |
| 2016/0163132 A1 | 6/2016 | Rabenoro et al. |
| 2016/0168639 A1 | 6/2016 | Luke et al. |
| 2016/0171398 A1 | 6/2016 | Eder |

(56) References Cited

U.S. PATENT DOCUMENTS

| | | |
|---|---|---|
| 2016/0171618 A1 | 6/2016 | Besman et al. |
| 2016/0171619 A1 | 6/2016 | Besman et al. |
| 2016/0173122 A1 | 6/2016 | Akitomi et al. |
| 2016/0173959 A1 | 6/2016 | Seema et al. |
| 2016/0174148 A1 | 6/2016 | Seed et al. |
| 2016/0175321 A1 | 6/2016 | Carper et al. |
| 2016/0183799 A1 | 6/2016 | San Vicente et al. |
| 2016/0189381 A1 | 6/2016 | Rhoads |
| 2016/0196587 A1 | 7/2016 | Eder |
| 2016/0198657 A1 | 7/2016 | Gupta |
| 2016/0202239 A1 | 7/2016 | Voros et al. |
| 2016/0202755 A1 | 7/2016 | Connor |
| 2016/0203279 A1 | 7/2016 | Srinivas et al. |
| 2016/0203316 A1 | 7/2016 | Mace et al. |
| 2016/0222100 A1 | 8/2016 | Monje-Deisseroth et al. |
| 2016/0222450 A1 | 8/2016 | Schrodi et al. |
| 2016/0224724 A1 | 8/2016 | Zhao et al. |
| 2016/0224869 A1 | 8/2016 | Clark-Polner |
| 2016/0225073 A1 | 8/2016 | Xiao et al. |
| 2016/0225074 A1 | 8/2016 | Xiao et al. |
| 2016/0228056 A1 | 8/2016 | Hooker et al. |
| 2016/0228392 A1 | 8/2016 | Singh et al. |
| 2016/0237487 A1 | 8/2016 | Yu et al. |
| 2016/0239919 A1 | 8/2016 | Eder |
| 2016/0243190 A1 | 8/2016 | Barriere et al. |
| 2016/0243215 A1 | 8/2016 | Barouch et al. |
| 2016/0244836 A1 | 8/2016 | Li et al. |
| 2016/0244837 A1 | 8/2016 | Bare et al. |
| 2016/0244840 A1 | 8/2016 | Chilton et al. |
| 2016/0249152 A1 | 8/2016 | Jin et al. |
| 2016/0250228 A1 | 9/2016 | Kreppner et al. |
| 2016/0251720 A1 | 9/2016 | Schulze et al. |
| 2016/0253324 A1 | 9/2016 | Altshuller et al. |
| 2016/0253330 A1 | 9/2016 | Altshuller et al. |
| 2016/0256112 A1 | 9/2016 | Brockway et al. |
| 2016/0259883 A1 | 9/2016 | Grinchuk et al. |
| 2016/0260302 A1 | 9/2016 | Ellers et al. |
| 2016/0260303 A1 | 9/2016 | Strulovitch et al. |
| 2016/0261997 A1 | 9/2016 | Gladstone |
| 2016/0265055 A1 | 9/2016 | Iakoubova et al. |
| 2016/0271144 A1 | 9/2016 | Kreppner et al. |
| 2016/0281105 A1 | 9/2016 | Cong et al. |
| 2016/0281164 A1 | 9/2016 | Bare et al. |
| 2016/0282941 A1 | 9/2016 | Aksenova et al. |
| 2016/0002925 A1 | 10/2016 | Taylor et al. |
| 2016/0295371 A1 | 10/2016 | Zhyshko et al. |
| 2016/0300183 A1 | 10/2016 | Berger et al. |
| 2016/0303111 A1 | 10/2016 | Nordsiek et al. |
| 2016/0303172 A1 | 10/2016 | Zitvogel et al. |
| 2016/0306075 A1 | 10/2016 | Heng et al. |
| 2016/0307138 A1 | 10/2016 | Heng et al. |
| 2016/0310442 A1 | 10/2016 | Deshpande et al. |
| 2016/0314055 A1 | 10/2016 | Bagchi et al. |
| 2016/0319352 A1 | 11/2016 | Iakoubova et al. |
| 2016/0323839 A1 | 11/2016 | Davis et al. |
| 2016/0323841 A1 | 11/2016 | Davis et al. |
| 2016/0333328 A1 | 11/2016 | Minshull et al. |
| 2016/0338617 A1 | 11/2016 | Ashe et al. |
| 2016/0338644 A1 | 11/2016 | Connor |
| 2016/0340691 A1 | 11/2016 | Minshull et al. |
| 2016/0344738 A1 | 11/2016 | Dotan et al. |
| 2016/0345260 A1 | 11/2016 | Johnson et al. |
| 2016/0352768 A1 | 12/2016 | Lefebvre et al. |
| 2016/0353294 A1 | 12/2016 | Wang et al. |
| 2016/0355886 A1 | 12/2016 | Tan et al. |
| 2016/0356665 A1 | 12/2016 | Felemban et al. |
| 2016/0356666 A1 | 12/2016 | Bilal et al. |
| 2016/0359683 A1 | 12/2016 | Bartfai-Walcott et al. |
| 2016/0371782 A1 | 12/2016 | Jones et al. |
| 2016/0372123 A1 | 12/2016 | Kjoerling et al. |
| 2016/0378427 A1 | 12/2016 | Sharma et al. |
| 2016/0378942 A1 | 12/2016 | Srinivas et al. |
| 2017/0004409 A1 | 1/2017 | Chu et al. |
| 2017/0006135 A1 | 1/2017 | Siebel et al. |
| 2017/0006140 A1 | 1/2017 | Park et al. |
| 2017/0007574 A1 | 1/2017 | Spencer et al. |
| 2017/0009295 A1 | 1/2017 | Rigoutsos et al. |
| 2017/0013533 A1 | 1/2017 | Felemban et al. |
| 2017/0014032 A1 | 1/2017 | Khair |
| 2017/0014108 A1 | 1/2017 | Mazurowski |
| 2017/0016896 A1 | 1/2017 | Eastman et al. |
| 2017/0017904 A1 | 1/2017 | Heng et al. |
| 2017/0021204 A1 | 1/2017 | Baek |
| 2017/0022563 A1 | 1/2017 | Iakoubova et al. |
| 2017/0022564 A1 | 1/2017 | Begovich et al. |
| 2017/0027940 A1 | 2/2017 | Peeper et al. |
| 2017/0028006 A1 | 2/2017 | Ricard et al. |
| 2017/0029888 A1 | 2/2017 | Cargill et al. |
| 2017/0029889 A1 | 2/2017 | Cargill et al. |
| 2017/0032100 A1 | 2/2017 | Shaked et al. |
| 2017/0035011 A1 | 2/2017 | Grob et al. |
| 2017/0037470 A1 | 2/2017 | Kirkpatrick et al. |
| 2017/0046347 A1 | 2/2017 | Zhou et al. |
| 2017/0046499 A1 | 2/2017 | Hu et al. |
| 2017/0046615 A1 | 2/2017 | Schupp-Omid et al. |
| 2017/0051019 A1 | 2/2017 | Bunnik et al. |
| 2017/0051359 A1 | 2/2017 | Pegtel et al. |
| 2017/0052945 A1 | 2/2017 | Takeuchi et al. |
| 2017/0056468 A1 | 3/2017 | Eisenbud et al. |
| 2017/0061073 A1 | 3/2017 | Sadhasivam |
| 2017/0067121 A1 | 3/2017 | Kelsey et al. |
| 2017/0068795 A1 | 3/2017 | Liu et al. |
| 2017/0071884 A1 | 3/2017 | Page et al. |
| 2017/0072851 A1 | 3/2017 | Shenoy et al. |
| 2017/0073756 A1 | 3/2017 | Jensen et al. |
| 2017/0074878 A1 | 3/2017 | Oberoi et al. |
| 2017/0076209 A1 | 3/2017 | Sisk et al. |
| 2017/0076303 A1 | 3/2017 | Pickton et al. |
| 2017/0078400 A1 | 3/2017 | Binder et al. |
| 2017/0088900 A1 | 3/2017 | Anjamshoaa et al. |
| 2017/0091673 A1 | 3/2017 | Gupta et al. |
| 2017/0097347 A1 | 4/2017 | Eastman et al. |
| 2017/0098240 A1 | 4/2017 | Yang et al. |
| 2017/0098257 A1 | 4/2017 | Keller |
| 2017/0098278 A1 | 4/2017 | Carges et al. |
| 2017/0099836 A1 | 4/2017 | Bruck et al. |
| 2017/0100446 A1 | 4/2017 | Clarot et al. |
| 2017/0103190 A1 | 4/2017 | Abraham et al. |
| 2017/0105004 A1 | 4/2017 | Chen et al. |
| 2017/0105005 A1 | 4/2017 | Chen et al. |
| 2017/0106178 A1 | 4/2017 | Altschul et al. |
| 2017/0107583 A1 | 4/2017 | Black et al. |
| 2017/0108502 A1 | 4/2017 | Mulvihill et al. |
| 2017/0112792 A1 | 4/2017 | Lu et al. |
| 2017/0116383 A1 | 4/2017 | Ziavras et al. |
| 2017/0116624 A1 | 4/2017 | Moore et al. |
| 2017/0116653 A1 | 4/2017 | Smith et al. |
| 2017/0117064 A1 | 4/2017 | Lepine et al. |
| 2017/0119662 A1 | 5/2017 | Maisel et al. |
| 2017/0124520 A1 | 5/2017 | Chakra et al. |
| 2017/0124528 A1 | 5/2017 | Chakra et al. |
| 2017/0126009 A1 | 5/2017 | Chen et al. |
| 2017/0126332 A1 | 5/2017 | Biswas et al. |
| 2017/0127110 A1 | 5/2017 | Chaar et al. |
| 2017/0127180 A1 | 5/2017 | Shields et al. |
| 2017/0132537 A1 | 5/2017 | Chavez |
| 2017/0135041 A1 | 5/2017 | Miller et al. |
| 2017/0135647 A1 | 5/2017 | Morris et al. |
| 2017/0137879 A1 | 5/2017 | Narain et al. |
| 2017/0140122 A1 | 5/2017 | Kupfer et al. |
| 2017/0140424 A9 | 5/2017 | Canny et al. |
| 2017/0145503 A1 | 5/2017 | Schrodi et al. |
| 2017/0151217 A1 | 6/2017 | Sarpotdar et al. |
| 2017/0151964 A1 | 6/2017 | Kim et al. |
| 2017/0156344 A1 | 6/2017 | Wakefield |
| 2017/0157249 A1 | 6/2017 | Kupper et al. |
| 2017/0159045 A1 | 6/2017 | Serber et al. |
| 2017/0159138 A1 | 6/2017 | Tarcic et al. |
| 2017/0167287 A1 | 6/2017 | Jacobs et al. |
| 2017/0168070 A1 | 6/2017 | Oberoi et al. |
| 2017/0169912 A1 | 6/2017 | Gogotsi et al. |
| 2017/0171807 A1 | 6/2017 | Noh et al. |
| 2017/0171889 A1 | 6/2017 | Biswas et al. |
| 2017/0172472 A1 | 6/2017 | Wedekind et al. |

(56) References Cited

U.S. PATENT DOCUMENTS

| | | |
|---|---|---|
| 2017/0172473 A1 | 6/2017 | Wedekind et al. |
| 2017/0173262 A1 | 6/2017 | Veltz |
| 2017/0177435 A1 | 6/2017 | Chattha et al. |
| 2017/0177542 A1 | 6/2017 | Chattha et al. |
| 2017/0177813 A1 | 6/2017 | Yao et al. |
| 2017/0180214 A1 | 6/2017 | Azevedo et al. |
| 2017/0180798 A1 | 6/2017 | Goli et al. |
| 2017/0181098 A1 | 6/2017 | Shinohara |
| 2017/0181628 A1 | 6/2017 | Burnette et al. |
| 2017/0183243 A1 | 6/2017 | Reitmeyer et al. |
| 2017/0191134 A1 | 7/2017 | Gudmundsson et al. |
| 2017/0193647 A1 | 7/2017 | Huang et al. |
| 2017/0195823 A1 | 7/2017 | Shinohara |
| 2017/0196481 A1 | 7/2017 | Rundell et al. |
| 2017/0199845 A1 | 7/2017 | Azar et al. |
| 2017/0201297 A1 | 7/2017 | Stratigos |
| 2017/0213345 A1 | 7/2017 | Eslami et al. |
| 2017/0214799 A1 | 7/2017 | Perez et al. |
| 2017/0217018 A1 | 8/2017 | Skrinde |
| 2017/0219451 A1 | 8/2017 | Chaudhary et al. |
| 2017/0222753 A1 | 8/2017 | Angelopoulos et al. |
| 2017/0223653 A1 | 8/2017 | Weitnauer et al. |
| 2017/0224268 A1 | 8/2017 | Altini et al. |
| 2017/0226164 A1 | 8/2017 | Izum et al. |
| 2017/0228810 A1 | 8/2017 | Shang et al. |
| 2017/0228998 A1 | 8/2017 | Fu et al. |
| 2017/0231221 A1 | 8/2017 | Iatrou et al. |
| 2017/0233809 A1 | 8/2017 | Hackney et al. |
| 2017/0233815 A1 | 8/2017 | Timmons |
| 2017/0235894 A1 | 8/2017 | Cox et al. |
| 2017/0236060 A1 | 8/2017 | Ignatyev |
| 2017/0238850 A1 | 8/2017 | Gonzales et al. |
| 2017/0238879 A1 | 8/2017 | Ducreux |
| 2017/0242972 A1 | 8/2017 | Hu et al. |
| 2017/0244777 A1 | 8/2017 | Ouyang et al. |
| 2017/0246963 A1 | 8/2017 | Lee et al. |
| 2017/0247673 A1 | 8/2017 | Isaksen |
| 2017/0002625 A1 | 9/2017 | Beim et al. |
| 2017/0002705 A1 | 9/2017 | Esposito et al. |
| 2017/0255888 A1 | 9/2017 | McCord et al. |
| 2017/0255945 A1 | 9/2017 | McCord et al. |
| 2017/0259050 A1 | 9/2017 | Altschul et al. |
| 2017/0259178 A1 | 9/2017 | Aghdaie et al. |
| 2017/0259942 A1 | 9/2017 | Ziarno |
| 2017/0261645 A1 | 9/2017 | Kleeman et al. |
| 2017/0264805 A1 | 9/2017 | Athan |
| 2017/0265044 A1 | 9/2017 | Lundsgaard et al. |
| 2017/0268066 A1 | 9/2017 | Gatto et al. |
| 2017/0268954 A1 | 9/2017 | Ocalan |
| 2017/0276655 A1 | 9/2017 | Li |
| 2017/0280717 A1 | 10/2017 | Bedoukian et al. |
| 2017/0281092 A1 | 10/2017 | Burnette et al. |
| 2017/0281747 A1 | 10/2017 | Bunnik et al. |
| 2017/0284839 A1 | 10/2017 | Ojala |
| 2017/0286594 A1 | 10/2017 | Reid et al. |
| 2017/0286608 A1 | 10/2017 | Srinivas et al. |
| 2017/0286838 A1 | 10/2017 | Cipriani et al. |
| 2017/0287522 A1 | 10/2017 | Imao |
| 2017/0289323 A1 | 10/2017 | Gelvin et al. |
| 2017/0289812 A1 | 10/2017 | Werb |
| 2017/0290024 A1 | 10/2017 | Ouyang et al. |
| 2017/0292159 A1 | 10/2017 | Shiffman et al. |
| 2017/0295503 A1 | 10/2017 | Govindaraju et al. |
| 2017/0296104 A1 | 10/2017 | Ryan et al. |
| 2017/0298126 A1 | 10/2017 | Baum et al. |
| 2017/0300814 A1 | 10/2017 | Shaked et al. |
| 2017/0300824 A1 | 10/2017 | Peng et al. |
| 2017/0301017 A1 | 10/2017 | Magdelinic et al. |
| 2017/0302756 A1 | 10/2017 | Chou et al. |
| 2017/0304248 A1 | 10/2017 | Puder et al. |
| 2017/0306745 A1 | 10/2017 | Harding et al. |
| 2017/0308672 A1 | 10/2017 | Martin et al. |
| 2017/0308846 A1 | 10/2017 | de Mars et al. |
| 2017/0310697 A1 | 10/2017 | Lefebvre et al. |
| 2017/0310972 A1 | 10/2017 | Wang et al. |
| 2017/0310974 A1 | 10/2017 | Guleryuz et al. |
| 2017/0311895 A1 | 11/2017 | Sereno et al. |
| 2017/0312289 A1 | 11/2017 | Dugan Stocks et al. |
| 2017/0312315 A1 | 11/2017 | Braughuer et al. |
| 2017/0316150 A1 | 11/2017 | Deciu et al. |
| 2017/0322928 A1 | 11/2017 | Gotchev et al. |
| 2017/0330431 A1 | 11/2017 | Wedig et al. |
| 2017/0331899 A1 | 11/2017 | Binder et al. |
| 2017/0337711 A1 | 11/2017 | Ratner et al. |
| 2017/0344554 A1 | 11/2017 | Ha et al. |
| 2017/0344555 A1 | 11/2017 | Yan et al. |
| 2017/0344556 A1 | 11/2017 | Wu et al. |
| 2017/0344954 A1 | 11/2017 | Xu et al. |
| 2017/0346609 A1 | 11/2017 | Li et al. |
| 2017/0347242 A1 | 11/2017 | Ching et al. |
| 2017/0347297 A1 | 11/2017 | Li et al. |
| 2017/0350705 A1 | 12/2017 | D'Alberto et al. |
| 2017/0351689 A1 | 12/2017 | Vasudevan et al. |
| 2017/0351806 A1 | 12/2017 | Beim |
| 2017/0351811 A1 | 12/2017 | Zhao et al. |
| 2017/0353825 A1 | 12/2017 | D'Alberto et al. |
| 2017/0353826 A1 | 12/2017 | D'Alberto et al. |
| 2017/0353827 A1 | 12/2017 | D'Alberto et al. |
| 2017/0353865 A1 | 12/2017 | Li et al. |
| 2017/0353941 A1 | 12/2017 | D'Alberto et al. |
| 2017/0359584 A1 | 12/2017 | Said et al. |
| 2017/0363738 A1 | 12/2017 | Kaino |
| 2017/0364596 A1 | 12/2017 | Wu et al. |
| 2017/0364817 A1 | 12/2017 | Raykov et al. |
| 2017/0369534 A1 | 12/2017 | Bunnik et al. |
| 2017/0374521 A1 | 12/2017 | Zhyshko et al. |
| 2017/0374619 A1 | 12/2017 | San Vicente et al. |
| 2018/0000102 A1 | 1/2018 | Jackson et al. |
| 2018/0003722 A1 | 1/2018 | Tseng et al. |
| 2018/0005149 A1 | 1/2018 | Dhingra |
| 2018/0006957 A1 | 1/2018 | Ouyang et al. |
| 2018/0010136 A1 | 1/2018 | Hunt et al. |
| 2018/0010185 A1 | 1/2018 | Ebert et al. |
| 2018/0010197 A1 | 1/2018 | Beane-Ebel et al. |
| 2018/0010198 A1 | 1/2018 | Anjamshoaa et al. |
| 2018/0011110 A1 | 1/2018 | Landi et al. |
| 2018/0014771 A1 | 1/2018 | Merchant-Borna et al. |
| 2018/0017392 A1 | 1/2018 | Claudel et al. |
| 2018/0017545 A1 | 1/2018 | Hisamatsu et al. |
| 2018/0017564 A1 | 1/2018 | Sanada et al. |
| 2018/0017570 A1 | 1/2018 | Arashida et al. |
| 2018/0018683 A1 | 1/2018 | Yee et al. |
| 2018/0019862 A1 | 1/2018 | Kliewer et al. |
| 2018/0020951 A1 | 1/2018 | Kaifosh et al. |
| 2018/0021279 A1 | 1/2018 | Hamilton-Reeves et al. |
| 2018/0024029 A1 | 1/2018 | Ota et al. |
| 2018/0031589 A1 | 2/2018 | Tamezane et al. |
| 2018/0032876 A1 | 2/2018 | Altshuller et al. |
| 2018/0032938 A1 | 2/2018 | Scriffignano et al. |
| 2018/0033088 A1 | 2/2018 | Besman et al. |
| 2018/0034912 A1 | 2/2018 | Binder et al. |
| 2018/0035605 A1 | 2/2018 | Guan et al. |
| 2018/0038994 A1 | 2/2018 | Hamann et al. |
| 2018/0039316 A1 | 2/2018 | Brown et al. |
| 2018/0046926 A1 | 2/2018 | Achin et al. |
| 2018/0049636 A1 | 2/2018 | Miller et al. |
| 2018/0049638 A1 | 2/2018 | Ewers et al. |
| 2018/0051344 A1 | 2/2018 | Barreto et al. |
| 2018/0058202 A1 | 3/2018 | Disko et al. |
| 2018/0060458 A1 | 3/2018 | Zhao et al. |
| 2018/0060513 A1 | 3/2018 | Tang et al. |
| 2018/0060738 A1 | 3/2018 | Achin et al. |
| 2018/0060744 A1 | 3/2018 | Achin et al. |
| 2018/0062941 A1 | 3/2018 | Brown et al. |
| 2018/0064666 A1 | 3/2018 | Lu et al. |
| 2018/0067010 A1 | 3/2018 | Kim et al. |
| 2018/0067118 A1 | 3/2018 | Kim et al. |
| 2018/0071285 A1 | 3/2018 | Palczewski et al. |
| 2018/0075357 A1 | 3/2018 | Subramanian et al. |
| 2018/0077146 A1 | 3/2018 | Lonas |
| 2018/0077663 A1 | 3/2018 | Davis et al. |
| 2018/0078605 A1 | 3/2018 | Spencer et al. |
| 2018/0078747 A1 | 3/2018 | Altschul et al. |
| 2018/0078748 A1 | 3/2018 | Altschul et al. |

(56) References Cited

U.S. PATENT DOCUMENTS

| | | |
|---|---|---|
| 2018/0080081 A1 | 3/2018 | Akoulitchev et al. |
| 2018/0085168 A1 | 3/2018 | Valdes et al. |
| 2018/0085355 A1 | 3/2018 | Abramovitch et al. |
| 2018/0087098 A1 | 3/2018 | Gregg |
| 2018/0089389 A1 | 3/2018 | Hu et al. |
| 2018/0093418 A1 | 4/2018 | Lappas et al. |
| 2018/0093419 A1 | 4/2018 | Lappas et al. |
| 2018/0094317 A1 | 4/2018 | Dudley, Jr. et al. |
| 2018/0095450 A1 | 4/2018 | Lappas et al. |
| 2018/0108431 A1 | 4/2018 | Beim et al. |
| 2018/0111051 A1 | 4/2018 | Xue et al. |
| 2018/0114128 A1 | 4/2018 | Libert et al. |
| 2018/0116987 A1 | 5/2018 | Singh et al. |
| 2018/0120133 A1 | 5/2018 | Blank et al. |
| 2018/0122020 A1 | 5/2018 | Blank et al. |
| 2018/0124181 A1 | 5/2018 | Binder et al. |
| 2018/0124407 A1 | 5/2018 | Bright-Thomas et al. |
| 2018/0128824 A1 | 5/2018 | Mani et al. |
| 2018/0129902 A1 | 5/2018 | Li |
| 2018/0132720 A1 | 5/2018 | Miller et al. |
| 2018/0132725 A1 | 5/2018 | Vogl et al. |
| 2018/0143986 A1 | 5/2018 | Sinha et al. |
| 2018/0148180 A1 | 5/2018 | Fagundes et al. |
| 2018/0148182 A1 | 5/2018 | Fagundes et al. |
| 2018/0148776 A1 | 5/2018 | Guo et al. |
| 2018/0157758 A1 | 6/2018 | Arrizabalaga et al. |
| 2018/0160982 A1 | 6/2018 | Laszlo et al. |
| 2018/0162549 A1 | 6/2018 | Ziarno |
| 2018/0164439 A1 | 6/2018 | Droz et al. |
| 2018/0166962 A1 | 6/2018 | Kim et al. |
| 2018/0170575 A1 | 6/2018 | Ziarno |
| 2018/0171407 A1 | 6/2018 | Schrodi et al. |
| 2018/0176556 A1 | 6/2018 | Zhao et al. |
| 2018/0176563 A1 | 6/2018 | Zhao et al. |
| 2018/0176582 A1 | 6/2018 | Zhao et al. |
| 2018/0181910 A1 | 6/2018 | Zhang et al. |
| 2018/0182116 A1 | 6/2018 | Rhoads |
| 2018/0182181 A1 | 6/2018 | Dolan et al. |
| 2018/0185519 A1 | 7/2018 | Dharmakumar et al. |
| 2018/0189564 A1 | 7/2018 | Freitag et al. |
| 2018/0191867 A1 | 7/2018 | Siebel et al. |
| 2018/0192936 A1 | 7/2018 | Widge et al. |
| 2018/0193652 A1 | 7/2018 | Srivastava et al. |
| 2018/0201948 A1 | 7/2018 | Gonzalez Morales et al. |
| 2018/0206489 A1 | 7/2018 | Plettner et al. |
| 2018/0207248 A1 | 7/2018 | Castex |
| 2018/0211677 A1 | 7/2018 | Klejsa et al. |
| 2018/0212787 A1 | 7/2018 | Lee et al. |
| 2018/0213348 A1 | 7/2018 | Natarajan et al. |
| 2018/0214404 A1 | 8/2018 | Rosenberg et al. |
| 2018/0216099 A1 | 8/2018 | Serber et al. |
| 2018/0216100 A1 | 8/2018 | Serber et al. |
| 2018/0216101 A1 | 8/2018 | Serber et al. |
| 2018/0216132 A1 | 8/2018 | Cong et al. |
| 2018/0216197 A1 | 8/2018 | Davicioni et al. |
| 2018/0217141 A1 | 8/2018 | Sasso |
| 2018/0217143 A1 | 8/2018 | Sasso et al. |
| 2018/0218117 A1 | 8/2018 | Beim et al. |
| 2018/0222388 A1 | 8/2018 | Shenoy et al. |
| 2018/0225585 A1 | 8/2018 | Dong et al. |
| 2018/0227930 A1 | 8/2018 | Ouyang et al. |
| 2018/0232421 A1 | 8/2018 | Dialani et al. |
| 2018/0232434 A1 | 8/2018 | Geyik et al. |
| 2018/0232661 A1 | 8/2018 | Li et al. |
| 2018/0232700 A1 | 8/2018 | Li et al. |
| 2018/0232702 A1 | 8/2018 | Dialani et al. |
| 2018/0232904 A1 | 8/2018 | Zakharevich et al. |
| 2018/0235549 A1 | 8/2018 | Sereno et al. |
| 2018/0236027 A1 | 8/2018 | Barriere et al. |
| 2018/0237825 A1 | 8/2018 | Ehrich et al. |
| 2018/0239829 A1 | 8/2018 | Dialani et al. |
| 2018/0240535 A1 | 8/2018 | Harper et al. |
| 2018/0245154 A1 | 8/2018 | Tsalik et al. |
| 2018/0246696 A1 | 8/2018 | Sharma et al. |
| 2018/0251819 A1 | 9/2018 | Pichaud et al. |
| 2018/0251842 A1 | 9/2018 | Iakoubova et al. |
| 2018/0254041 A1 | 9/2018 | Harper |
| 2018/0260515 A1 | 9/2018 | Narain et al. |
| 2018/0260717 A1 | 9/2018 | Li et al. |
| 2018/0262433 A1 | 9/2018 | Ouyang et al. |
| 2018/0263606 A1 | 9/2018 | Orringer et al. |
| 2018/0263962 A1 | 9/2018 | Sarpotdar et al. |
| 2018/0271980 A1 | 9/2018 | Altschul et al. |
| 2018/0275146 A1 | 9/2018 | Narain et al. |
| 2018/0275629 A1 | 9/2018 | Watanabe |
| 2018/0276325 A1 | 9/2018 | Polovick et al. |
| 2018/0276497 A1 | 9/2018 | Madabhushi et al. |
| 2018/0276498 A1 | 9/2018 | Madabhushi et al. |
| 2018/0276570 A1 | 9/2018 | Watanabe |
| 2018/0277146 A1 | 9/2018 | Chen et al. |
| 2018/0277250 A1 | 9/2018 | Garbett et al. |
| 2018/0278693 A1 | 9/2018 | Binder et al. |
| 2018/0278694 A1 | 9/2018 | Binder et al. |
| 2018/0002923 A1 | 10/2018 | Suthanthiran et al. |
| 2018/0282736 A1 | 10/2018 | Lyerly et al. |
| 2018/0285765 A1 | 10/2018 | Nandagopal et al. |
| 2018/0285900 A1 | 10/2018 | Bhattacharyya et al. |
| 2018/0291398 A1 | 10/2018 | Cong et al. |
| 2018/0291459 A1 | 10/2018 | Al-Deen Ashab et al. |
| 2018/0291474 A1 | 10/2018 | Miick et al. |
| 2018/0292412 A1 | 10/2018 | Wischhusen et al. |
| 2018/0293462 A1 | 10/2018 | Ambati et al. |
| 2018/0293501 A1 | 10/2018 | Ambati et al. |
| 2018/0293511 A1 | 10/2018 | Bouillet et al. |
| 2018/0293538 A1 | 10/2018 | Berger et al. |
| 2018/0293759 A1 | 10/2018 | Moore |
| 2018/0293778 A1 | 10/2018 | Appu et al. |
| 2018/0295375 A1 | 10/2018 | Ratner |
| 2018/0300333 A1 | 10/2018 | Wang et al. |
| 2018/0300639 A1 | 10/2018 | Abbas |
| 2018/0303354 A1 | 10/2018 | Li |
| 2018/0303906 A1 | 10/2018 | Caspi et al. |
| 2018/0305762 A1 | 10/2018 | Cargill et al. |
| 2018/0310529 A1 | 11/2018 | Funaya et al. |
| 2018/0312923 A1 | 11/2018 | Luke et al. |
| 2018/0312926 A9 | 11/2018 | Klee et al. |
| 2018/0314964 A1 | 11/2018 | Takano et al. |
| 2018/0315507 A1 | 11/2018 | Mortazavi et al. |
| 2018/0317140 A1 | 11/2018 | Zhang |
| 2018/0317794 A1 | 11/2018 | Mackellar et al. |
| 2018/0322203 A1 | 11/2018 | Zhang et al. |
| 2018/0323882 A1 | 11/2018 | Breton et al. |
| 2018/0326173 A1 | 11/2018 | Ewers et al. |
| 2018/0327740 A1 | 11/2018 | Gifford et al. |
| 2018/0327806 A1 | 11/2018 | Hung et al. |
| 2018/0327844 A1 | 11/2018 | Deciu et al. |
| 2018/0334721 A1 | 11/2018 | Narain et al. |
| 2018/0336534 A1 | 11/2018 | Kim |
| 2018/0338017 A1 | 11/2018 | Mekuria et al. |
| 2018/0338282 A1 | 11/2018 | San Vicente et al. |
| 2018/0340231 A1 | 11/2018 | LaFleur et al. |
| 2018/0340515 A1* | 11/2018 | Huyn ..................... F03D 7/028 |
| 2018/0341958 A1 | 11/2018 | Hanowell |
| 2018/0343304 A1 | 11/2018 | Binder et al. |
| 2018/0343482 A1 | 11/2018 | Loheide et al. |
| 2018/0344841 A1 | 12/2018 | Bunnik et al. |
| 2018/0349514 A1 | 12/2018 | Alzate Perez et al. |
| 2018/0353138 A1 | 12/2018 | Doheny et al. |
| 2018/0357361 A1 | 12/2018 | Frenkel et al. |
| 2018/0357362 A1 | 12/2018 | Frenkel et al. |
| 2018/0357529 A1 | 12/2018 | Song et al. |
| 2018/0357565 A1 | 12/2018 | Syed et al. |
| 2018/0357726 A1 | 12/2018 | Besman et al. |
| 2018/0358118 A1 | 12/2018 | Bagaev et al. |
| 2018/0358125 A1 | 12/2018 | Bagaev et al. |
| 2018/0358128 A1 | 12/2018 | Bagaev et al. |
| 2018/0358132 A1 | 12/2018 | Bagaev et al. |
| 2018/0359608 A1 | 12/2018 | Ching et al. |
| 2018/0360892 A1 | 12/2018 | Pamer et al. |
| 2018/0365521 A1 | 12/2018 | Dai et al. |
| 2018/0369238 A1 | 12/2018 | Anton et al. |
| 2018/0369696 A1 | 12/2018 | Aghdaie et al. |
| 2018/0371553 A1 | 12/2018 | Steelman et al. |
| 2018/0375743 A1* | 12/2018 | Lee ........................ H04L 29/08 |

(56) References Cited

U.S. PATENT DOCUMENTS

| | | | |
|---|---|---|---|
| 2018/0375940 A1 | 12/2018 | Binder et al. | |
| 2019/0000750 A1 | 1/2019 | Maisel et al. | |
| 2019/0001219 A1 | 1/2019 | Sardari et al. | |
| 2019/0004996 A1 | 1/2019 | Azar et al. | |
| 2019/0005586 A1 | 1/2019 | Lei et al. | |
| 2019/0010548 A1 | 1/2019 | Diatchenko et al. | |
| 2019/0010554 A1 | 1/2019 | Narain et al. | |
| 2019/0014587 A1 | 1/2019 | Zhang | |
| 2019/0015035 A1 | 1/2019 | Merfeld et al. | |
| 2019/0015622 A1 | 1/2019 | Ewers et al. | |
| 2019/0017117 A1 | 1/2019 | Barr et al. | |
| 2019/0017123 A1 | 1/2019 | Davicioni et al. | |
| 2019/0020530 A1 | 1/2019 | Au et al. | |
| 2019/0024174 A1 | 1/2019 | Begovich et al. | |
| 2019/0024497 A1 | 1/2019 | Harding et al. | |
| 2019/0032136 A1 | 1/2019 | Shiffman et al. | |
| 2019/0033078 A1 | 1/2019 | D'Alberto et al. | |
| 2019/0034473 A1 | 1/2019 | Jha et al. | |
| 2019/0034474 A1 | 1/2019 | Nandagopal et al. | |
| 2019/0036779 A1 | 1/2019 | Bajaj | |
| 2019/0036780 A1 | 1/2019 | Evans et al. | |
| 2019/0036801 A1 | 1/2019 | Natarajan et al. | |
| 2019/0036816 A1 | 1/2019 | Evans et al. | |
| 2019/0037558 A1 | 1/2019 | Zhang | |
| 2019/0057170 A1* | 2/2019 | Burriesci | G05B 17/02 |
| 2019/0339416 A1* | 11/2019 | Elkabetz | G01W 1/02 |
| 2019/0340534 A1* | 11/2019 | McMahan | G06N 7/005 |
| 2020/0193234 A1* | 6/2020 | Pai | G06N 20/00 |
| 2020/0225385 A1* | 7/2020 | O'Donncha | G01W 1/10 |

OTHER PUBLICATIONS

"File Compression Possibilities". A Brief guide to compress a file in 4 different ways. https://www.gadgetcouncil.com/compress-1GB-files-into-10-mb/.
Arcangel, Cory. "On Compression" (2013), 13 pages.
Baraniuk, R. G., "Compressive sensing [lecture notes]," IEEE, Signal Processing Magazine, vol. 24, No. 4, 2007, 9 pages.
Ben-Gal, I. (2005). "On the Use of Data Compression Measures to Analyze Robust Designs", 54 (3). IEEE Transactions on Reliability: 381-388.
Boyd, S.; Parikh, N.; Chu, E.; Peleato, B.; Eckstein, J. Distributed optimization and statistical learning via the alternating direction method of multipliers. Found. Trends Mach. Learn. 2011, 1-122.
Cai, J.F.; Candes, E.J.; Shen, Z.W. A singular value thresholding algorithm for matrix completion. SIAM J. Optim. 2010, 20, 1956-1982.
Caione, C.; Brunelli, D.; Benini, L. Distributed compressive sampling for lifetime optimization in dense wireless sensor networks. IEEE Trans. Ind. Inf. 2012, 8, 30-40.
Candes, E. J., M. B. Wakin, and S. P. Boyd, "Enhancing sparsity by reweighted 1 1 minimization," Journal of Fourier Analysis and Applications, vol. 14, No. 5-6, 2008, pp. 877-905.
Candes, E.J.; Recht, B. Exact matrix completion via convex optimization. Found. Comput. Math. 2009, 9, 717-772.
Candes, E.J.; Romberg, J.; Tao, T. Robust uncertainty principles: Exact signal reconstruction from highly incomplete frequency information. IEEE Trans. Inf. Theory 2006, 52.
CCITT Study Group VIII und die Joint Photographic Experts Group (JPEG) von ISO/IEC Joint Technical Committee 1/Subcommittee 29/Working Group 10 (1993), "Annex D—Arithmetic coding", in ITU-T, Recommendation T.81: Digital Compression and Coding of Continuous-tone Still images—Requirements and guidelines.
Cevher, V., A. Sankaranarayanan, M. F. Duarte, D. Reddy, R. G. Baraniuk, and R. Chellappa, "Compressive sensing forbackground subtraction," in Computer Vision—ECCV 2008. Springer, 2008, pp. 155-168.
Chanda P, Bader JS, Elhaik E; Elhaik; Bader (Jul. 27, 2012). "HapZipper: sharing HapMap populations just got easier", Nucleic Acids Research. 40 (20): e159. doi:10.1093/nar/gks709. PMC 3488212. PMID 22844100.
Charbiwala, Z., Y. Kim, S. Zahedi, J. Friedman, and M. B. Srivastava, "Energy efficient sampling for event detection in wireless sensor networks," in Proceedings of the 14th ACM/IEEE international symposium on Low power electronics and design. ACM, 2009, pp. 419-424.
Cheng, J.; Ye, Q.; Jiang, H.; Wang, D.; Wang, C. STCDG: An efficient data gathering algorithm based on matrix completion for wireless sensor networks. IEEE Trans. Wirel. Commun. 2013, 12, 850-861.
Christley S, Lu Y, Li C, Xie X; Lu; Li; Xie (Jan. 15, 2009). "Human genomes as email attachments". Bioinformatics. 25 (2): 274-5. doi:10.1093/bioinformatics/btn582. PMID 18996942.
Claude Elwood Shannon (1948), Alcatel-Lucent, ed., "A Mathematical Theory of Communication.", Bell System Technical Journal 27 (3-4).
Coalson, Josh. "FLAC Comparison," 5 pages.
Donoho, D. L., "Compressed sensing," IEEE Transactions on, Information Theory, vol. 52, No. 4, pp. 1289-1306, 2006.
en.wikipedia.org/wiki/Data_compression, 17 pages.
Gleichman, S.; Eldar, Y.C. "Blind Compressed Censing." IEEE Trans. Inf. Theory 2011, 57, 6958-6975.
Goel, S., and T. Imielinski, "Prediction-based monitoring in sensor networks: taking lessons from mpeg," ACM SIGCOMM Computer Communication Review, vol. 31, No. 5, pp. 82-98, 2001.
Goldstein, T.; O'Donoghue, B.; Setzer, S.; Baraniuk, R. Fast alternating direction optimization methods. SIAM J. Imaging Sci. 2014, 7, 1588-1623.
Golub, G.H.; Van Loan, C.F. Matrix Computations; JHU Press: Baltimore, MD, USA, 2013.
Grimes, C. A., "Design of a wireless sensor network for long-term, in-situ monitoring of an aqueous environment," Sensors, vol. 2, No. 11, pp. 455-472, 2002.
Heinzelman, W.R.; Chandrakasan, A.; Balakrishnan, H. Energy-efficient communication protocol for wireless microsensor networks. In Proceedings of the 33rd Annual Hawaii International Conference on System Siences, Maui, HI, USA, Jan. 4-7, 2000; p. 223.
Hilbert, Martin; López, Priscila (Apr. 1, 2011). "The World's Technological Capacity to Store, Communicate, and Compute Information". Science. 332 (6025): 60-65. Bibcode:2011Sci . . . 332 . . . 60H. doi:10.1126/science.1200970. PMID 21310967.
Hu, Y.; Zhang, D.; Ye, J.; Li, X.; He, X. Fast and accurate matrix completion via truncated nuclear norm regularization. IEEE Trans. Pattern Anal. Mach. Intell. 2013, 35, 2117-2130.
Huffman, David Albert (Sep. 1952), "A method for the construction of minimum-redundancy codes" (in German), Proceedings of the IRE 40 (9): pp. 1098-1101, doi:10.1109/JRPROC.1952.273898.
Kadkhodaie, M.; Christakopoulou, K.; Sanjabi, M.; Banerjee. A. Accelerated alternating direction method of multipliers. In Proceedings of the 21th ACM SIGKDD International Conference on Knowledge Discovery and Data Mining, Sydney, Australia, Aug. 10-13, 2015; pp. 497-506.
Kong, L.; Xia, M.; Liu, X.Y.; Chen, G.; Gu, Y.; Wu, M.Y.; Liu, X. Data loss and reconstruction in wireless sensor networks. IEEE Trans. Parallel Distrib. Syst. 2014, 25, 2818-2828.
Kong, L.; Xia, M.; Liu, X.Y.; Chen, G.; Gu, Y.; Wu, M.Y.; Liu, X. Supplemental Document—Data loss and reconstruction in wireless sensor networks. IEEE Trans. Parallel Distrib. Syst. 2014, 25, 2818-2828.
Korn, D.; et al. "RFC 3284: The VCDIFF Generic Differencing and Compression Data Format". Internet Engineering Task Force. (2002).
Korn, D.G.; Vo, K.P. (1995), B. Krishnamurthy, ed., Vdelta: Differencing and Compression, Practical Reusable Unix Software, New York: John Wiley & Sons, Inc.
Lachowski, R.; Pellenz, M.E.; Penna, M.C.; Jamhour, E.; Souza, R.D. An efficient distributed algorithm for constructing spanning trees in wireless sensor networks. Sensors 2015, 15, 1518-1536.
Lane, Tom. "JPEG Image Compression FAQ, Part 1". Internet FAQ Archives. Independent JPEG Group.
Li, S.X.; Gao, F.; Ge, G.N.; Zhang, S.Y. Deterministic construction of compressed sensing matrices via algebraic curves. IEEE Trans. Inf. Theory 2012, 58, 5035-5041.

(56) References Cited

OTHER PUBLICATIONS

Liu, X.Y.; Zhu, Y.; Kong, L.; Liu, C.; Gu, Y.; Vasilakos, A.V.; Wu, M.Y. CDC: Compressive data collection for wireless sensor networks. IEEE Trans. Parallel Distrib. Syst. 2015, 26, 2188-2197.

Liu, Y.; He, Y.; Li, M.; Wang, J.; Liu, K.; Li, X. Does wireless sensor network scale? A measurement study on GreenOrbs. IEEE Trans. Parallel Distrib. Syst. 2013, 24, 1983-1993.

Luo, C., F. Wu, J. Sun, and C. W. Chen, "Compressive data gathering for large-scale wireless sensor networks," ACM, Proceedings of the 15th annual international conference on Mobile computing and networking, pp. 145-156, 2009.

Luo, C., F. Wu, J. Sun, and C. W. Chen, "Efficient measurement generation and pervasive sparsity for compressive data gathering," Wireless Communications, IEEE Transactions on, vol. 9, No. 12, pp. 3728-3738, 2010.

Luo, C.; Wu, F.; Sun, J.; Chen, C.W. Compressive data gathering for large-scale wireless sensor networks. In Proceedings of the 15th ACM International Conference on Mobile Computing and Networking, Beijing, China, Sep. 20-25, 2009; pp. 145-156.

M. Hosseini, D. Pratas, and A. Pinho. 2016. A survey on data compression methods for biological sequences. Information 7(4):(2016): 56.

Mahdi, O.A.; Mohammed, M.A.; Mohamed, A.J. (Nov. 2012). "Implementing a Novel Approach an Convert Audio Compression to Text Coding via Hybrid Technique". International Journal of Computer Science Issues. 9 (6, No. 3): 53-59.

Mahmud, Salauddin (Mar. 2012). "An Improved Data Compression Method for General Data". International Journal of Scientific & Engineering Research. 3(3):2.

Mahoney, Matt. "Rationale for a Large Text Compression Benchmark". Florida Institute of Technology. (2006) cs.fit.edu/mmahoney/compression/rationale.htm.

Marak, Laszlo. "On image compression" University of Marne la Vallee (2013).

Mittal, S.; Vetter, J. (2015), "A Survey Of Architectural Approaches for Data Compression in Cache and Main Memory Systems", IEEE Transactions on Parallel and Distributed Systems, IEEE.

Navqi, Saud; Naqvi, R.; Riaz, R.A.; Siddiqui, F. (Apr. 2011). "Optimized RTL design and implementation of LZW algorithm for high bandwidth applications" Electrical Review. 2011 (4): 279-285.

Pavlichin DS, Weissman T, Yona G; Weissman; Yona (Sep. 2013). "The human genome contracts again". Bioinformatics. 29 (17): 2199-202. doi:10.1093/bioinformatics/btt362. PMID 23793748.

Pujar, J.H.; Kadlaskar, L.M. (May 2010). "A New Lossless Method of Image Compression and Decompression Using Huffman Coding Techniques" Journal of Theoretical and Applied Information Technology. 15 (1): 18-23.

Roughan, M.; Zhang, Y.; Willinger, W.; Qiu, L.L. Spatio-temporal compressive sensing and internet traffic matrices. IEEE ACM Trans. Netw. 2012, 20, 662-676.

Scully, D.; Carla E. Brodley (2006). "Compression and machine learning: A new perspective on feature space vectors" Data Compression Conference, 2006.

Shmilovici A.; Kahiri Y.; Ben-Gal I.; Hauser S. (2009). "Measuring the Efficiency of the Intraday Forex Market with a Universal Data Compression Algorithm" 33(2). Computational Economics: 131-154.

Shuman, D.I.; Narang, S.K.; Frossard, P.; Ortega, A.; Vandergheynst, P. The emerging field of signal processing on graphs: Extending high-dimensional data analysis to networks and other irregular domains. IEEE Signal Process. Mag. 2013, 30, 83-98.

Sullivan, G. J.; Ohm, J.-R.; Han, W.-J.; Wiegand, T., (Dec. 2012). "Overview of the High Efficiency Video Coding (HEVC) Standard" IEEE Transactions on Circuits and Systems for Video Technology. IEEE. 22 (12).

Toh, K.C.; Yun, S. An accelerated proximal gradient algorithm for nuclear norm regularized linear least squares problems. Pac. J. Optim. 2010, 6, 615-640.

Wang, Donghao, Wan, Jiangwen, Nie, Zhipeng, Zhang, Qiang, and Fei, Zhijie, "Efficient Data Gathering Methods in Wireless Sensor Networks Using GBTR Matrix Completion", Sensors 2016, 16(9), 1532; doi:10.3390/s1601532.

Wolfram, Stephen (2002). A New Kind of Science. Wolfram Media, Inc. p. 1069. ISBN 1-57955-008-8.

Xiang, L., J. Luo, C. Deng, A. V. Vasilakos, and W. Lin, "Dual-level compressed aggregation: Recovering fields of physical quantities from incomplete sensory data," arXiv preprint arXiv:1107.4873, 2011.

Xiang, L.; Luo, J.; Rosenberg, C. Compressed data aggregation: Energy-efficient and high-fidelity data collection. IEEE Acm Trans. Netw. 2013, 21, 1722-1735.

Yoon, S.; Shahabi, C. The Clustered AGgregation (CAG) technique leveraging spatial and temporal correlations in wireless sensor networks. ACM Trans. Sens. Netw. 2007, 3, 3.

Zhang Z., and B. D. Rao, "Sparse signal recovery with temporally correlated source vectors using sparse bayesian learning," IEEE Journal of Selected Topics in Signal Processing, vol. 5, pp. 912-926, 2011.

Zheng, H., S. Xiao, X. Wang, and X. Tian, "Energy and latency analysis for in-network computation with compressive sensing in wireless sensor networks," INFOCOM, pp. 2811-2815, 2012.

Breiman, Leo (Aug. 1996). "Bagging predictors". Machine Learning. 24 (2): 123-140. doi:10.1007/bf00058655.

Jeffrey H. Altschul, Lynne Sebastian, and Kurt Heidelberg, "Predictive Modeling in the Military: Similar Goals, Divergent Paths", Preservation Research Series 1, SRI Foundation, 2004.

forteconsultancy.wordpress.com/2010/05/17/wondering-what-lies-ahead-the-power-of-predictive-modeling/.

"Hospital Uses Data Analytics and Predictive Modeling To Identify and Allocate Scarce Resources to High-Risk Patients, Leading to Fewer Readmissions". Agency for Healthcare Research and Quality. Jan. 29, 2014, Retrieved Jan. 29, 2014.

Banerjee. Imon. "Probabilistic Prognostic Estimates of Survival in Metastatic Cancer Patients (PPES-Met) Utilizing Free-Text Clinical Narratives". Scientific Reports. 8 (10037 (2018)). doi:10.1038/s41598-018-27946-5.

"Implementing Predictive Modeling in R for Algorithmic Trading". Oct. 7, 2016. Retrieved Nov. 25, 2016.

"Predictive-Model Based Trading Systems, Part 1—System Trader Success". System Trader Success. Jul. 22, 2013. Retrieved Nov. 25, 2016.

Augustin, N.H.; Sauleau, E-A; Wood, S.N. (2012). "On quantile quantile plots for generalized linear models". Computational Statistics and Data Analysis. 56: 2404-2409. doi:10.1016/j.csda.2012.01.026.

Brian Junker (Mar. 22, 2010). "Additive models and cross-validation".

Fahrmeier, L.; Lang, S. (2001). "Bayesian Inference for Generalized Additive Mixed Models based on Markov Random Field Priors". Journal of the Royal Statistical Society, Series C. 50: 201-220.

Greven, Sonja; Kneib, Thomas (2010). "On the behaviour of marginal and conditional AIC in linear mixed models". Biometrika. 97: 773-789, doi:10.1093/biomet/asq042.

Gu, C.; Wahba, G. (1991). "Minimizing GCV/GML scores with multiple smoothing parameters via the Newton method". SIAM Journal on Scientific and Statistical Computing. 12. pp. 383-398.

Kim, Y.J.; Gu, C. (2004). "Smoothing spline Gaussian regression: more scalable computation via efficient approximation". Journal of the Royal Statistical Society, Series B. 66. pp. 337-356.

Marra, G.; Wood, S.N. (2012). "Coverage properties of confidence intervals for generalized additive model components". Scandinavian Journal of Statistics. 39: 53-74. doi:10.1111/j.1467-9469.2011.00760.x.

Nelder, John; Wedderburn, Robert (1972). "Generalized Linear Models". Journal of the Royal Statistical Society. Series A (General). Blackwell Publishing. 135 (3): 370-384. doi:10.2307/2344614. JSTOR 2344614.

Reiss, P.T.; Ogden, T.R. (2009). "Smoothing parameter selection for a class of semiparametric linear models". Journal of the Royal Statistical Society, Series B. 71: 505-523. doi:10.1111/j.1467-9868.2008.00695.x.

(56) References Cited

OTHER PUBLICATIONS

Rigby, R.A.; Stasinopoulos, D.M. (2005). "Generalized additive models for location, scale and shape (with discussion)". Journal of the Royal Statistical Society, Series C. 54: 507-554. doi:10.1111/j.1467-9876.2005.00510.x.

Rue, H.; Martino, Sara; Chopin, Nicolas (2009). "Approximate Bayesian inference for latent Gaussian models by using integrated nested Laplace approximations (with discussion)". Journal of the Royal Statistical Society, Series B. 71: 319-392. doi:10.1111/j.1467-9868.2008.00700.x.

Schmid, M.; Hothorn, T. (2008). "Boosting additive models using component-wise P-splines". Computational Statistics and Data Analysis. 53: 298-311. doi:10.1016/j.csda.2008.09.009.

Senn, Stephen (2003). "A conversation with John Nelder". Statistical Science. 18 (1): 118-131. doi:10.1214/ss/1056397489.

Silverman, B.W. (1985). "Some Aspects of the Spline Smoothing Approach to Non-Parametric Regression Curve Fitting (with discussion)". Journal of the Royal Statistical Society, Series B. 47. pp. 1-53.

Umlauf, Nikolaus; Adler, Daniel; Kneib, Thomas; Lang, Stefan; Zeileis, Achim. "Structured Additive Regression Models: An R Interface to BayesX". Journal of Statistical Software. 63 (21): 1-46.

Wahba, G. (1983). "Bayesian Confidence Intervals for the Cross Validated Smoothing Spline". Journal of the Royal Statistical Society, Series B. 45. pp. 133-150.

Wood, S. N. (2000). "Modelling and smoothing parameter estimation with multiple quadratic penalties". Journal of the Royal Statistical Society. Series B. 62 (2): 413-428. doi:10.1111/1467-9868.00240.

Wood, S. N.; Pya, N.; Saefken, B. (2016). "Smoothing parameter and model selection for general smooth models (with discussion)". Journal of the American Statistical Association. 111: 1548-1575. doi:10.1080/01621459.2016.1180986.

Wood, S.N. (2011). "Fast stable restricted maximum likelihood and marginal likelihood estimation of semiparametric generalized linear models". Journal of the Royal Statistical Society, Series B. 73: 3-36.

Wood, Simon N. (2008). "Fast stable direct fitting and smoothness selection for generalized additive models". Journal of the Royal Statistical Society, Series B. 70 (3): 495-518. arXiv:0709.3906. doi:10.1111/j.1467-9868.2007.00646.x.

Zeger, Scott L.; Liang, Kung-Yee; Albert, Paul S. (1988). "Models for Longitudinal Data: A Generalized Estimating Equation Approach". Biometrics. International Biometric Society. 44 (4): 1049-1060. doi:10.2307/2531734. JSTOR 2531734. PMID 3233245.

International Search Report and Written Opinion, dated Apr. 23, 2020 for International Application PCT/US20/15698, 13 pages.

Nasir Ahmed, T. Natarajan, Kamisetty Ramamohan Rao (Jan. 1974), "Discrete Cosine Transform" (in German), IEEE Transactions on Computers C-23 (1): pp. 90-93, doi:10.1109/T-C.1974.223784.

Graphics & Media Lab Video Group (2007), "Lossless Video Codecs Comparison, 2007," Moscow State University, Mar. 2007, CS MSU Graphics & Media Lab, 131 pages.

\* cited by examiner

DATA COMPRESSION AND COMMUNICATION USING MACHINE LEARNING

CROSS-REFERENCE TO RELATED APPLICATIONS

This Application claims the benefit of provisional U.S. Application No. 62/813,664, filed Mar. 4, 2019 and entitled "SYSTEM AND METHOD FOR DATA COMPRESSION AND PRIVATE COMMUNICATION OF MACHINE DATA BETWEEN COMPUTERS USING MACHINE LEARNING," which is hereby incorporated by reference in its entirety.

BACKGROUND

Technical Field

The present disclosure relates to the field of data compression, and more particularly to lossy compression of data based on statistical properties, e.g., for storage and communication of sensor data.

Description of the Related Art

In order to continuously transfer machine data time series between computers (e.g., from an edge device that is collecting one or more machine's data and sending to one or more cloud servers) one computer typically transfers all of the sensor data values collected from the machine(s) at each timestamp along with timestamp data and optionally position data (e.g., GPS location) or other context information, to another computer, which may be in the cloud. This communication burden is one of the main challenges in Internet of things (IoT) data transfer, due of the cost of transferring the large volume of data. Further, latency may increase and communication reliability may decrease with increasing data volume.

The process of reducing the size of a data file is often referred to as data compression. In the context of data transmission, it is called source coding; encoding done at the source of the data before it is stored or transmitted.

In signal processing, data compression, source coding, or bit-rate reduction typically involves encoding information using fewer bits than the original representation. Compression can be either lossy or lossless. Lossless compression reduces bits by identifying and eliminating redundancy. This reduction may be deterministic, i.e., reduction in bits is assured, or statistical, i.e., a particular type of redundancy reduction under most circumstances leads to a net reduction in bit required for encoding. No information is lost in lossless compression.

Lossless data compression algorithms usually exploit statistical redundancy to represent data without losing any information, so that the process is reversible. Lossless compression relies on the fact that real world data typically has redundancy (lack of entropy). Therefore, by reencoding the data to increase the entropy of the expression, the amount of data (bits) may be reduced. The Lempel-Ziv (LZ) compression methods employ run-length encoding. For most LZ methods, a table of previous strings is generated dynamically from earlier data in the input. The table itself is often Huffman encoded. Grammar-based codes like this can compress highly repetitive input extremely effectively, for instance, a biological data collection of the same or closely related species, a huge versioned document collection, internet archival, etc. The basic task of grammar-based codes is constructing a context-free grammar deriving a single string. Other practical grammar compression algorithms include Sequitur and Re-Pair.

Some lossless compressors use probabilistic models, such as prediction by partial matching. The Burrows-Wheeler transform can also be viewed as an indirect form of statistical modeling. In a further refinement of the direct use of probabilistic modeling, statistical estimates can be coupled to an algorithm called arithmetic coding, which uses the mathematical calculations of a finite-state machine to produce a string of encoded bits from a series of input data symbols. It uses an internal memory state to avoid the need to perform a one-to-one mapping of individual input symbols to distinct representations that use an integer number of bits, and it clears out the internal memory only after encoding the entire string of data symbols. Arithmetic coding applies especially well to adaptive data compression tasks where the statistics vary and are context-dependent, as it can be easily coupled with an adaptive model of the probability distribution of the input data.

Lossy compression typically reduces the number of bits by removing unnecessary or less important information. This can involve predicting which signal aspects may be considered noise, and/or which signal aspects have low importance for the ultimate use of the data. Lossy data compression is, in one aspect, the converse of lossless data compression, which loses information. However, subject to loss of information, the techniques of lossless compression may also be employed with lossy data compression.

There is a close connection between machine learning and compression: a system that predicts the posterior probabilities of a sequence given its entire history can be used for optimal data compression (by using arithmetic coding on the output distribution) while an optimal compressor can be used for prediction (by finding the symbol that compresses best, given the previous history).

Compression algorithms can implicitly map strings into implicit feature space vectors, and compression-based similarity measures used to compute similarity within these feature spaces. For each compressor C(.) we define an associated vector space ж, such that C(.) maps an input string x, corresponds to the vector norm ||~x||.

In lossless compression, and typically lossy compression as well, information redundancy is reduced, using methods such as coding, pattern recognition, and linear prediction to reduce the amount of information used to represent the uncompressed data. Due to the nature of lossy algorithms, quality suffers when a file is decompressed and recompressed (digital generation loss). (Lossless compression may be achieved through loss of non-redundant information, so increase in entropy is not assured.)

In lossy compression, the lost information is, or is treated as, noise. One way to filter noise is to transform the data to a representation where the supposed signal is concentrated in regions of the data space, to form a sparse distribution. The sparse regions of the distribution may be truncated, e.g., by applying a threshold, and the remaining dense regions of the distribution may be further transformed or encoded. Multiple different methods may be employed, to reduce noise based on different criteria.

See, U.S. Pat. Nos. 10,003,794; 10,028,706; 10,032,309; 10,063,861; 10,091,512; 5,243,546; 5,486,762; 5,515,477; 5,561,421; 5,659,362; 6,081,211; 6,219,457; 6,223,162; 6,300,888; 6,356,363; 6,362,756; 6,389,389; 6,404,925; 6,404,932; 6,490,373; 6,510,250; 6,606,037; 6,664,902; 6,671,414; 6,675,185; 6,678,423; 6,751,354; 6,757,439;

6,760,480; 6,774,917; 6,795,506; 6,801,668; 6,832,006; 6,839,003; 6,895,101; 6,895,121; 6,927,710; 6,941,019; 7,006,568; 7,050,646; 7,068,641; 7,099,523; 7,126,500; 7,146,053; 7,246,314; 7,266,661; 7,298,925; 7,336,720; 7,474,805; 7,483,871; 7,504,970; 7,518,538; 7,532,763; 7,538,697; 7,564,383; 7,578,793; 7,605,721; 7,612,692; 7,629,901; 7,630,563; 7,645,984; 7,646,814; 7,660,295; 7,660,355; 7,719,448; 7,743,309; 7,821,426; 7,881,544; 7,885,988; 7,936,932; 7,961,959; 7,961,960; 7,970,216; 7,974,478; 8,005,140; 8,017,908; 8,112,624; 8,160,136; 8,175,403; 8,178,834; 8,185,316; 8,204,224; 8,238,290; 8,270,745; 8,306,340; 8,331,441; 8,374,451; 8,411,742; 8,458,457; 8,480,110; 8,509,555; 8,540,644; 8,644,171; 8,694,474; 8,718,140; 8,731,052; 8,766,172; 8,964,727; 9,035,807; 9,111,333; 9,179,147; 9,179,161; 9,339,202; 9,478,224; 9,492,096; 9,705,526; 9,812,136; 9,940,942; 20010024525; 20010031089; 20020028021; 20020076115; 20020090139; 20020131084; 20020175921; 20020176633; 20030018647; 20030059121; 20030086621; 20030098804; 20040001543; 20040001611; 20040015525; 20040027259; 20040085233; 20040165527; 20040221237; 20050069224; 20050147172; 20050147173; 20050276323; 20060053004; 20060061795; 20060111635; 20060143454; 20060165163; 20060200709; 20070083491; 20070216545; 20070217506; 20070223582; 20070278395; 20070297394; 20080031545; 20080037880; 20080050025; 20080050026; 20080050027; 20080050029; 20080050047; 20080055121; 20080126378; 20080152235; 20080154928; 20080189545; 20090041021; 20090138715; 20090140893; 20090140894; 20090212981; 20090232408; 20090234200; 20090262929; 20090284399; 20090289820; 20090292475; 20090294645; 20090322570; 20100114581; 20100187414; 20100202442; 20110019737; 20110032983; 20110176606; 20110182524; 20110200266; 20110263967; 20110299455; 20120014435; 20120051434; 20120069895; 20120143510; 20120259557; 20130013574; 20130080073; 20130289424; 20140010288; 20140025342; 20140184430; 20140303944; 20140307770; 20140370836; 20140376827; 20150086013; 20150100244; 20150341643; 20150381994; 20160042744; 20160055855; 20160256112; 20160261997; 20160292589; 20160372123; 20170046615; 20170105004; 20170105005; 20170310972; 20170310974; 20170337711; 20170359584; 20180124407; 20180176556; 20180176563; 20180176582; 20180211677; 20180293778; and 20180295375.

Wireless Sensor Networks (WSN) typically consist of a large number of sensors distributed in a sensing area to serve different tasks, such as continuous environmental monitoring. These networks are intended to continuously sense an area of interest and transmit the sensed data to a sink node. Due to the power consumption constraints, it is inefficient to directly transmit the raw sensed data to the sink, as they often exhibit a high correlation in the spatial and temporal domains and can be efficiently compressed to reduce power and bandwidth requirements, and reduce latency, and provide greater opportunity for error detection and correction (EDC) encoding. See:

U.S. Pat. Nos. 10,004,183; 10,006,779; 10,007,592; 10,008,052; 10,009,063; 10,009,067; 10,010,703; 10,020,844; 10,024,187; 10,027,397; 10,027,398; 10,032,123; 10,033,108; 10,035,609; 10,038,765; 10,043,527; 10,044,409; 10,046,779; 10,050,697; 10,051,403; 10,051,630; 10,051,663; 10,063,280; 10,068,467; 10,069,185; 10,069,535; 10,069,547; 10,070,321; 10,070,381; 10,079,661; 10,084,223; 10,084,868; 10,085,425; 10,085,697; 10,089,716; 10,090,594; 10,090,606; 10,091,017; 10,091,787; 10,103,422; 10,103,801; 10,111,169; 10,116,697; 10,121,338; 10,121,339; 10,122,218; 10,133,989; 10,135,145; 10,135,146; 10,135,147; 10,135,499; 10,136,434; 10,137,288; 10,139,820; 10,141,622; 10,142,010; 10,142,086; 10,144,036; 10,148,016; 10,149,129; 10,149,131; 10,153,823; 10,153,892; 10,154,326; 10,155,651; 10,168,695; 10,170,840; 10,171,501; 10,178,445; 10,187,850; 10,194,437; 10,200,752; 6,735,630; 6,795,786; 6,826,607; 6,832,251; 6,859,831; 7,020,701; 7,081,693; 7,170,201; 7,207,041; 7,231,180; 7,256,505; 7,328,625; 7,339,957; 7,361,998; 7,365,455; 7,385,503; 7,398,164; 7,429,805; 7,443,509; 7,487,066; 7,605,485; 7,609,838; 7,630,736; 7,660,203; 7,671,480; 7,710,455; 7,719,416; 7,764,958; 7,788,970; 7,797,367; 7,802,015; 7,805,405; 7,844,687; 7,873,673; 7,881,206; 7,908,928; 7,953,559; 7,957,222; 7,990,262; 7,996,342; 8,000,314; 8,010,319; 8,011,255; 8,013,731; 8,013,732; 8,024,980; 8,026,113; 8,026,808; 8,031,650; 8,035,511; 8,044,812; 8,064,412; 8,073,331; 8,086,864; 8,098,485; 8,104,993; 8,111,156; 8,112,381; 8,140,658; 8,171,136; 8,193,929; 8,193,930; 8,194,655; 8,194,858; 8,195,814; 8,199,635; 8,212,667; 8,214,082; 8,214,370; 8,219,848; 8,221,273; 8,223,010; 8,225,129; 8,233,471; 8,260,575; 8,264,401; 8,265,657; 8,279,067; 8,279,080; 8,280,671; 8,282,517; 8,289,184; 8,305,899; 8,325,030; 8,330,596; 8,335,304; 8,350,750; 8,359,347; 8,370,935; 8,373,576; 8,375,442; 8,379,564; 8,395,496; 8,410,931; 8,417,762; 8,421,274; 8,446,884; 8,451,766; 8,489,063; 8,493,601; 8,529,383; 8,533,473; 8,536,998; 8,544,089; 8,552,861; 8,559,271; 8,572,290; 8,582,481; 8,585,517; 8,585,606; 8,600,560; 8,615,374; 8,625,496; 8,630,965; 8,635,654; 8,638,217; 8,660,786; 8,666,357; 8,687,810; 8,688,850; 8,700,064; 8,704,656; 8,711,743; 8,733,168; 8,756,173; 8,776,062; 8,781,768; 8,787,246; 8,795,172; 8,805,579; 8,810,429; 8,812,007; 8,812,654; 8,816,850; 8,822,924; 8,832,244; 8,836,503; 8,855,011; 8,855,245; 8,867,309; 8,867,310; 8,873,335; 8,873,336; 8,879,356; 8,885,441; 8,892,624; 8,892,704; 8,922,065; 8,923,144; 8,924,587; 8,924,588; 8,930,571; 8,949,989; 8,954,377; 8,964,708; 8,971,432; 8,982,856; 8,983,793; 8,987,973; 8,990,032; 8,994,551; 9,004,320; 9,017,255; 9,026,273; 9,026,279; 9,026,336; 9,028,404; 9,032,058; 9,063,165; 9,065,699; 9,072,114; 9,074,731; 9,075,146; 9,090,339; 9,103,920; 9,105,181; 9,111,240; 9,115,989; 9,119,019; 9,129,497; 9,130,651; 9,141,215; 9,148,849; 9,152,146; 9,154,263; 9,164,292; 9,191,037; 9,202,051; 9,210,436; 9,210,938; 9,226,304; 9,232,407; 9,233,466; 9,239,215; 9,240,955; 9,282,029; 9,288,743; 9,297,915; 9,305,275; 9,311,808; 9,325,396; 9,356,776; 9,363,175; 9,372,213; 9,374,677; 9,386,522; 9,386,553; 9,387,940; 9,397,795; 9,398,576; 9,402,245; 9,413,571; 9,417,331; 9,429,661; 9,430,936; 9,439,126; 9,445,445; 9,455,763; 9,459,360; 9,470,809; 9,470,818; 9,492,086; 9,495,860; 9,500,757; 9,515,691; 9,529,210; 9,571,582; 9,576,404; 9,576,694; 9,583,967; 9,584,193; 9,585,620; 9,590,772; 9,605,857; 9,608,740; 9,609,810; 9,615,226; 9,615,269; 9,615,792; 9,621,959; 9,628,165; 9,628,286; 9,628,365; 9,632,746; 9,639,100; 9,640,850; 9,651,400; 9,656,389; 9,661,205; 9,662,392; 9,666,042; 9,667,317; 9,667,653; 9,674,711; 9,681,807; 9,685,992; 9,691,263; 9,699,768; 9,699,785; 9,701,325; 9,705,561; 9,705,610; 9,711,038; 9,721,210; 9,722,318; 9,727,115; 9,728,063; 9,729,197; 9,730,160; 9,735,833; 9,742,462; 9,742,521; 9,743,370; 9,746,452; 9,748,626; 9,749,013; 9,749,053; 9,749,083; 9,753,022; 9,753,164; 9,762,289; 9,766,320; 9,766,619; 9,768,833; 9,769,020; 9,769,128; 9,769,522; 9,772,612; 9,776,725; 9,780,834; 9,781,700; 9,787,412; 9,788,326; 9,788,354; 9,791,910; 9,793,951; 9,793,954; 9,793,955; 9,800,327; 9,806,818; 9,812,754; 9,816,373; 9,816,897; 9,820,146; 9,824,578; 9,831,912; 9,838,078; 9,838,736; 9,838,

760; 9,838,896; 9,846,479; 9,847,566; 9,847,850; 9,853,342; 9,854,551; 9,854,994; 9,858,681; 9,860,075; 9,860,820; 9,863,222; 9,865,911; 9,866,276; 9,866,306; 9,866,309; 9,871,282; 9,871,283; 9,871,558; 9,874,923; 9,876,264; 9,876,570; 9,876,571; 9,876,587; 9,876,605; 9,878,138; 9,878,139; 9,882,257; 9,884,281; 9,887,447; 9,888,081; 9,891,883; 9,893,795; 9,894,852; 9,896,215; 9,900,177; 9,902,499; 9,904,535; 9,906,269; 9,911,020; 9,912,027; 9,912,033; 9,912,381; 9,912,382; 9,912,419; 9,913,006; 9,913,139; 9,917,341; 9,927,512; 9,927,517; 9,929,755; 9,930,668; 9,931,036; 9,931,037; 9,935,703; 9,946,571; 9,948,333; 9,948,354; 9,948,355; 9,948,477; 9,953,448; 9,954,286; 9,954,287; 9,957,052; 9,960,808; 9,960,980; 9,965,813; 9,967,002; 9,967,173; 9,969,329; 9,970,993; 9,973,299; 9,973,416; 9,973,940; 9,974,018; 9,980,223; 9,983,011; 9,990,818; 9,991,580; 9,997,819; 9,998,870; 9,998,932; 9,999,038; 20030107488; 20030151513; 20040083833; 20040090329; 20040090345; 20040100394; 20040128097; 20040139110; 20050017602; 20050090936; 20050210340; 20050213548; 20060026017; 20060029060; 20060175606; 20060206246; 20060243055; 20060243056; 20060243180; 20070038346; 20070090996; 20070101382; 20070195808; 20070210916; 20070210929; 20070221125; 20070224712; 20070239862; 20080031213; 20080074254; 20080122938; 20080129495; 20080215609; 20080219094; 20080253283; 20080256166; 20080256167; 20080256253; 20080256384; 20080256548; 20080256549; 20080309481; 20090007706; 20090009317; 20090009323; 20090009339; 20090009340; 20090058088; 20090058639; 20090059827; 20090070767; 20090146833; 20090149722; 20090161581; 20090168653; 20090196206; 20090198374; 20090210173; 20090210363; 20090296670; 20090303042; 20090322510; 20100031052; 20100039933; 20100054307; 20100074054; 20100100338; 20100109853; 20100125641; 20100148940; 20100152619; 20100152909; 20100176939; 20100201516; 20100211787; 20100254312; 20100278060; 20100312128; 20110035271; 20110035491; 20110045818; 20110101788; 20110137472; 20110158806; 20110176469; 20110191496; 20110248846; 20110293278; 20110310779; 20120014289; 20120089370; 20120092155; 20120106397; 20120123284; 20120127020; 20120127924; 20120173171; 20120178486; 20120190386; 20120215348; 20120218376; 20120250863; 20120257530; 20120262291; 20120265716; 20130016625; 20130016636; 20130041627; 20130044183; 20130046463; 20130048436; 20130076531; 20130076532; 20130078912; 20130097276; 20130107041; 20130113631; 20130148713; 20130153060; 20130155952; 20130176872; 20130180336; 20130201316; 20130207815; 20130244121; 20130258904; 20130265874; 20130265915; 20130265981; 20130314273; 20130320212; 20130332010; 20130332011; 20130332025; 20140010047; 20140062212; 20140114549; 20140124621; 20140153674; 20140191875; 20140192689; 20140216144; 20140225603; 20140253733; 20140263418; 20140263430; 20140263989; 20140264047; 20140266776; 20140266785; 20140268601; 20140273821; 20140275849; 20140299783; 20140301217; 20140312242; 20140349597; 20140350722; 20140355499; 20140358442; 20150046582; 20150049650; 20150078738; 20150081247; 20150082754; 20150094618; 20150119079; 20150139425; 20150164408; 20150178620; 20150192682; 20150249486; 20150268355; 20150280863; 20150286933; 20150288604; 20150294431; 20150316926; 20150330869; 20150338525; 20150343144; 20150351084; 20150351336; 20150363981; 20160000045; 20160012465; 20160025514; 20160044035; 20160051791; 20160051806; 20160072547; 20160081551; 20160081586; 20160082589; 20160088517; 20160091730; 20160100444; 20160100445; 20160152252; 20160173959; 20160174148; 20160183799; 20160189381; 20160202755; 20160260302; 20160260303; 20160300183; 20160314055; 20160323839; 20160323841; 20160338617; 20160338644; 20160345260; 20160353294; 20160356665; 20160356666; 20160378427; 20170006140; 20170013533; 20170021204; 20170072851; 20170078400; 20170106178; 20170116383; 20170126332; 20170135041; 20170151964; 20170167287; 20170169912; 20170171807; 20170171889; 20170172472; 20170172473; 20170173262; 20170177435; 20170177542; 20170180214; 20170181098; 20170181628; 20170183243; 20170195823; 20170201297; 20170213345; 20170217018; 20170222753; 20170223653; 20170228998; 20170259050; 20170259942; 20170264805; 20170268954; 20170276655; 20170281092; 20170284839; 20170287522; 20170289323; 20170289812; 20170295503; 20170296104; 20170302756; 20170330431; 20170331899; 20170346609; 20170347297; 20170353865; 20170374619; 20180017392; 20180019862; 20180024029; 20180034912; 20180039316; 20180049638; 20180058202; 20180077663; 20180078747; 20180078748; 20180124181; 20180129902; 20180132720; 20180148180; 20180148182; 20180162549; 20180164439; 20180166962; 20180170575; 20180181910; 20180182116; 20180212787; 20180213348; 20180222388; 20180246696; 20180271980; 20180278693; 20180278694; 20180293538; 20180310529; 20180317140; 20180317794; 20180326173; 20180338017; 20180338282; 20180343304; 20180343482; 20180375940; 20190014587; 20190015622; 20190020530; 20190036801; and 20190037558.

Spatial correlation in WSN refers to, e.g., the correlation between the sensed data at spatially adjacent sensor nodes. On the other hand, temporal correlation usually refers to the slow varying nature of the sensed data. Compressive sensing (CS) is a tool that provides a means to process and transport correlated data in an efficient manner by exploring the sparsity of these data. Temporal correlation can be modeled in the form of a multiple measurement vector (MMV), where it models the source as an auto regressive (AR) process and then incorporates such information into the framework of sparse Bayesian learning for sparse signal recovery and converts MMV to block single measurement vector (SMV) model. Compressive sensing theory provides an elegant mathematical framework to compress and recover signals using a small number of linear measurements. Under certain conditions on the measurement matrix, the acquired signal can be perfectly reconstructed from these measurements.

A mean is a commonly used measure of central tendency, and is influenced by every value in a sample according to the formula:

$$\mu = \frac{\sum X}{N}$$

where $\mu$ is population mean, and $\overline{X}$ is sample mean.

A standard deviation is a measure of variability, according to the formula:

$$\sigma = \sqrt{\frac{\sum (X - \mu)^2}{N}}$$

(if $\mu$ is unknown, use $\overline{X}$)

A small sample bias may be corrected by dividing by n−1, where n is the number of samples, i.e.:

$$\sigma = \sqrt{\frac{\sum(X-\bar{X})^2}{n-1}}$$

A normal distribution has a bell shaped curve, and is a reasonably accurate description of many (but not all) natural distributions introduced by a random process. It is unimodal, symmetrical, has points of inflection at $\mu\pm\sigma$, has tails that approach x-axis, and is completely defined by its mean and standard deviation.

The standard error of the mean, is a standard deviation of sampling error of different samples of a given sample size. For a sampling error of $(\bar{X}-\mu)$, as n increases, variability decreases:

$$\sigma_{\bar{X}} = \frac{\sigma}{\sqrt{n}}$$

"File Compression Possibilities". A Brief guide to compress a file in 4 different ways.

"Intel labs berkeley data," www.select.cs.cmu.edu/data/labapp3/.

Alwakeel, Ahmed S., Mohamed F. Abdelkader, Karim G. Seddik, and Atef Ghuniem. "Exploiting temporal correlation of sparse signals in wireless sensor networks." In Vehicular Technology Conference (VTC Spring), 2014 IEEE 79th, pp. 1-6. IEEE, 2014.

Arcangel, Cory. "On Compression" (2013)

Baraniuk, R. G., "Compressive sensing [lecture notes]," IEEE, Signal Processing Magazine, vol. 24, no. 4, pp. 118-121, 2007.

Ben-Gal, I. (2008). "On the Use of Data Compression Measures to Analyze Robust Designs", 54 (3). IEEE Transactions on Reliability: 381-388.

Boyd, S.; Parikh, N.; Chu, E.; Peleato, B.; Eckstein, J. Distributed optimization and statistical learning via the alternating direction method of multipliers. Found. Trends Mach. Learn. 2011, 3, 1-122.

Cai, J. F.; Candes, E. J.; Shen, Z. W. A singular value thresholding algorithm for matrix completion. SIAM J. Optim. 2010, 20, 1956-1982.

Caione, C.; Brunelli, D.; Benini, L. Distributed compressive sampling for lifetime optimization in dense wireless sensor networks. IEEE Trans. Ind. Inf. 2012, 8, 30-40.

Candes, E. J., M. B. Wakin, and S. P. Boyd, "Enhancing sparsity by reweighted 1 1 minimization," Journal of Fourier Analysis and Applications, vol. 14, no. 5-6, pp. 877-905, 2008.

Candes, E.; Recht, B. Exact matrix completion via convex optimization. Commun. ACM 2012, 55, 111-119.

Candes, E. J.; Recht, B. Exact matrix completion via convex optimization. Found. Comput. Math. 2009, 9, 717-772.

Candes, E. J.; Romberg, J.; Tao, T. Robust uncertainty principles: Exact signal reconstruction from highly incomplete frequency information. IEEE Trans. Inf. Theory 2006, 52, 489-509.

CCITT Study Group VIII and die Joint Photographic Experts Group (JPEG) von ISO/IEC Joint Technical Committee 1/Subcommittee 29/Working Group 10 (1993), "Annex D—Arithmetic coding", in ITU-T (in German), Recommendation T.81: Digital Compression and Coding of Continuous-tone Still images—Requirements and guidelines, pp. 54 ff.

Cevher, V., A. Sankaranarayanan, M. F. Duarte, D. Reddy, R. G. Baraniuk, and R. Chellappa, "Compressive sensing for background subtraction," in Computer Vision-ECCV 2008. Springer, 2008, pp. 155-168.

Chanda P, Bader J S, Elhaik E; Elhaik; Bader (27 Jul. 2012). "HapZipper: sharing HapMap populations just got easier", Nucleic Acids Research. 40 (20): e159. doi:10.1093/nar/gks709. PMC 3488212. PMID 22844100.

Charbiwala, Z., Y. Kim, S. Zahedi, J. Friedman, and M. B. Srivastava, "Energy efficient sampling for event detection in wireless sensor networks," in Proceedings of the 14th ACM/IEEE international symposium on Low power electronics and design. ACM, 2009, pp. 419-424.

Cheng, J.; Ye, Q.; Jiang, H.; Wang, D.; Wang, C. STCDG: An efficient data gathering algorithm based on matrix completion for wireless sensor networks. IEEE Trans. Wirel. Commun. 2013, 12, 850-861.

Christley S, Lu Y, Li C, Xie X; Lu; Li; Xie (Jan. 15, 2009). "Human genomes as email attachments". Bioinformatics. 25 (2): 274-5. doi:10.1093/bioinformatics/btn582. PMID 18996942.

Claude Elwood Shannon (1948), Alcatel-Lucent, ed., "A Mathematical Theory of Communication" (in German), Bell System Technical Journal 27 (3-4)

Cliff Reader (2016-08-31), Society of Photo-Optical Instrumentation Engineers, ed., [Vortragsmitschnitt, ab 3:05:10 "Patent landscape for royalty-free video coding"], Applications of Digital Image Processing XXXIX (San Diego, Calif.)

Coalson, Josh. "FLAC Comparison".

Donoho, D. L., "Compressed sensing," IEEE Transactions on, Information Theory, vol. 52, no. 4, pp. 1289-1306, 2006.

Donoho, D. L. Compressed sensing. IEEE Trans. Inf. Theory 2006, 52, 1289-1306.

en.wikipedia.org/wiki/Data_compression

Faxin Yu; Hao Luo; Zheming Lu (2010). Three-Dimensional Model Analysis and Processing. Berlin: Springer. p. 47. ISBN 9783642126512.

Gleichman, S.; Eldar, Y. C. Blind compressed sensing. IEEE Trans. Inf. Theory 2011, 57, 6958-6975.

Goel, S., and T. Imielinski, "Prediction-based monitoring in sensor networks: taking lessons from mpeg," ACM SIG-COMM Computer Communication Review, vol. 31, no. 5, pp. 82-98, 2001.

Goldstein, T.; O'Donoghue, B.; Setzer, S.; Baraniuk, R. Fast alternating direction optimization methods. SIAM J. Imaging Sci. 2014, 7, 1588-1623.

Golub, G. H.; Van Loan, C. F. Matrix Computations; JHU Press: Baltimore, Md., USA, 2012.

Graphics & Media Lab Video Group (2007). Lossless Video Codecs Comparison. Moscow State University.

Grimes, C. A., "Design of a wireless sensor network for long-term, in-situ monitoring of an aqueous environment," Sensors, vol. 2, no. 11, pp. 455-472, 2002.

He, B.; Tao, M.; Yuan, X. Alternating direction method with Gaussian back substitution for separable convex programming. SIAM J. Optim. 2012, 22, 313-340.

Heinzelman, W. R.; Chandrakasan, A.; Balakrishnan, H. Energy-efficient communication protocol for wireless microsensor networks. In Proceedings of the 33rd Annual Hawaii International Conference on System Siences, Maui, Hi., USA, 4-7 Jan. 2000; p. 223.

Hilbert, Martin; Lopez, Priscila (1 Apr. 2011). "The World's Technological Capacity to Store, Communicate, and Compute Information". Science. 332 (6025): 60-65. Bibcode:2011Sci . . . 332 . . . 60H. doi:10.1126/science.1200970. PMID 21310967.

Hu, Y.; Zhang, D.; Ye, J.; Li, X.; He, X. Fast and accurate matrix completion via truncated nuclear norm regularization. IEEE Trans. Pattern Anal. Mach. Intell. 2013, 35, 2117-2130.

Huffman, David Albert (1952-09), "A method for the construction of minimum-redundancy codes" (in German), Proceedings of the IRE 40 (9): pp. 1098-1101, doi:10.1109/JRPROC.1952.273898

Jaiswal, R. C. (2009). Audio-Video Engineering. Pune, Maharashtra: Nirali Prakashan. p. 3.41. ISBN 9788190639675.

Kadkhodaie, M.; Christakopoulou, K.; Sanjabi, M.; Banerjee, A. Accelerated alternating direction method of multipliers. In Proceedings of the 21th ACM SIGKDD International Conference on Knowledge Discovery and Data Mining, Sydney, Australia, 10-13 August 2015; pp. 497-506.

Kong, L.; Xia, M.; Liu, X. Y.; Chen, G.; Gu, Y.; Wu, M. Y.; Liu, X. Data loss and reconstruction in wireless sensor networks. IEEE Trans. Parallel Distrib. Syst. 2014, 25, 2818-2828.

Korn, D.; et al. "RFC 3284: The VCDIFF Generic Differencing and Compression Data Format". Internet Engineering Task Force. (2002).

Korn, D. G.; Vo, K. P. (1995), B. Krishnamurthy, ed., Vdelta: Differencing and Compression, Practical Reusable Unix Software, New York: John Wiley & Sons, Inc.

Lachowski, R.; Pellenz, M. E.; Penna, M. C.; Jamhour, E.; Souza, R. D. An efficient distributed algorithm for constructing spanning trees in wireless sensor networks. Sensors 2015, 15, 1518-1536.

Lane, Tom. "JPEG Image Compression FAQ, Part 1". Internet FAQ Archives. Independent JPEG Group.

Larsen, R. M. PROPACK-Software for Large and Sparse SVD Calculations. Available online: sun.stanford.edu/~/rmunk/PROPACK.

Li, S. X.; Gao, F.; Ge, G. N.; Zhang, S. Y. Deterministic construction of compressed sensing matrices via algebraic curves. IEEE Trans. Inf. Theory 2012, 58, 5035-5041.

Liu, X. Y.; Zhu, Y.; Kong, L.; Liu, C.; Gu, Y.; Vasilakos, A. V.; Wu, M. Y. CDC: Compressive data collection for wireless sensor networks. IEEE Trans. Parallel Distrib. Syst. 2015, 26, 2188-2197.

Liu, Y.; He, Y.; Li, M.; Wang, J.; Liu, K.; Li, X. Does wireless sensor network scale? A measurement study on GreenOrbs. IEEE Trans. Parallel Distrib. Syst. 2013, 24, 1983-1993.

Luo, C., F. Wu, J. Sun, and C. W. Chen, "Compressive data gathering for large-scale wireless sensor networks," *ACM, Proceedings of the 15th annual international conference on Mobile computing and networking*, pp. 145-156, 2009.

Luo, C., F. Wu, J. Sun, and C. W. Chen, "Efficient measurement generation and pervasive sparsity for compressive data gathering," *Wireless Communications, IEEE Transactions on*, vol. 9, no. 12, pp. 3728-3738, 2010.

Luo, C.; Wu, F.; Sun, J.; Chen, C. W. Compressive data gathering for large-scale wireless sensor networks. In Proceedings of the 15th ACM International Conference on Mobile Computing and Networking, Beijing, China, 20-25 September 2009; pp. 145-156.

M. Hosseini, D. Pratas, and A. Pinho. 2016. A survey on data compression methods for biological sequences. Information 7(4):(2016): 56

Mandi, O. A.; Mohammed, M. A.; Mohamed, A. J. (November 2012). "Implementing a Novel Approach an Convert Audio Compression to Text Coding via Hybrid Technique". International Journal of Computer Science Issues. 9 (6, No. 3): 53-59.

Mahmud, Salauddin (March 2012). "An Improved Data Compression Method for General Data". International Journal of Scientific & Engineering Research. 3(3):2.

Mahoney, Matt. "Rationale for a Large Text Compression Benchmark". Florida Institute of Technology. (2006) cs.fit.edu/mmahoney/compression/rationale.htm Marak, Laszlo. "On image compression" University of Marne la Vallee (2013).

Mittal, S.; Vetter, J. (2015), "A Survey Of Architectural Approaches for Data Compression in Cache and Main Memory Systems", IEEE Transactions on Parallel and Distributed Systems, IEEE Nasir Ahmed, T. Natarajan, Kamisetty Ramamohan Rao (1974-01), "Discrete Cosine Transform" (in German), IEEE Transactions on Computers C-23 (1): pp. 90-93, doi:10.1109/T-C.1974.223784

Navqi, Saud; Naqvi, R.; Riaz, R. A.; Siddiqui, F. (April 2011). "Optimized RTL design and implementation of LZW algorithm for high bandwidth applications" Electrical Review. 2011 (4): 279-285.

Pavlichin D S, Weissman T, Yona G; Weissman; Yona (September 2013). "The human genome contracts again". Bioinformatics. 29 (17): 2199-202. doi:10.1093/bioinformatics/btt362. PMID 23793748.

Pham, N. D.; Le, T. D.; Park, K.; Choo, H. SCCS: Spatiotemporal clustering and compressing schemes for efficient data collection applications in WSNs. Int. J. Commun. Syst. 2010, 23, 1311-1333.

Pujar, J. H.; Kadlaskar, L. M. (May 2010). "A New Lossless Method of Image Compression and Decompression Using Huffman Coding Techniques" Journal of Theoretical and Applied Information Technology. 15 (1): 18-23.

Roughan, M.; Zhang, Y.; Willinger, W.; Qiu, L. L. Spatiotemporal compressive sensing and interne traffic matrices. IEEE ACM Trans. Netw. 2012, 20, 662-676.

Salomon, David (2008). A Concise Introduction to Data Compression. Berlin: Springer. ISBN 9781848000728.

Scully, D.; Carla E. Brodley (2006). "Compression and machine learning: A new perspective on feature space vectors" Data Compression Conference, 2006.

Shmilovici A.; Kahiri Y.; Ben-Gal I.; Hauser S. (2009). "Measuring the Efficiency of the Intraday Forex Market with a Universal Data Compression Algorithm" 33(2). Computational Economics: 131-154.

Shuman, D. I.; Narang, S. K.; Frossard, P.; Ortega, A.; Vandergheynst, P. The emerging field of signal processing on graphs: Extending high-dimensional data analysis to networks and other irregular domains. IEEE Signal Process. Mag. 2013, 30, 83-98.

Silberstein, A., R. Braynard, and J. Yang, "Constraint chaining: on energy-efficient continuous monitoring in sensor networks," in *Proceed ings of the 2006 ACM SIGMOD international conference on Management of data*. ACM, 2006, pp. 157-168.

Sullivan, G. J.; Ohm, J.-R.; Han, W.-J.; Wiegand, T., (December 2012). "Overview of the High Efficiency Video Coding (HEVC) Standard" IEEE Transactions on Circuits and Systems for Video Technology. IEEE. 22 (12).

Tank, M. K. (2011). Implementation of Limpel-Ziv algorithm for lossless compression using VHDL. Thinkquest 2010: Proceedings of the First International Conference on Contours of Computing Technology. Berlin: Springer. pp. 275-283.

The Olympus WS-120 digital speech recorder, according to its manual, can store about 178 hours of speech-quality audio in .WMA format in 500 MB of flash memory.

Toh, K. C.; Yun, S. An accelerated proximal gradient algorithm for nuclear norm regularized linear least squares problems. Pac. J. Optim. 2010, 6, 615-640.

U.S. Pat. No. 2,605,361, C. Chapin Cutler, "Differential Quantization of Communication Signals", issued 1952-07-29

Wade, Graham (1994). Signal coding and processing (2 ed.). Cambridge University Press. p. 34. ISBN 978-0-521-42336-6. "The broad objective of source coding is to exploit or remove 'inefficient' redundancy in the PCM source and thereby achieve a reduction in the overall source rate R."

Wang, Donghao, Wan, Jiangwen, Nie, Zhipeng, Zhang, Qiang, and Fei, Zhijie, "Efficient Data Gathering Methods in Wireless Sensor Networks Using GBTR Matrix Completion", *Sensors* 2016, 16(9), 1532; doi:10.3390/s1601532

William K. Pratt, Julius Kane, Harry C. Andrews: "Hadamard transform image coding", in Proceedings of the IEEE 57.1 (1969): Seiten 58-68

Wolfram, Stephen (2002). A New Kind of Science. Wolfram Media, Inc. p. 1069. ISBN 1-57955-008-8.

Xiang, L., J. Luo, C. Deng, A. V. Vasilakos, and W. Lin, "Dual-level compressed aggregation: Recovering fields of physical quantities from incomplete sensory data," *arXiv preprint arXiv*:1107.4873, 2011.

Xiang, L.; Luo, J.; Rosenberg, C. Compressed data aggregation: Energy-efficient and high-fidelity data collection. IEEE ACM Trans. Netw. 2013, 21, 1722-1735.

Yang, X., K. G. Ong, W. R. Dreschel, K. Zeng, C. S. Mungle, and

Yoon, S.; Shahabi, C. The Clustered AGgregation (CAG) technique leveraging spatial and temporal correlations in wireless sensor networks. ACM Trans. Sens. Netw. 2007, 3, 3.

Zhang Z., and B. D. Rao, "Sparse signal recovery with temporally correlated source vectors using sparse bayesian learning," *IEEE Journal of Selected Topics in Signal Processing*, vol. 5, pp. 912-926, 2011.

Zheng, H., S. Xiao, X. Wang, and X. Tian, "Energy and latency analysis for in-network computation with compressive sensing in wireless sensor networks," *INFOCOM*, pp. 2811-2815, 2012.

Zwicker, Eberhard; et al. (1967). The Ear As A Communication Receiver. Melville, N.Y.: Acoustical Society of America.

DETAILED DESCRIPTION

Figure 1:
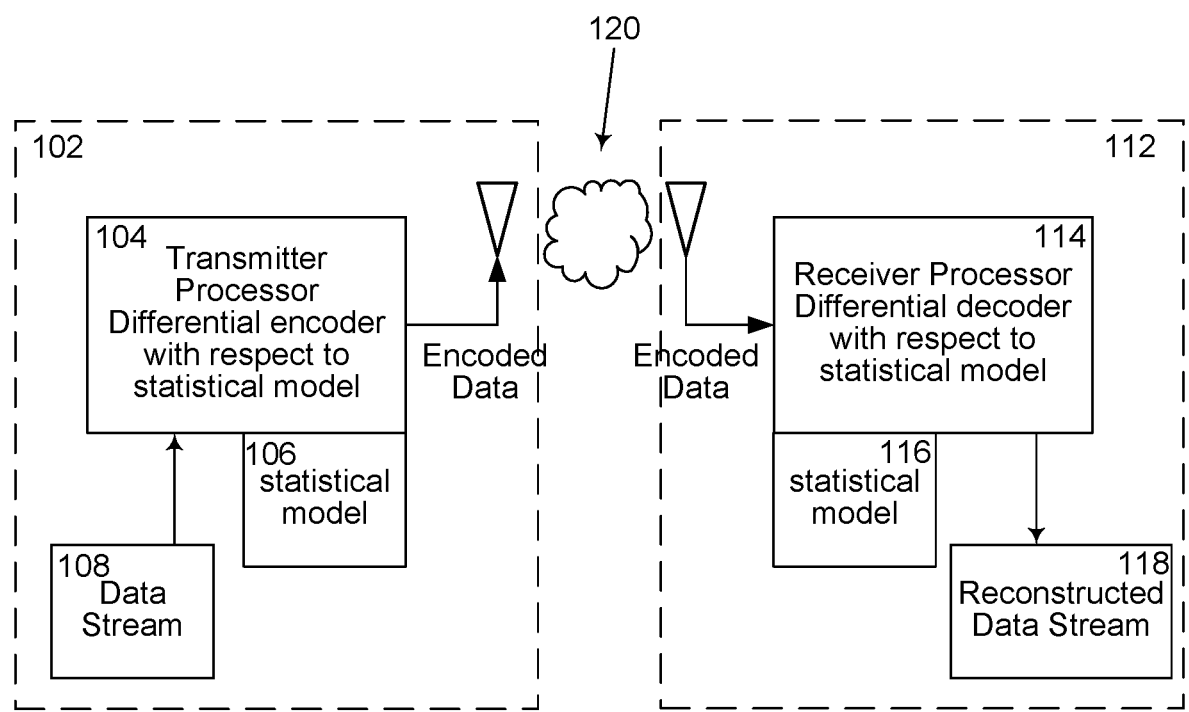
FIG. 1 shows a block diagram of a system including a transmitter and a receiver according to some embodiments of the presently disclosed technology.

The present disclosure concerns communicating sensor data. In accordance with some embodiments, the technique(s) disclosed significantly compresses the data volume by using a common machine learning based model on both send and receive sides, and sending only independent sensor variables and discrete standard error values of dependent sensor variables based on the prediction from the generated model instead of sending all the sensor data as continuous variables. Thus, the presently disclosed technology reduces data volume at the expense of loss of precision. The loss of precision can be designed carefully such that it serves the intended purpose of the data, e.g., human viewing. In some embodiments, various and applicable lossless data compression techniques (e.g., Huffman Encoding) can be implemented before, after, and/or otherwise in combination with the presently disclosed lossy compression technology. For example, after applying the presently disclosed technology, the independent parameter(s) (e.g., independent sensor variables) and/or contextual data (e.g., timestamps, latitudes, longitudes, or the like) can be compressed using other compression techniques before data transmission.

Consider a system where one or multiple machines are connected to an edge device. At the start of the system, the transmitting device (e.g., an edge computer) must transfer all of the machine data to the receiving device (e.g., a cloud server). When enough data are transmitted, both sides of the system generate an identical machine learning based model. Once the model generation is complete on both sides, the system synchronously switches to a reduced transmission mode, sending only computed error values, e.g., standard error values, as the dependent sensor variables' data.

Over time, the models may be updated; however, this updating must occur on the edge device due to the loss of precision introduced in compression. New models may be generated as needed and sent over a high bandwidth and/or cheap communication channel (e.g., LAN, WLAN, or cellular communication) when available, whereas lower data rate and/or expensive communication media (e.g., satellite communication, LoRaWAN, etc.) can be used for sending machine data. The model synchronization process may be scheduled for a period when the edge device has access to a high bandwidth and/or cheap communication medium (e.g., when a vehicle with a deployed edge device enters a certain geographic area). The system cannot start using the new model until both sender and receiver have synchronized the new model and new training error statistics at which point both sides must switch synchronously and begin sending and receiving compressed data according to the updated compression mechanism.

Due to the potentially large size of a machine learning based model, the model may be stored as a database lookup table, reducing the model size considerably at the expense of loss in precision. The model data rows may be restricted to the practical possible combinations of input independent variables and hence shrink the model's size. A typical model saved in table form and including a diesel engine's speed (i.e., Revolutions Per Minute) from 0 to 2000 and engine load 0 to 100%, will have 200001 rows (i.e., 2000×100 rows+one row for engine speed and engine load percent both zero). Thus, a 20 sensor model (2 independent and 18 dependent) would require around 16 MB space considering 4 bytes of storage per sensor.

In some embodiments, the edge device runs a machine learning based method on a training dataset collected over time from a machine and generate a model that represents the relationships between independent and dependent variables. Once the model is built, it would generate the error statistics (i.e., mean training error and standard deviation of training errors) for the training period from the difference between model predicted dependent sensor values and actual measured dependent sensor values, and save the sensor specific error statistics. Once the ML based model is built using training data and the error means and error standard deviations of dependent sensors are generated and stored on both sender and receiver side, at run time the edge device can measure all the independent and dependent sensor variables and compute the standard errors of all dependent sensor values from the difference between measured dependent sensor values and predicted sensor values and error mean and error standard deviations, and transmit only the standard errors of dependent sensor values. The receiving computer can generate the same model independently from the exact same data it received from edge before. When the receiving computer receives the standard error values for each sensor, it can compute the actual sensor data values back from the standard error values, using model predicted sensor value for the specific independent sensor variables and training error statistics.

It is therefore an object to provide a method of communicating information, comprising: modeling a stream of sensor data, to produce parameters of a predictive statistical model; communicating information defining the predictive statistical model from a transmitter to a receiver; and after communicating the information defining the predictive statistical model to the receiver, communicating information characterizing subsequent sensor data from the transmitter to the receiver, dependent on an error of the subsequent sensor data with respect to a prediction of the subsequent sensor data by the statistical model.

It is also an object to provide a method of synchronizing a state of a transmitter and a receiver, to communicate a stream of sensor data, comprising: modeling the stream of sensor data input to the transmitter, to produce parameters of a predictive statistical model; communicating information defining the predictive statistical model to the receiver; and communicating information characterizing subsequent sensor data from the transmitter to the receiver, as a statistically normalized differential encoding of the subsequent sensor data with respect to a prediction of the subsequent sensor data by the predictive statistical model.

It is a further object to provide a system for receiving communicated information, comprising: a predictive statistical model, stored in a memory, derived by modeling a stream of sensor data; a communication port configured to receive a communication from a transmitter; and at least one processor, configured to: receive information defining the predictive statistical model from the transmitter; and after reception of the information defining the predictive statistical model, receive information characterizing subsequent sensor data from the transmitter, dependent on an error of the subsequent sensor data with respect to a prediction of the subsequent sensor data by the statistical model.

It is another object to provide a system for communicating information, comprising: a predictive statistical model, stored in a memory, derived by modeling a stream of sensor data; a communication port configured to communicate with a receiver; and at least one processor, configured to: transmit information defining the predictive statistical model to the receiver; and after communication of the information defining the predictive statistical model to the receiver, communicate information characterizing subsequent sensor data to the receiver, dependent on an error of the subsequent sensor data with respect to a prediction of the subsequent sensor data by the statistical model.

A further object provides a system for synchronizing a state of a transmitter and a receiver, to communicate a stream of sensor data, comprising: a communication port configured to communicate with a receiver; and at least one automated processor, configured to: model the stream of sensor data, and to define parameters of a predictive statistical model; communicate the defined parameters of a predictive statistical model to the receiver; and communicate information characterizing subsequent sensor data to the receiver, comprising a series of statistically normalized differentially encoded subsequent sensor data with respect to a prediction of the series of subsequent sensor data by the predictive statistical model.

The method may further comprise calculating, at the receiver, the subsequent sensor data from the error of the sensor data and the prediction of the sensor data by statistical model.

The method may further comprise acquiring a time series of subsequent sensor data, and communicating from the transmitter to the receiver, information characterizing the time series of subsequent sensor data comprising a time series of errors of subsequent sensor data time-samples with respect to a prediction of the subsequent sensor data time-samples by the predictive statistical model.

The predictive statistical model may be adaptive to the communicated information characterizing subsequent sensor data.

The method may further comprise storing information dependent on the predictive statistical model in a memory of the transmitter and a memory of the receiver.

The method may further comprise determining a sensor data standard error based on a predicted sensor data error standard deviation.

The predictive statistical model may be derived from a machine learning based algorithm developed based on relationships between independent and dependent variables represented in the sensor data.

The predictive statistical model may generate error statistics comprising a mean training error and a standard deviation of the mean training error for a stream of sensor data of the training data set in a training period.

The predictive statistical model may comprise a linear model generated by machine learning.

The predictive statistical model may comprise a plurality of predictive statistical models, each provided for a subset of a range of at least one independent variable of the steam of sensor data.

The method may further comprise computing a predicted stream of sensor data, a predicted stream of sensor data error means, and a predicted stream of sensor data error standard deviations, based on the predictive statistical model.

The method may further comprise communicating the predicted stream of sensor data error means from the transmitter to the receiver. The method may further comprise receiving the predicted stream of sensor data error means at the receiver, and based on the predictive statistical model and the received stream of sensor data error means, reconstructing the stream of sensor data.

The method may further comprise approximately reconstructing a stream of subsequent sensor data based on the received predictive statistical model, at least one control variable, and the errors of stream of subsequent sensor data.

The method may further comprise transmitting a standard error of the prediction of the subsequent sensor data by the predictive statistical model from the transmitter to the receiver, and inferring the prediction of the subsequent sensor data by the predictive statistical model at the receiver from the received standard error of the prediction and the predictive statistical model.

The stream of sensor data may comprise sensor data from a plurality of sensors which are dependent on at least one common control variable, the predictive statistical model being dependent on a correlation of the sensor data from the plurality of sensors, further comprise calculating standard errors of the subsequent sensor data from the plurality of sensors with respect to the predictive statistical model dependent on a correlation of the sensor data, entropy encoding the standard errors based on at least the correlation, and transmitting the entropy encoded standard errors, and a representation of the at least one common control variable from the transmitter to the receiver.

The stream of sensor data comprises engine data. The engine data may comprise timestamped data comprise at least one of engine speed, engine load, coolant temperature, coolant pressure, oil temperature, oil pressure, fuel pressure, and fuel actuator state. The engine data may comprise timestamped data comprise engine speed, engine load percentage, and at least one of coolant temperature, coolant pressure, oil temperature, oil pressure, and fuel pressure. The engine may be a diesel engine, and the modeled stream of sensor data is acquired while the diesel engine is in a steady state within a bounded range of engine speed and engine load.

The predictive statistical model may be a spline model, a neural network, a support vector machine, and/or a Generalized Additive Model (GAM).

Various predictive modeling methods are known, including Group method of data handling; Naive Bayes; k-nearest neighbor algorithm; Majority classifier; Support vector machines; Random forests; Boosted trees; CART (Classification and Regression Trees); Multivariate adaptive regression splines (MARS); Neural Networks and deep neural networks; ACE and AVAS; Ordinary Least Squares; Generalized Linear Models (GLM) (The generalized linear model (GLM) is a flexible family of models that are unified under a single method. Logistic regression is a notable special case of GLM. Other types of GLM include Poisson regression, gamma regression, and multinomial regression); Logistic regression (Logistic regression is a technique in which unknown values of a discrete variable are predicted based on known values of one or more continuous and/or discrete variables. Logistic regression differs from ordinary least squares (OLS) regression in that the dependent variable is binary in nature. This procedure has many applications); Generalized additive models; Robust regression; and Semi-parametric regression. See:

Geisser, Seymour (September 2016). Predictive Inference: An Introduction. New York: Chapman & Hall. ISBN 0-412-03471-9.

Finlay, Steven (2014). Predictive Analytics, Data Mining and Big Data. Myths, Misconceptions and Methods (1st ed.). Basingstoke: Palgrave Macmillan. p. 237. ISBN 978-1137379276.

Sheskin, David J. (Apr. 27, 2011). Handbook of Parametric and Nonparametric Statistical Procedures. Boca Raton, Fla.: CRC Press. p. 109. ISBN 1439858012.

Marascuilo, Leonard A. (December 1977). Nonparametric and distribution-free methods for the social sciences. Brooks/Cole Publishing Co. ISBN 0818502029.

Wilcox, Rand R. (Mar. 18, 2010). Fundamentals of Modern Statistical Methods. New York: Springer. pp. 200-213. ISBN 1441955240.

Steyerberg, Ewout W. (Oct. 21, 2010). Clinical Prediction Models. New York: Springer. p. 313. ISBN 1441926488.

Breiman, Leo (August 1996). "Bagging predictors". Machine Learning. 24 (2): 123-140. doi:10.1007/bf00058655.

Willey, Gordon R. (1953) "Prehistoric Settlement Patterns in the Virú Valley, Peru", Bulletin 155. Bureau of American Ethnology Heidelberg, Kurt, et al. "An Evaluation of the Archaeological Sample Survey Program at the Nevada Test and Training Range", SRI Technical Report 02-16, 2002

Jeffrey H. Altschul, Lynne Sebastian, and Kurt Heidelberg, "Predictive Modeling in the Military: Similar Goals, Divergent Paths", Preservation Research Series 1, SRI Foundation, 2004 forteconsultancy.wordpress.com/2010/05/17/wondering-what-lies-ahead-the-power-of-predictive-modeling/

"Hospital Uses Data Analytics and Predictive Modeling To Identify and Allocate Scarce Resources to High-Risk Patients, Leading to Fewer Readmissions". Agency for Healthcare Research and Quality. 2014-01-29. Retrieved 2014-01-29.

Banerjee, Imon. "Probabilistic Prognostic Estimates of Survival in Metastatic Cancer Patients (PPES-Met) Utilizing Free-Text Clinical Narratives". Scientific Reports. 8 (10037 (2018)). doi:10.1038/s41598-018-27946-5.

"Implementing Predictive Modeling in R for Algorithmic Trading". 2016-10-07. Retrieved 2016-11-25.

"Predictive-Model Based Trading Systems, Part 1-System Trader Success". System Trader Success. 2013-07-22. Retrieved 2016-11-25.

U.S. Pat. Nos. 10,061,887; 10,126,309; 10,154,624; 10,168,337; 10,187,899; 6,006,182; 6,064,960; 6,366,884; 6,401,070; 6,553,344; 6,785,652; 7,039,654; 7,144,869; 7,379,890; 7,389,114; 7,401,057; 7,426,499; 7,547,683; 7,561,972; 7,561,973; 7,583,961; 7,653,491; 7,693,683; 7,698,213; 7,702,576; 7,729,864; 7,730,063; 7,774,272; 7,813,981; 7,873,567; 7,873,634; 7,970,640; 8,005,620; 8,126,653; 8,152,750; 8,185,486; 8,401,798; 8,412,461; 8,498,915; 8,515,719; 8,566,070; 8,635,029; 8,694,455; 8,713,025; 8,724,866; 8,731,728; 8,843,356; 8,929,568; 8,992,453; 9,020,866; 9,037,256; 9,075,796; 9,092,391; 9,103,826; 9,204,319; 9,205,064; 9,297,814; 9,428,767; 9,471,884; 9,483,531; 9,534,234; 9,574,209; 9,580,697; 9,619,883; 9,886,545; 9,900,790; 9,903,193; 9,955,488; 9,992,123; 20010009904; 20010034686; 20020001574; 20020138012; 20020138270; 20030023951; 20030093277; 20040073414; 20040088239; 20040110697; 20040172319; 20040199445; 20040210509; 20040215551; 20040225629; 20050071266; 20050075597; 20050096963; 20050144106; 20050176442; 20050245252; 20050246314; 20050251468; 20060059028; 20060101017; 20060111849; 20060122816; 20060136184; 20060184473; 20060189553; 20060241869; 20070038386; 20070043656; 20070067195; 20070105804; 20070166707; 20070185656; 20070233679; 20080015871; 20080027769; 20080027841; 20080050357; 20080114564; 20080140549; 20080228744; 20080256069; 20080306804; 20080313073; 20080319897; 20090018891; 20090030771; 20090037402; 20090037410; 20090043637; 20090050492; 20090070182; 20090132448; 20090171740; 20090220965; 20090271342; 20090313041; 20100028870; 20100029493; 20100042438; 20100070455; 20100082617; 20100100331; 20100114793; 20100293130; 20110054949; 20110059860; 20110064747; 20110075920; 20110111419; 20110123986; 20110123987; 20110166844; 20110230366; 20110276828; 20110287946; 20120010867; 20120066217; 20120136629; 20120150032; 20120158633; 20120207771; 20120220958; 20120230515; 20120258874; 20120283885; 20120284207; 20120290505; 20120303408; 20120303504; 20130004473; 20130030584; 20130054486; 20130060305; 20130073442; 20130096892; 20130103570; 20130132163; 20130183664; 20130185226; 20130259847; 20130266557; 20130315885; 20140006013; 20140032186; 20140100128; 20140172444; 20140193919; 20140278967; 20140343959; 20150023949; 20150235143; 20150240305; 20150289149; 20150291975;

20150291976; 20150291977; 20150316562; 20150317449; 20150324548; 20150347922; 20160003845; 20160042513; 20160117327; 20160145693; 20160148237; 20160171398; 20160196587; 20160225073; 20160225074; 20160239919; 20160282941; 20160333328; 20160340691; 20170046347; 20170126009; 20170132537; 20170137879; 20170191134; 20170244777; 20170286594; 20170290024; 20170306745; 20170308672; 20170308846; 20180006957; 20180017564; 20180018683; 20180035605; 20180046926; 20180060458; 20180060738; 20180060744; 20180120133; 20180122020; 20180189564; 20180227930; 20180260515; 20180260717; 20180262433; 20180263606; 20180275146; 20180282736; 20180293511; 20180334721; 20180341958; 20180349514; 20190010554; and 20190024497.

In statistics, the generalized linear model (GLM) is a flexible generalization of ordinary linear regression that allows for response variables that have error distribution models other than a normal distribution. The GLM generalizes linear regression by allowing the linear model to be related to the response variable via a link function and by allowing the magnitude of the variance of each measurement to be a function of its predicted value. Generalized linear models unify various other statistical models, including linear regression, logistic regression and Poisson regression, and employs an iteratively reweighted least squares method for maximum likelihood estimation of the model parameters. See:

U.S. Pat. Nos. 10,002,367; 10,006,088; 10,009,366; 10,013,701; 10,013,721; 10,018,631; 10,019,727; 10,021,426; 10,023,877; 10,036,074; 10,036,638; 10,037,393; 10,038,697; 10,047,358; 10,058,519; 10,062,121; 10,070,166; 10,070,220; 10,071,151; 10,080,774; 10,092,509; 10,098,569; 10,098,908; 10,100,092; 10,101,340; 10,111,888; 10,113,198; 10,113,200; 10,114,915; 10,117,868; 10,131,949; 10,142,788; 10,147,173; 10,157,509; 10,172,363; 10,175,387; 10,181,010; 5,529,901; 5,641,689; 5,667,541; 5,770,606; 5,915,036; 5,985,889; 6,043,037; 6,121,276; 6,132,974; 6,140,057; 6,200,983; 6,226,393; 6,306,437; 6,411,729; 6,444,870; 6,519,599; 6,566,368; 6,633,857; 6,662,185; 6,684,252; 6,703,231; 6,704,718; 6,879,944; 6,895,083; 6,939,670; 7,020,578; 7,043,287; 7,069,258; 7,117,185; 7,179,797; 7,208,517; 7,228,171; 7,238,799; 7,268,137; 7,306,913; 7,309,598; 7,337,033; 7,346,507; 7,445,896; 7,473,687; 7,482,117; 7,494,783; 7,516,572; 7,550,504; 7,590,516; 7,592,507; 7,593,815; 7,625,699; 7,651,840; 7,662,564; 7,685,084; 7,693,683; 7,695,911; 7,695,916; 7,700,074; 7,702,482; 7,709,460; 7,711,488; 7,727,725; 7,743,009; 7,747,392; 7,751,984; 7,781,168; 7,799,530; 7,807,138; 7,811,794; 7,816,083; 7,820,380; 7,829,282; 7,833,706; 7,840,408; 7,853,456; 7,863,021; 7,888,016; 7,888,461; 7,888,486; 7,890,403; 7,893,041; 7,904,135; 7,910,107; 7,910,303; 7,913,556; 7,915,244; 7,921,069; 7,933,741; 7,947,451; 7,953,676; 7,977,052; 7,987,148; 7,993,833; 7,996,342; 8,010,476; 8,017,317; 8,024,125; 8,027,947; 8,037,043; 8,039,212; 8,071,291; 8,071,302; 8,094,713; 8,103,537; 8,135,548; 8,148,070; 8,153,366; 8,211,638; 8,214,315; 8,216,786; 8,217,078; 8,222,270; 8,227,189; 8,234,150; 8,234,151; 8,236,816; 8,283,440; 8,291,069; 8,299,109; 8,311,849; 8,328,950; 8,346,688; 8,349,327; 8,351,688; 8,364,627; 8,372,625; 8,374,837; 8,383,338; 8,412,465; 8,415,093; 8,434,356; 8,452,621; 8,452,638; 8,455,468; 8,461,849; 8,463,582; 8,465,980; 8,473,249; 8,476,077; 8,489,499; 8,496,934; 8,497,084; 8,501,718; 8,501,719; 8,514,928; 8,515,719; 8,521,294; 8,527,352; 8,530,831; 8,543,428; 8,563,295; 8,566,070; 8,568,995; 8,569,574; 8,600,870; 8,614,060; 8,618,164; 8,626,697; 8,639,618; 8,645,298; 8,647,819; 8,652,776; 8,669,063; 8,682,812; 8,682,876; 8,706,589; 8,712,937; 8,715,704; 8,715,943; 8,718,958; 8,725,456; 8,725,541; 8,731,977; 8,732,534; 8,741,635; 8,741,956; 8,754,805; 8,769,094; 8,787,638; 8,799,202; 8,805,619; 8,811,670; 8,812,362; 8,822,149; 8,824,762; 8,871,901; 8,877,174; 8,889,662; 8,892,409; 8,903,192; 8,903,531; 8,911,958; 8,912,512; 8,956,608; 8,962,680; 8,965,625; 8,975,022; 8,977,421; 8,987,686; 9,011,877; 9,030,565; 9,034,401; 9,036,910; 9,037,256; 9,040,023; 9,053,537; 9,056,115; 9,061,004; 9,061,055; 9,069,352; 9,072,496; 9,074,257; 9,080,212; 9,106,718; 9,116,722; 9,128,991; 9,132,110; 9,186,107; 9,200,324; 9,205,092; 9,207,247; 9,208,209; 9,210,446; 9,211,103; 9,216,010; 9,216,213; 9,226,518; 9,232,217; 9,243,493; 9,275,353; 9,292,550; 9,361,274; 9,370,501; 9,370,509; 9,371,565; 9,374,671; 9,375,412; 9,375,436; 9,389,235; 9,394,345; 9,399,061; 9,402,871; 9,415,029; 9,451,920; 9,468,541; 9,503,467; 9,534,258; 9,536,214; 9,539,223; 9,542,939; 9,555,069; 9,555,251; 9,563,921; 9,579,337; 9,585,868; 9,615,585; 9,625,646; 9,633,401; 9,639,807; 9,639,902; 9,650,678; 9,663,824; 9,668,104; 9,672,474; 9,674,210; 9,675,642; 9,679,378; 9,681,835; 9,683,832; 9,701,721; 9,710,767; 9,717,459; 9,727,616; 9,729,568; 9,734,122; 9,734,290; 9,740,979; 9,746,479; 9,757,388; 9,758,828; 9,760,907; 9,769,619; 9,775,818; 9,777,327; 9,786,012; 9,790,256; 9,791,460; 9,792,741; 9,795,335; 9,801,857; 9,801,920; 9,809,854; 9,811,794; 9,836,577; 9,870,519; 9,871,927; 9,881,339; 9,882,660; 9,886,771; 9,892,420; 9,926,368; 9,926,593; 9,932,637; 9,934,239; 9,938,576; 9,949,659; 9,949,693; 9,951,348; 9,955,190; 9,959,285; 9,961,488; 9,967,714; 9,972,014; 9,974,773; 9,976,182; 9,982,301; 9,983,216; 9,986,527; 9,988,624; 9,990,648; 9,990,649; 9,993,735; 20020016699; 20020055457; 20020099686; 20020184272; 20030009295; 20030021848; 20030023951; 20030050265; 20030073715; 20030078738; 20030104499; 20030139963; 20030166017; 20030166026; 20030170660; 20030170700; 20030171685; 20030171876; 20030180764; 20030190602; 20030198650; 20030199685; 20030220775; 20040063095; 20040063655; 20040073414; 20040092493; 20040115688; 20040116409; 20040116434; 20040127799; 20040138826; 20040142890; 20040157783; 20040166519; 20040265849; 20050002950; 20050026169; 20050080613; 20050096360; 20050113306; 20050113307; 20050164206; 20050171923; 20050272054; 20050282021; 20050287559; 20060024700; 20060035867; 20060036497; 20060084070; 20060084081; 20060142983; 20060143071; 20060147420; 20060149522; 20060164997; 20060223093; 20060228715; 20060234262; 20060278241; 20060286571; 20060292547; 20070026426; 20070031846; 20070031847; 20070031848; 20070036773; 20070037208; 20070037241; 20070042382; 20070049644; 20070054278; 20070059710; 20070065843; 20070072821; 20070078117; 20070078434; 20070087000; 20070088248; 20070123487; 20070129948; 20070167727; 20070190056; 20070202518; 20070208600; 20070208640; 20070239439; 20070254289; 20070254369; 20070255113; 20070259954; 20070275881; 20080032628; 20080033589; 20080038230; 20080050732; 20080050733; 20080051318; 20080057500; 20080059072; 20080076120; 20080103892; 20080108081; 20080108713; 20080114564; 20080127545; 20080139402; 20080160046; 20080166348; 20080172205; 20080176266; 20080177592; 20080183394; 20080195596; 20080213745; 20080241846; 20080248476; 20080286796; 20080299554; 20080301077; 20080305967; 20080306034; 20080311572; 20080318219; 20080318914; 20090006363; 20090035768; 20090035769; 20090035772; 20090053745; 20090055139; 20090070081; 20090076890; 20090087909; 20090089022; 20090104620; 20090107510;

20090112752; 20090118217; 20090119357; 20090123441; 20090125466; 20090125916; 20090130682; 20090131702; 20090132453; 20090136481; 20090137417; 20090157409; 20090162346; 20090162348; 20090170111; 20090175830; 20090176235; 20090176857; 20090181384; 20090186352; 20090196875; 20090210363; 20090221438; 20090221620; 20090226420; 20090233299; 20090253952; 20090258003; 20090264453; 20090270332; 20090276189; 20090280566; 20090285827; 20090298082; 20090306950; 20090308600; 20090312410; 20090325920; 20100003691; 20100008934; 20100010336; 20100035983; 20100047798; 20100048525; 20100048679; 20100063851; 20100076949; 20100113407; 20100120040; 20100132058; 20100136553; 20100136579; 20100137409; 20100151468; 20100174336; 20100183574; 20100183610; 20100184040; 20100190172; 20100191216; 20100196400; 20100197033; 20100203507; 20100203508; 20100215645; 20100216154; 20100216655; 20100217648; 20100222225; 20100249188; 20100261187; 20100268680; 20100272713; 20100278796; 20100284989; 20100285579; 20100310499; 20100310543; 20100330187; 20110004509; 20110021555; 20110027275; 20110028333; 20110054356; 20110065981; 20110070587; 20110071033; 20110077194; 20110077215; 20110077931; 20110079077; 20110086349; 20110086371; 20110086796; 20110091994; 20110093288; 20110104121; 20110106736; 20110118539; 20110123100; 20110124119; 20110129831; 20110130303; 20110131160; 20110135637; 20110136260; 20110137851; 20110150323; 20110173116; 20110189648; 20110207659; 20110207708; 20110208738; 20110213746; 20110224181; 20110225037; 20110251272; 20110251995; 20110257216; 20110257217; 20110257218; 20110257219; 20110263633; 20110263634; 20110263635; 20110263636; 20110263637; 20110269735; 20110276828; 20110284029; 20110293626; 20110302823; 20110307303; 20110311565; 20110319811; 20120003212; 20120010274; 20120016106; 20120016436; 20120030082; 20120039864; 20120046263; 20120064512; 20120065758; 20120071357; 20120072781; 20120082678; 20120093376; 20120101965; 20120107370; 20120108651; 20120114211; 20120114620; 20120121618; 20120128223; 20120128702; 20120136629; 20120154149; 20120156215; 20120163656; 20120165221; 20120166291; 20120173200; 20120184605; 20120209565; 20120209697; 20120220055; 20120239489; 20120244145; 20120245133; 20120250963; 20120252050; 20120252695; 20120257164; 20120258884; 20120264692; 20120265978; 20120269846; 20120276528; 20120280146; 20120301407; 20120310619; 20120315655; 20120316833; 20120330720; 20130012860; 20130024124; 20130024269; 20130029327; 20130029384; 20130030051; 20130040922; 20130040923; 20130041034; 20130045198; 20130045958; 20130058914; 20130059827; 20130059915; 20130060305; 20130060549; 20130061339; 20130065870; 20130071033; 20130073213; 20130078627; 20130080101; 20130081158; 20130102918; 20130103615; 20130109583; 20130112895; 20130118532; 20130129764; 20130130923; 20130138481; 20130143215; 20130149290; 20130151429; 20130156767; 20130171296; 20130197081; 20130197738; 20130197830; 20130198203; 20130204664; 20130204833; 20130209486; 20130210855; 20130211229; 20130212168; 20130216551; 20130225439; 20130237438; 20130237447; 20130240722; 20130244233; 20130244902; 20130244965; 20130252267; 20130252822; 20130262425; 20130271668; 20130273103; 20130274195; 20130280241; 20130288913; 20130303558; 20130303939; 20130310261; 20130315894; 20130325498; 20130332231; 20130332338; 20130346023; 20130346039; 20130346844; 20140004075; 20140004510; 20140011206; 20140011787; 20140038930; 20140058528; 20140072550; 20140072957; 20140080784; 20140081675; 20140086920; 20140087960; 20140088406; 20140093127; 20140093974; 20140095251; 20140100989; 20140106370; 20140107850; 20140114746; 20140114880; 20140120137; 20140120533; 20140127213; 20140128362; 20140134186; 20140134625; 20140135225; 20140141988; 20140142861; 20140143134; 20140148505; 20140156231; 20140156571; 20140163096; 20140170069; 20140171337; 20140171382; 20140172507; 20140178348; 20140186333; 20140188918; 20140199290; 20140200953; 20140200999; 20140213533; 20140219968; 20140221484; 20140234291; 20140234347; 20140235605; 20140236965; 20140242180; 20140244216; 20140249447; 20140249862; 20140256576; 20140258355; 20140267700; 20140271672; 20140274885; 20140278148; 20140279053; 20140279306; 20140286935; 20140294903; 20140303481; 20140316217; 20140323897; 20140324521; 20140336965; 20140343786; 20140349984; 20140365144; 20140365276; 20140376645; 20140378334; 20150001420; 20150002845; 20150004641; 20150005176; 20150006605; 20150007181; 20150018632; 20150019262; 20150025328; 20150031578; 20150031969; 20150032598; 20150032675; 20150039265; 20150051896; 20150051949; 20150056212; 20150064194; 20150064195; 20150064670; 20150066738; 20150072434; 20150072879; 20150073306; 20150078460; 20150088783; 20150089399; 20150100407; 20150100408; 20150100409; 20150100410; 20150100411; 20150100412; 20150111775; 20150112874; 20150119759; 20150120758; 20150142331; 20150152176; 20150167062; 20150169840; 20150178756; 20150190367; 20150190436; 20150191787; 20150205756; 20150209586; 20150213192; 20150215127; 20150216164; 20150216922; 20150220487; 20150228031; 20150228076; 20150231191; 20150232944; 20150240304; 20150240314; 20150250816; 20150259744; 20150262511; 20150272464; 20150287143; 20150292010; 20150292016; 20150299798; 20150302529; 20150306160; 20150307614; 20150320707; 20150320708; 20150328174; 20150332013; 20150337373; 20150341379; 20150348095; 20150356458; 20150359781; 20150361494; 20150366830; 20150377909; 20150378807; 20150379428; 20150379429; 20150379430; 20160010162; 20160012334; 20160017037; 20160017426; 20160024575; 20160029643; 20160029945; 20160032388; 20160034640; 20160034664; 20160038538; 20160040184; 20160040236; 20160042009; 20160042197; 20160045466; 20160046991; 20160048925; 20160053322; 20160058717; 20160063144; 20160068890; 20160068916; 20160075665; 20160078361; 20160097082; 20160105801; 20160108473; 20160108476; 20160110657; 20160110812; 20160122396; 20160124933; 20160125292; 20160138105; 20160139122; 20160147013; 20160152538; 20160163132; 20160168639; 20160171618; 20160171619; 20160173122; 20160175321; 20160198657; 20160202239; 20160203279; 20160203316; 20160222100; 20160222450; 20160224724; 20160224869; 20160228056; 20160228392; 20160237487; 20160243190; 20160243215; 20160244836; 20160244837; 20160244840; 20160249152; 20160250228; 20160251720; 20160253324; 20160253330; 20160259883; 20160265055; 20160271144; 20160281105; 20160281164; 20160282941; 20160295371; 20160303111; 20160303172; 20160306075; 20160307138; 20160310442; 20160319352; 20160344738; 20160352768; 20160355886; 20160359683; 20160371782; 20160378942; 20170004409; 20170006135; 20170007574; 20170009295; 20170014032; 20170014108; 20170016896; 20170017904; 20170022563; 20170022564; 20170027940; 20170028006; 20170029888; 20170029889; 20170032100; 20170035011; 20170037470; 20170046499; 20170051019; 20170051359; 20170052670; 20170056468; 20170061073; 20170067121; 20170068795; 20170071884; 20170073756; 20170074878; 20170076303; 20170088900; 20170091673; 20170097347; 20170098240;

20170098257; 20170098278; 20170099836; 20170100446; 20170103190; 20170107583; 20170108502; 20170112792; 20170116624; 20170116653; 20170117064; 20170119662; 20170124520; 20170124528; 20170127110; 20170127180; 20170135647; 20170140122; 20170140424; 20170145503; 20170151217; 20170156344; 20170157249; 20170159045; 20170159138; 20170168070; 20170177813; 20170180798; 20170193647; 20170196481; 20170199845; 20170214799; 20170219451; 20170224268; 20170226164; 20170228810; 20170231221; 20170233809; 20170233815; 20170235894; 20170236060; 20170238850; 20170238879; 20170242972; 20170246963; 20170247673; 20170255888; 20170255945; 20170259178; 20170261645; 20170262580; 20170265044; 20170268066; 20170270580; 20170280717; 20170281747; 20170286594; 20170286608; 20170286838; 20170292159; 20170298126; 20170300814; 20170300824; 20170301017; 20170304248; 20170310697; 20170311895; 20170312289; 20170312315; 20170316150; 20170322928; 20170344554; 20170344555; 20170344556; 20170344954; 20170347242; 20170350705; 20170351689; 20170351806; 20170351811; 20170353825; 20170353826; 20170353827; 20170353941; 20170363738; 20170364596; 20170364817; 20170369534; 20170374521; 20180000102; 20180003722; 20180005149; 20180010136; 20180010185; 20180010197; 20180010198; 20180011110; 20180014771; 20180017545; 20180017564; 20180017570; 20180020951; 20180021279; 20180031589; 20180032876; 20180032938; 20180033088; 20180038994; 20180049636; 20180051344; 20180060513; 20180062941; 20180064666; 20180067010; 20180067118; 20180071285; 20180075357; 20180077146; 20180078605; 20180080081; 20180085168; 20180085355; 20180087098; 20180089389; 20180093418; 20180093419; 20180094317; 20180095450; 20180108431; 20180111051; 20180114128; 20180116987; 20180120133; 20180122020; 20180128824; 20180132725; 20180143986; 20180148776; 20180157758; 20180160982; 20180171407; 20180182181; 20180185519; 20180191867; 20180192936; 20180193652; 20180201948; 20180206489; 20180207248; 20180214404; 20180216099; 20180216100; 20180216101; 20180216132; 20180216197; 20180217141; 20180217143; 20180218117; 20180225585; 20180232421; 20180232434; 20180232661; 20180232700; 20180232702; 20180232904; 20180235549; 20180236027; 20180237825; 20180239829; 20180240535; 20180245154; 20180251819; 20180251842; 20180254041; 20180260717; 20180263962; 20180275629; 20180276325; 20180276497; 20180276498; 20180276570; 20180277146; 20180277250; 20180285765; 20180285900; 20180291398; 20180291459; 20180291474; 20180292384; 20180292412; 20180293462; 20180293501; 20180293759; 20180300333; 20180300639; 20180303354; 20180303906; 20180305762; 20180312923; 20180312926; 20180314964; 20180315507; 20180322203; 20180323882; 20180327740; 20180327806; 20180327844; 20180336534; 20180340231; 20180344841; 20180353138; 20180357361; 20180357362; 20180357529; 20180357565; 20180357726; 20180358118; 20180358125; 20180358128; 20180358132; 20180359608; 20180360892; 20180365521; 20180369238; 20180369696; 20180371553; 20190000750; 20190001219; 20190004996; 20190005586; 20190010548; 20190015035; 20190017117; 20190017123; 20190024174; 20190032136; 20190033078; 20190034473; 20190034474; 20190036779; 20190036780; and 20190036816.

Ordinary linear regression predicts the expected value of a given unknown quantity (the response variable, a random variable) as a linear combination of a set of observed values (predictors). This implies that a constant change in a predictor leads to a constant change in the response variable (i.e., a linear-response model). This is appropriate when the response variable has a normal distribution (intuitively, when a response variable can vary essentially indefinitely in either direction with no fixed "zero value", or more generally for any quantity that only varies by a relatively small amount, e.g., human heights). However, these assumptions are inappropriate for some types of response variables. For example, in cases where the response variable is expected to be always positive and varying over a wide range, constant input changes lead to geometrically varying, rather than constantly varying, output changes.

In a GLM, each outcome Y of the dependent variables is assumed to be generated from a particular distribution in the exponential family, a large range of probability distributions that includes the normal, binomial, Poisson and gamma distributions, among others.

The GLM consists of three elements: A probability distribution from the exponential family; a linear predictor $\eta=X\beta$; and a link function g such that $E(Y)=\mu=g-1(\eta)$. The linear predictor is the quantity which incorporates the information about the independent variables into the model. The symbol $\eta$ (Greek "eta") denotes a linear predictor. It is related to the expected value of the data through the link function. $\eta$ is expressed as linear combinations (thus, "linear") of unknown parameters $\beta$. The coefficients of the linear combination are represented as the matrix of independent variables X. $\eta$ can thus be expressed as The link function provides the relationship between the linear predictor and the mean of the distribution function. There are many commonly used link functions, and their choice is informed by several considerations. There is always a well-defined canonical link function which is derived from the exponential of the response's density function. However, in some cases it makes sense to try to match the domain of the link function to the range of the distribution function's mean, or use a non-canonical link function for algorithmic purposes, for example Bayesian probit regression. For the most common distributions, the mean is one of the parameters in the standard form of the distribution's density function, and then is the function as defined above that maps the density function into its canonical form. A simple, very important example of a generalized linear model (also an example of a general linear model) is linear regression. In linear regression, the use of the least-squares estimator is justified by the Gauss-Markov theorem, which does not assume that the distribution is normal.

The standard GLM assumes that the observations are uncorrelated. Extensions have been developed to allow for correlation between observations, as occurs for example in longitudinal studies and clustered designs. Generalized estimating equations (GEEs) allow for the correlation between observations without the use of an explicit probability model for the origin of the correlations, so there is no explicit likelihood. They are suitable when the random effects and their variances are not of inherent interest, as they allow for the correlation without explaining its origin. The focus is on estimating the average response over the population ("population-averaged" effects) rather than the regression parameters that would enable prediction of the effect of changing one or more components of X on a given individual. GEEs are usually used in conjunction with Huber-White standard errors. Generalized linear mixed models (GLMMs) are an extension to GLMs that includes random effects in the linear predictor, giving an explicit probability model that explains the origin of the correlations. The resulting "subject-specific" parameter estimates are suitable when the focus is on estimating the effect of changing one or more components of X on a given individual. GLMMs are also referred to as multilevel models and as mixed model. In general, fitting GLMMs is more computationally complex and intensive than fitting GEEs.

In statistics, a generalized additive model (GAM) is a generalized linear model in which the linear predictor depends linearly on unknown smooth functions of some predictor variables, and interest focuses on inference about these smooth functions. GAMs were originally developed by Trevor Hastie and Robert Tibshirani to blend properties of generalized linear models with additive models.

The model relates a univariate response variable, to some predictor variables. An exponential family distribution is specified for (for example normal, binomial or Poisson distributions) along with a link function g (for example the identity or log functions) relating the expected value of univariate response variable to the predictor variables.

The functions may have a specified parametric form (for example a polynomial, or an un-penalized regression spline of a variable) or may be specified non-parametrically, or semi-parametrically, simply as 'smooth functions', to be estimated by non-parametric means. So a typical GAM might use a scatterplot smoothing function, such as a locally weighted mean. This flexibility to allow non-parametric fits with relaxed assumptions on the actual relationship between response and predictor, provides the potential for better fits to data than purely parametric models, but arguably with some loss of interpretability.

Any multivariate function can be represented as sums and compositions of univariate functions. Unfortunately, though the Kolmogorov-Arnold representation theorem asserts the existence of a function of this form, it gives no mechanism whereby one could be constructed. Certain constructive proofs exist, but they tend to require highly complicated (i.e., fractal) functions, and thus are not suitable for modeling approaches. It is not clear that any step-wise (i.e., backfitting algorithm) approach could even approximate a solution. Therefore, the Generalized Additive Model drops the outer sum, and demands instead that the function belong to a simpler class.

The original GAM fitting method estimated the smooth components of the model using non-parametric smoothers (for example smoothing splines or local linear regression smoothers) via the backfitting algorithm. Backfitting works by iterative smoothing of partial residuals and provides a very general modular estimation method capable of using a wide variety of smoothing methods to estimate the terms. Many modern implementations of GAMs and their extensions are built around the reduced rank smoothing approach, because it allows well founded estimation of the smoothness of the component smooths at comparatively modest computational cost, and also facilitates implementation of a number of model extensions in a way that is more difficult with other methods. At its simplest the idea is to replace the unknown smooth functions in the model with basis expansions. Smoothing bias complicates interval estimation for these models, and the simplest approach turns out to involve a Bayesian approach. Understanding this Bayesian view of smoothing also helps to understand the REML and full Bayes approaches to smoothing parameter estimation. At some level smoothing penalties are imposed.

Overfitting can be a problem with GAMs, especially if there is un-modelled residual auto-correlation or un-modelled overdispersion. Cross-validation can be used to detect and/or reduce overfitting problems with GAMs (or other statistical methods), and software often allows the level of penalization to be increased to force smoother fits. Estimating very large numbers of smoothing parameters is also likely to be statistically challenging, and there are known tendencies for prediction error criteria (GCV, AIC etc.) to occasionally undersmooth substantially, particularly at moderate sample sizes, with REML being somewhat less problematic in this regard. Where appropriate, simpler models such as GLMs may be preferable to GAMs unless GAMs improve predictive ability substantially (in validation sets) for the application in question.

Augustin, N. H.; Sauleau, E-A; Wood, S. N. (2012). "On quantile plots for generalized linear models". Computational Statistics and Data Analysis. 56: 2404-2409. doi: 10.1016/j.csda.2012.01.026.

Brian Junker (Mar. 22, 2010). "Additive models and cross-validation".

Chambers, J. M.; Hastie, T. (1993). Statistical Models in S. Chapman and Hall.

Dobson, A. J.; Barnett, A. G. (2008). Introduction to Generalized Linear Models (3rd ed.). Boca Raton, Fla.: Chapman and Hall/CRC. ISBN 1-58488-165-8.

Fahrmeier, L.; Lang, S. (2001). "Bayesian Inference for Generalized Additive Mixed Models based on Markov Random Field Priors". Journal of the Royal Statistical Society, Series C. 50: 201-220.

Greven, Sonja; Kneib, Thomas (2010). "On the behaviour of marginal and conditional AIC in linear mixed models". Biometrika. 97: 773-789. doi:10.1093/biomet/asq042.

Gu, C.; Wahba, G. (1991). "Minimizing GCV/GML scores with multiple smoothing parameters via the Newton method". SIAM Journal on Scientific and Statistical Computing. 12. pp. 383-398.

Gu, Chong (2013). Smoothing Spline ANOVA Models (2nd ed.). Springer.

Hardin, James; Hilbe, Joseph (2003). Generalized Estimating Equations. London: Chapman and Hall/CRC. ISBN 1-58488-307-3.

Hardin, James; Hilbe, Joseph (2007). Generalized Linear Models and Extensions (2nd ed.). College Station: Stata Press. ISBN 1-59718-014-9.

Hastie, T. J.; Tibshirani, R. J. (1990). Generalized Additive Models. Chapman & Hall/CRC. ISBN 978-0-412-34390-2.

Kim, Y. J.; Gu, C. (2004). "Smoothing spline Gaussian regression: more scalable computation via efficient approximation". Journal of the Royal Statistical Society, Series B. 66. pp. 337-356.

Madsen, Henrik; Thyregod, Poul (2011). Introduction to General and Generalized Linear Models. Chapman & Hall/CRC. ISBN 978-1-4200-9155-7.

Marra, G.; Wood, S. N. (2011). "Practical Variable Selection for Generalized Additive Models". Computational Statistics and Data Analysis. 55: 2372-2387. doi:10.1016/j.csda.2011.02.004.

Marra, G.; Wood, S. N. (2012). "Coverage properties of confidence intervals for generalized additive model components". Scandinavian Journal of Statistics. 39: 53-74. doi:10.1111/j.1467-9469.2011.00760.x.

Mayr, A.; Fenske, N.; Hofner, B.; Kneib, T.; Schmid, M. (2012). "Generalized additive models for location, scale and shape for high dimensional data—a flexible approach based on boosting". Journal of the Royal Statistical Society, Series C. 61: 403-427. doi:10.1111/j.1467-9876.2011.01033.x.

McCullagh, Peter; Nelder, John (1989). Generalized Linear Models, Second Edition. Boca Raton: Chapman and Hall/CRC. ISBN 0-412-31760-5.

Nelder, John; Wedderburn, Robert (1972). "Generalized Linear Models". Journal of the Royal Statistical Society.

Series A (General). Blackwell Publishing. 135 (3): 370-384. doi:10.2307/2344614. JSTOR 2344614.

Nychka, D. (1988). "Bayesian confidence intervals for smoothing splines". Journal of the American Statistical Association. 83. pp. 1134-1143.

Reiss, P. T.; Ogden, T. R. (2009). "Smoothing parameter selection for a class of semiparametric linear models". Journal of the Royal Statistical Society, Series B. 71: 505-523. doi:10.1111/j.1467-9868.2008.00695.x.

Rigby, R. A.; Stasinopoulos, D. M. (2005). "Generalized additive models for location, scale and shape (with discussion)". Journal of the Royal Statistical Society, Series C. 54: 507-554. doi:10.1111/j.1467-9876.2005.00510.x.

Rue, H.; Martino, Sara; Chopin, Nicolas (2009). "Approximate Bayesian inference for latent Gaussian models by using integrated nested Laplace approximations (with discussion)". Journal of the Royal Statistical Society, Series B. 71: 319-392. doi:10.1111/j.1467-9868.2008.00700.x.

Ruppert, D.; Wand, M. P.; Carroll, R. J. (2003). Semiparametric Regression. Cambridge University Press.

Schmid, M.; Hothorn, T. (2008). "Boosting additive models using component-wise P-splines". Computational Statistics and Data Analysis. 53: 298-311. doi:10.1016/j.csda.2008.09.009.

Senn, Stephen (2003). "A conversation with John Nelder". Statistical Science. 18 (1): 118-131. doi:10.1214/ss/1056397489.

Silverman, B. W. (1985). "Some Aspects of the Spline Smoothing Approach to Non-Parametric Regression Curve Fitting (with discussion)". Journal of the Royal Statistical Society, Series B. 47. pp. 1-53.

Umlauf, Nikolaus; Adler, Daniel; Kneib, Thomas; Lang, Stefan; Zeileis, Achim. "Structured Additive Regression Models: An R Interface to BayesX". Journal of Statistical Software. 63 (21): 1-46.

Wahba, G. (1983). "Bayesian Confidence Intervals for the Cross Validated Smoothing Spline". Journal of the Royal Statistical Society, Series B. 45. pp. 133-150.

Wahba, Grace. Spline Models for Observational Data. SIAM Rev., 33(3), 502-502 (1991).

Wood, S. N. (2000). "Modelling and smoothing parameter estimation with multiple quadratic penalties". Journal of the Royal Statistical Society. Series B. 62 (2): 413-428. doi:10.1111/1467-9868.00240.

Wood, S. N. (2017). Generalized Additive Models: An Introduction with R (2nd ed). Chapman & Hall/CRC. ISBN 978-1-58488-474-3.

Wood, S. N.; Pya, N.; Saefken, B. (2016). "Smoothing parameter and model selection for general smooth models (with discussion)". Journal of the American Statistical Association. 111: 1548-1575. doi:10.1080/01621459.2016.1180986.

Wood, S. N. (2011). "Fast stable restricted maximum likelihood and marginal likelihood estimation of semiparametric generalized linear models". Journal of the Royal Statistical Society, Series B. 73: 3-36.

Wood, Simon (2006). Generalized Additive Models: An Introduction with R. Chapman & Hall/CRC. ISBN 1-58488-474-6.

Wood, Simon N. (2008). "Fast stable direct fitting and smoothness selection for generalized additive models". Journal of the Royal Statistical Society, Series B. 70 (3): 495-518. arXiv:0709.3906. doi:10.1111/j.1467-9868.2007.00646.x.

Yee, Thomas (2015). Vector generalized linear and additive models. Springer. ISBN 978-1-4939-2817-0.

Zeger, Scott L.; Liang, Kung-Yee; Albert, Paul S. (1988). "Models for Longitudinal Data: A Generalized Estimating Equation Approach". Biometrics. International Biometric Society. 44 (4): 1049-1060. doi:10.2307/2531734. JSTOR 2531734. PMID 3233245.

The stream of sensor data may comprise temporally averaged sensor data for a series of timestamps.

Communications between the transmitter to the receiver may be bandwidth constrained.

The transmitter and receiver may be asymmetric, wherein the transmitter is a data source and the receiver is a data sink, wherein the receiver is configured to receive communications from a plurality of transmitters.

The information characterizing subsequent sensor data may comprise the error of subsequent sensor data with respect to the prediction of the subsequent sensor data by the predictive statistical model comprises a standardized training error mean, standardized by subtracting a training error mean from an instantaneous error between subsequent sensor data and predicted subsequent sensor data, and dividing this difference by a training error standard deviation for a respective sensor, to produce a z-score of a prediction error.

The error of the subsequent sensor data with respect to the prediction of the subsequent sensor data may be statistically normalized and quantized with respect to units of standard deviation away from a predicted mean of the subsequent sensor data.

The error of the subsequent sensor data with respect to the prediction of the subsequent sensor data may be quantized in uneven steps with respect to units of standard deviation away from a predicted mean of the subsequent sensor data.

The error of the subsequent sensor data with respect to the prediction of the subsequent sensor data may be represented with higher resolution for smaller deviation away from a predicted mean of the subsequent sensor data than for higher deviation from the predicted mean of the subsequent sensor data.

The information defining the predictive statistical model communicated from the transmitter to the receiver may be encrypted.

The communicating of information characterizing subsequent sensor data may comprise communicating encrypted information representing independent variables and unencrypted information representing dependent variables.

The at least one processor may be further configured to calculate, the subsequent sensor data from the error of the sensor data and the prediction of the sensor data by statistical model.

The at least one processor may be further configured to acquire a time series of subsequent sensor data, and to communicate to the receiver information characterizing the time series of subsequent sensor data comprise a time series of errors of subsequent sensor data time samples with respect to a prediction of the subsequent sensor data time samples by the predictive statistical model.

The at least one processor may be configured to generate error statistics comprise a mean training error and a standard deviation of the mean training error for a stream of sensor data of the training data set in a training period based on the predictive statistical model.

The at least one processor may be configured to compute a predicted stream of sensor data, a predicted stream of sensor data error means, and a predicted stream of sensor data error standard deviations, based on the predictive statistical model.

The at least one processor may be configured to communicate the predicted stream of sensor data error means to the receiver.

The receiver may be configured to receive the predicted stream of sensor data error means, and based on the predictive statistical model and the received stream of sensor data error means, reconstruct the stream of sensor data.

The receiver may be configured to approximately reconstruct a stream of subsequent sensor data based on the received predictive statistical model, at least one control variable, and the errors of stream of subsequent sensor data.

The at least one processor may be configured to transmit a standard error of the prediction of the subsequent sensor data by the predictive statistical model to the receiver.

The receiver may be configured to infer the prediction of the subsequent sensor data by the predictive statistical model from the received standard error of the prediction and the predictive statistical model.

In accordance with some embodiments, the process of generating model and standard errors, and communicating data based on the generated model and training error statistics (error mean and standard deviation) is as follows.

An edge device collects machine data, such as an n-dimensional engine data time series that may include, but is not limited to, timestamps (ts) and the following engine parameters: engine speed (rpm), engine load percentage (load), coolant temperature (coolant temperature), coolant pressure (coolant pressure), oil temperature (oil temperature), oil pressure (oil pressure), fuel pressure (fuel pressure), and fuel actuator percentage (fuel actuator percentage). The edge device can be a computing node at the "edge" of an enterprise network, metropolitan network, or other network, in accordance with the geographic distribution of computing nodes in a network of, for example, IoT devices. In this aspect, edge computing is a distributed computing paradigm in which computation is largely or completely performed on distributed device nodes as opposed to primarily taking place in a centralized cloud environment.

For example, in accordance with some implementation of the presently disclosed technology, an edge computing device is installed on a vessel and interfaces with the electronic control units/modules (ECUs/ECMs) of all the diesel engines of the vessel. The edge computing device collects engine sensor data as a time series (e.g., all engines' RPMs, load percentages, fuel rates, oil pressures, oil temperatures, coolant pressures, coolant temperatures, air intake temperatures, bearing temperatures, cylinder temperatures, or the like), and collects vessel speed and location data from an internal GPS/DGPS of the edge device and/or the vessel's GPS/DGPS. The edge device can also interface and collect data from onboard PLC and other devices, systems, or assets such as generators, z-drives, tanks, or the like. Illustratively, the edge device collects the sensor data at an approximate rate of sixty samples per minute and aligns the data to every second's time-stamp (e.g., 12:00:00, 12:00:01, 12:00:02, . . . ) using its own clock that is synchronized via NTP service. For ships, this data is typically transmitted to shore office through satellite connectivity; and for vessels that operate near shore (e.g. inland tugboats) cellular data transmission is another option.

In an example vessel's edge device installation that has 1000 sensor data points, each day the edge device can collect, store and send 24*60*60*1000*4=345.6 MB of data at one second resolution (based on a configuration where each sensor data point is 4 bytes or 32 bits in size)! Even if the edge device sends minute's average data (i.e., average or arithmetic mean of every minute's data instead of every second's data), it will transmit 24*60*1000*4=5.76 MB a day over a low bandwidth connection (e.g., satellite or cellular), which can still strain low bandwidth network resources—especially when there are multiple vessels transmitting their respective data at the same time.

In various embodiments, the edge devices can reside on vessels, automobiles, aerial vehicles (e.g., planes, drones, etc.), Internet of Things (IoT) devices, or other mobile devices to collect data locally without transmitting the all of the collected data in explicit form to one or more servers, cloud storage, or other remote systems or devices. Referring back to machine data example above, in a variance analysis of diesel engine data, most of the engine parameters, including coolant temperature, are found to have strong correlation with engine RPM and engine load percentage in a bounded range of engine speed, when engine is in steady state, i.e., RPM and engine load is stable. Inside that bounded region of engine RPM (e.g., higher than idle engine RPM), there exists a function $f1$ such that:

$$\text{coolant temperature} = f1 \text{ (rpm,load)}$$

$f1: \mathbb{R}^n| \to \mathbb{R}^m$. In this case n equals two (rpm and load) and m equals one (coolant temperature)

In other words, $f1$ is a map that allows for prediction of a single dependent variable from two independent variables. Similarly, $$\text{coolant pressure} = f2(\text{rpm,load}) \text{ oil temperature} = f3 \text{ (rpm,load)}$$

$$\text{oil pressure} = f4(\text{rpm,load})$$

$$\text{fuel pressure} = f5(\text{rpm,load})$$

$$\text{fuel actuator percentage} = f6(\text{rpm,load}) \text{ fuel rate} = f7 \text{ (rpm,load)}$$

$$\text{intake temp} = f8(\text{rpm,load})$$

Grouping these maps into one map leads to a multi-dimensional map (i.e., the model) such that $f: \mathbb{R}^n| \to \mathbb{R}^m$ where n equals two (rpm, load) and m equals eight (coolant temperature, coolant pressure, oil temperature, oil pressure, fuel pressure, fuel actuator percentage, fuel rate and intake temp) in this case. Critically, many maps are grouped into a single map with the same input variables, enabling potentially many correlated variables (i.e., a tensor of variables) to be predicted within a bounded range. Note that the specific independent variables need not be engine RPM and engine load and need not be limited to two variables. For example, engine operating hours could be added as an independent variable in the map to account for engine degradation with operating time.

In order to create an engine model, a training time period is selected in which the engine had no apparent operational issues. A machine learning-based method is used to generate the engine models on the edge device or in the cloud. For example, a modeling technique is selected that offers low model bias (e.g., spline, neural network or support vector machines (SVM), and/or a Generalized Additive Model (GAM)).

In some embodiments, the programming language 'R' is used as an environment for statistical computing and graphics and GAM for creating a low bias model. Error statistics and/or the z-scores of the predicted errors are used to further minimize prediction errors. The engine's operating ranges can be divided into multiple distinct ranges and multiple multi-dimensional models can be built to improve model accuracy.

The same set of training data that was used to build the model (or other applicable training data) is then passed as an input set to the model in order to create a predicted sensor value(s) time series. By subtracting the predicted sensor values from the measured sensor values, an error time series for all the dependent sensor values is created for the training data set. The error statistics, such as mean and standard deviations of the training period error series, are computed and saved as the training period error statistics.

In the event that the data does not comply with presumptions, such as normal distribution, a normalization process may be included. In other cases, alternate statistical techniques may be employed, so long as they are synchronized at transmitter and receiver.

Once the model is deployed to the edge device and the system is operational, the dependent and independent sensor values can be measured in near real-time, and average data (e.g., per minute) may be computed. The expected value for dependent engine sensors can be predicted by passing the independent sensor values to the engine model. The error (i.e., the difference) between the measured value of a dependent variable and its predicted value can then be computed. These errors are standardized by subtracting the training error mean from the instantaneous error and dividing this difference by the training error standard deviations for a given sensor, which is essentially a z-score of prediction errors. These z-scores of prediction error or standardized prediction error can be sent to a remote computer instead of the actual raw data as measured using a bit description table as described later.

Suppose Y is a set of measured values of a dependent sensor variable, at time-stamps T, where $T=t_0, t_1, t_2, t_3, t_4, t_5, \ldots$ $Y=y_0, y_1, y_2, y_3, y_4, y_5, \ldots$ X0 and X1 are two independent variables whose values are measured at the same time stamps are $X0=x0_0, x0_1, x0_2, x0_3, x0_4, x0_5, \ldots$ $X1=x1_0, x1_1, x1_2, x1_3, x1_4, x1_5, \ldots$ and a machine learning based model exists $\hat{Y}=f(X0, X1)$ such that the values of Y can be predicted at the same time-stamps by $\hat{Y}$ where $\hat{Y}=\hat{y}_0, \hat{y}_1, \hat{y}_2, \hat{y}_3, \hat{y}_4, \hat{y}_5, \ldots$ such that, $\hat{y}_i=f(x0_i, x1_i)$ suppose the training mean error for sensor Y is $\mu_Y$, and training error's standard deviation for sensor Y is $\sigma_Y$ so the computed standard error series or z-scores of prediction errors will be $\varepsilon Y=\varepsilon y_1, \varepsilon y_2, \varepsilon y_3, \varepsilon y_4, \varepsilon y_5, \ldots$ where $\varepsilon y_i=((y_i-\hat{y}_i)-\mu_Y)/\sigma_Y$ The transmitter (e.g., edge device or sending computer) sends these standard errors along with independent variables X0, X1 and time-stamp data series T. Once these data are received, the receiver computes the predicted sensor value $\hat{y}_i$ at time $t_i$ $\hat{y}_i=f(x0_i, x1_i)$ where $f$ is the identical machine learning model on both sending and receiving sides. The receiving side can recover a given sensor's value provided that the receiver has the identical machine learning based model as the sender and the training error statistics:

$y_i=\hat{y}_i+\mu_Y+y_i\times\sigma_Y$

By introducing non-linear loss into the compression algorithm, the compression ratios can be greatly increased. As an example, consider the following buckets of standard errors, assigning unique standard error states to unique bit patterns, e.g.:

| Id | std. err. | Bits |
|---|---|---|
| 1 | 0 <= std. err < 1 | 00 |
| 2 | 0 > std. err > −1 | 01 |
| 3 | 1 <= std. err < 2 | 1000 |
| 4 | −1 >= std. err > −2 | 1100 |
| 5 | 2 <= std. err < 3 | 1001 |
| 6 | −2 >= std. err > −3 | 1101 |
| 7 | std. err >= 3 | 1010 |
| 8 | std. err <= −3 | 1110 |
| 9 | Error | 1011 |
| 10 | Null | 1111 |

Four bits represent the value of the standard error when the standard error is outside of the −1 to +1 range and two bits represent the value when standard error is within the −1 to +1 range. The receiver side algorithm can check if the most significant bit (i.e., the left most bit) is zero, thus identifying that the error will be within ±1 and be represented by two bits, otherwise the error will be greater than ±1 and represented by four bits. The second bit determines the polarity of the error quantity (positive or negative standard error) etc.

Using a typical diesel engine as an example, assume that a machine dataset containing 10 sensors must be transmitted. Assume that two of the sensors are independent and eight are dependent sensor variables. Given enough data, a machine learning based model can be generated such that the 8 dependent sensors values can be predicted from an input consisting of 2 independent variables.

Table 1 represents the output of the machine learning based model showing predictions of fuel pressure, fuel actuator percentage, oil temperature, oil pressure, coolant temperature, coolant pressure, fuel rate and intake temperature for an engine speed of 1454 RPM and various engine load percentages.

TABLE 1

| | | | | | |
|---|---|---|---|---|---|
| sample engine data averaged every minute | | | | | |
| time stamp | engine speed | engine percent load | fuel pressure | fuel actuator pct | oil temperature |
| May 30, 2017 20:16:00 | 1454 | 56.93 | 737.00 | 38.39 | 365.34 |
| May 30, 2017 20:17:00 | 1454 | 56.77 | 737.00 | 38.38 | 365.34 |
| May 30, 2017 20:18:00 | 1454 | 56.37 | 737.00 | 38.34 | 365.34 |
| May 30, 2017 20:19:00 | 1454 | 56.97 | 737.00 | 38.49 | 365.34 |
| May 30, 2017 20:20:00 | 1454 | 56.83 | 737.00 | 38.37 | 365.34 |
| May 30, 2017 20:21:00 | 1454 | 56.71 | 737.00 | 38.32 | 365.34 |
| May 30, 2017 20:22:00 | 1454 | 56.40 | 737.00 | 38.37 | 365.34 |
| May 30, 2017 20:23:00 | 1454 | 56.70 | 737.00 | 38.37 | 365.34 |
| May 30, 2017 20:24:00 | 1454 | 56.92 | 737.00 | 38.40 | 365.34 |

TABLE 1-continued sample engine data averaged every minute

| | | | | |
|---|---|---|---|---|
| May 30, 2017 20:25:00 | 1454 | 56.44 | 737.00 | 38.35 | 365.34 |
| May 30, 2017 20:26:00 | 1454 | 56.43 | 737.00 | 38.34 | 365.34 |

| time stamp | oil pressure | coolant temp | coolant pressure | fuel rate | intake temp |
|---|---|---|---|---|---|
| May 30, 2017 20:16:00 | 605.00 | 129.00 | 45.80 | 346.43 | 83.00 |
| May 30, 2017 20:17:00 | 605.00 | 129.00 | 44.54 | 346.33 | 83.00 |
| May 30, 2017 20:18:00 | 605.00 | 129.00 | 45.48 | 344.84 | 83.00 |
| May 30, 2017 20:19:00 | 605.00 | 129.00 | 45.37 | 348.59 | 83.50 |
| May 30, 2017 20:20:00 | 605.00 | 129.00 | 45.17 | 345.73 | 83.36 |
| May 30, 2017 20:21:00 | 605.00 | 129.00 | 45.69 | 345.40 | 83.67 |
| May 30, 2017 20:22:00 | 605.00 | 129.00 | 45.52 | 346.60 | 84.00 |
| May 30, 2017 20:23:00 | 605.00 | 129.00 | 46.31 | 346.22 | 83.92 |
| May 30, 2017 20:24:00 | 605.00 | 129.00 | 46.19 | 345.56 | 83.37 |
| May 30, 2017 20:25:00 | 605.00 | 129.00 | 46.31 | 345.92 | 83.29 |
| May 30, 2017 20:26:00 | 605.00 | 129.00 | 45.59 | 346.48 | 83.09 |

Once both sides compute the model, the 2 independent sensor variables, time stamp, and the standard error bucket for each sensor are sent, leading to a total data size of $$1\ ts*32\ bits + 2\ Ind.sensors*32\ bits + N\ Dep.sensors*4\ bit$$

in the worst case (i.e., when standard error is outside±1 range) or a saving of 4×8−4=28 bits per sensor. For 8 sensors, the savings will be 28×8 bits or 28 bytes for each time stamp.

Considering each data row consists of 10 sensors values and a timestamp, the raw size of each machine data row is $$1\ ts*32\ bits + 2\ Ind.sensors*32\ bits + 8\ Dep.sensors*32\ bits = 352\ bits = 44\ bytes$$

which compresses to the following:

$$1\ ts*32\ bits + 2\ Ind.sensors*32\ bits + 8\ Dep.sensors*4\ bit = 128\ bits = 16\ bytes$$

or a compression ratio of $$100 \times (1 - 16/44) = 63.63\%.$$

In the best case, which is also the average case (i.e., when the standard errors are inside the range of ±1), the standard errors are represented using 2 bits per sensor variable. So the compressed data size is $$1\ ts*32\ bits + 2\ Ind.sensors*32\ bits + 8\ Dep.sensors*2\ bit = 112\ bits = 14\ bytes$$

or a compression ratio of $$100 - (1 - 14/44) = 68.18\%.$$

In general, the compression ratio can be calculated for a machine with m sensors, where n sensors are independent variables, k sensors are dependent variables such that m=n+k, and r sensors are overhead (timestamp, position data, etc.). Assuming all data are 4 bytes. The data size of each row is $$(m+r) \times 4\ bytes,$$

whereas in the present scheme, the data row size is $$(n + k/8 + r) \times 4\ bytes$$

producing a compression ratio of $$100 \times (1 - (n+k/8+r) \times 4/(m+r) \times 4)$$

for m=20, n=2 and k=18, and r=1, the above scheme provides worst case compression ratio of $$100 \times (1 - (2 \times 4 + 18/2 + 4)/(21 \times 4)) = 75.0\%$$

for m=20, n=2 and k=18, and r=1, the above scheme provides best case and average case compression ratio of $$100 \times (1 - (2 \times 4 + 18/4 + 4)/(21 \times 4)) = 80.36\%$$

Similarly, for m=40, n=2 and k=38, and r=1, the above scheme provides best case and average case compression ratio of $$100 \times (1 - (2 \times 4 + 38/4 + 4)/(41 \times 4)) = 86.89\%$$

Many bucketing schemes of standard errors can be created. For example, ±1 standard error range may be merged to one state:

| Id | std. err. | bits |
|---|---|---|
| 1 | $-1 \geq$ std. err $\leq 1$ | 0 |
| 2 | $1 <$ std err $\leq 2$ | 1000 |
| 3 | $-1 >$ std err $\geq -2$ | 1100 |
| 4 | $2 <$ std err $\leq 3$ | 1001 |
| 5 | $-2 >$ std. err $\geq -3$ | 1101 |
| 6 | std. err $> 3$ | 1010 |
| 7 | std. err $< -3$ | 1110 |
| 8 | error | 1011 |
| 9 | null | 1111 | for m=20, n=2, k=18, and r=1, the above scheme's worst case compression ratio is same as before $$100 \times (1 - (2 \times 4 + 18/2 + 4)/(21 \times 4)) = 75.0\%$$

But, for m=20, n=2, k=18, and r=1, the above scheme provides best case compression ratio of $$100 - (1 - (2 \times 4 \times 8 + 18 + 4 \times 8)/(21 \times 4 \times 8)) = 83.04\%,$$

and for m=40, n=2, k=38, and r=1, the above scheme provides best case compression ratio of $$100 - (1 - (2 \times 4 \times 8 + 38 + 4 \times 8)/(41 \times 4 \times 8)) = 89.79\%$$

Instead of compressing machine data, the above algorithm may be used to increase precision for the range of data that occurs more frequently and decrease precision for the data that happens infrequently. For example, additional bits can be assigned to represent data that have standard errors in the range±3 z-scores and fewer bits for data that have standard error outside of that range.

In some embodiments, the presently disclosed technology does not involve sending at least some part of the actual data; rather, the technology uses parameters and/or statistical errors to implicitly communicate the actual data. Therefore, the system may be used as a data obfuscation technique. In some embodiments, the actual, exact data values cannot be recovered from the sensor standard error values without prior knowledge of the model and model parameters. If the model is encrypted during transmission, only the independent variables need be sent encrypted during transmission. The standard errors for dependent sensor variables may be sent as plain text, thus reducing the transmission encryption overhead and improving performance.

A linear model generated by machine learning may also be used, which greatly decreases the model size as compared to other modeling techniques. Since only two model parameters are required (i.e., offset and gradient) and relatively little computing resources are needed to generate a linear model, the recalculation and re-transmission of the model can occur more frequently and on any transmission interface, e.g., on satellite, LoRaWAN, cellular, etc. Additionally, range-based linear models may also be used. For example, the full operating range of independent parameters are divided into 'n' smaller ranges and 'n' linear models are computed for each smaller range. Considering that only a few variables are required to store linear models, the combined model size would remain very small (e.g., 100 range based models require 100×2 parameters per model×4 bytes per parameter+100×(1 error mean+1 error standard deviations)×4 bytes each=1600 bytes or 4 orders of magnitude smaller than the model lookup table referenced above).

FIG. 1 shows a block diagram of a system including at least a transmitter 102 and a receiver 112 according to some embodiments of the presently disclosed technology. As described above, the transmitter 102 can be an edge device that receives a data stream 108 from one or more sensors. Some embodiments of an edge device are described in U.S. application Ser. No. 15/703,487 filed Sep. 13, 2017. The transmitter 102 can include one or more processors 104 configured to implement statistical model(s) 106 and encode data differentials (e.g., into bits representation) with respect to the statistical model(s) used. The transmitter 102 is communicatively connected to the receiver 112 via network connection(s) 120. The receiver 112 can be a server including one or more processors 114 configured to implement statistical model(s) 116 and decode data differentials (e.g., from bits representation) with respect to the statistical model(s) used. After or as the decoding is performed, the receiver 112 can generate a reconstructed data stream 118 and provide it to another device or a user.

As an example, the transmitter may be constructed as follows. A controller of the transmitter may include any or any combination of a system-on-chip, or commercially available embedded processor, Arduino, MeOS, MicroPython, Raspberry Pi, or other type processor board. The transmitter may also include an Application Specific Integrated Circuit (ASIC), an electronic circuit, a programmable combinatorial circuit (e.g., FPGA), a processor (shared, dedicated, or group) or memory (shared, dedicated, or group) that may execute one or more software or firmware programs, or other suitable components that provide the described functionality. The controller has an interface to a communication port, e.g., a radio or network device.

In embodiments, one or more of sensors determine, sense, and/or provide to controller data regarding one or more other characteristics may be and/or include Internet of Things ("IoT") devices. IoT devices may be objects or "things", each of which may be embedded with hardware or software that may enable connectivity to a network, typically to provide information to a system, such as controller. Because the IoT devices are enabled to communicate over a network, the IoT devices may exchange event-based data with service providers or systems in order to enhance or complement the services that may be provided. These IoT devices are typically able to transmit data autonomously or with little to no user intervention. In embodiments, a connection may accommodate vehicle sensors as IoT devices and may include IoT-compatible connectivity, which may include any or all of WiFi, LoRan, 900 MHz Wifi, BlueTooth, low-energy BlueTooth, USB, UWB, etc. Wired connections, such as Ethernet 1000baseT, CANBus, USB 3.0, USB 3.1, etc., may be employed.

Embodiments may be implemented into a computing device or system using any suitable hardware and/or software to configure as desired. The computing device may house a board such as motherboard which may include a number of components, including but not limited to a processor and at least one communication interface device. The processor may include one or more processor cores physically and electrically coupled to the motherboard. The at least one communication interface device may also be physically and electrically coupled to the motherboard. In further implementations, the communication interface device may be part of the processor. In embodiments, processor may include a hardware accelerator (e.g., FPGA).

Depending on its applications, computing device may include other components which include, but are not limited to, volatile memory (e.g., DRAM), non-volatile memory (e.g., ROM), and flash memory. In embodiments, flash and/or ROM may include executable programming instructions configured to implement the algorithms, operating system, applications, user interface, etc.

In embodiments, computing device may further include an analog-to-digital converter, a digital-to-analog converter, a programmable gain amplifier, a sample-and-hold amplifier, a data acquisition subsystem, a pulse width modulator input, a pulse width modulator output, a graphics processor, a digital signal processor, a crypto processor, a chipset, a cellular radio, an antenna, a display, a touchscreen display, a touchscreen controller, a battery, an audio codec, a video codec, a power amplifier, a global positioning system (GPS) device or subsystem, a compass (magnetometer), an accelerometer, a barometer (manometer), a gyroscope, a speaker, a camera, a mass storage device (such as a SIM card interface, and SD memory or micro-SD memory interface, SATA interface, hard disk drive, compact disk (CD), digital versatile disk (DVD), and so forth), a microphone, a filter, an oscillator, a pressure sensor, and/or an RFID chip.

The communication network interface device may enable wireless communications for the transfer of data to and from the computing device. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip may operate in accordance with other wireless protocols in other embodiments. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The processor of the computing device may include a die in a package assembly. The term "processor" may refer to any device or portion of a device that processes electronic data from registers and/or memory to transform that electronic data into other electronic data that may be stored in registers and/or memory.

Figure 2:
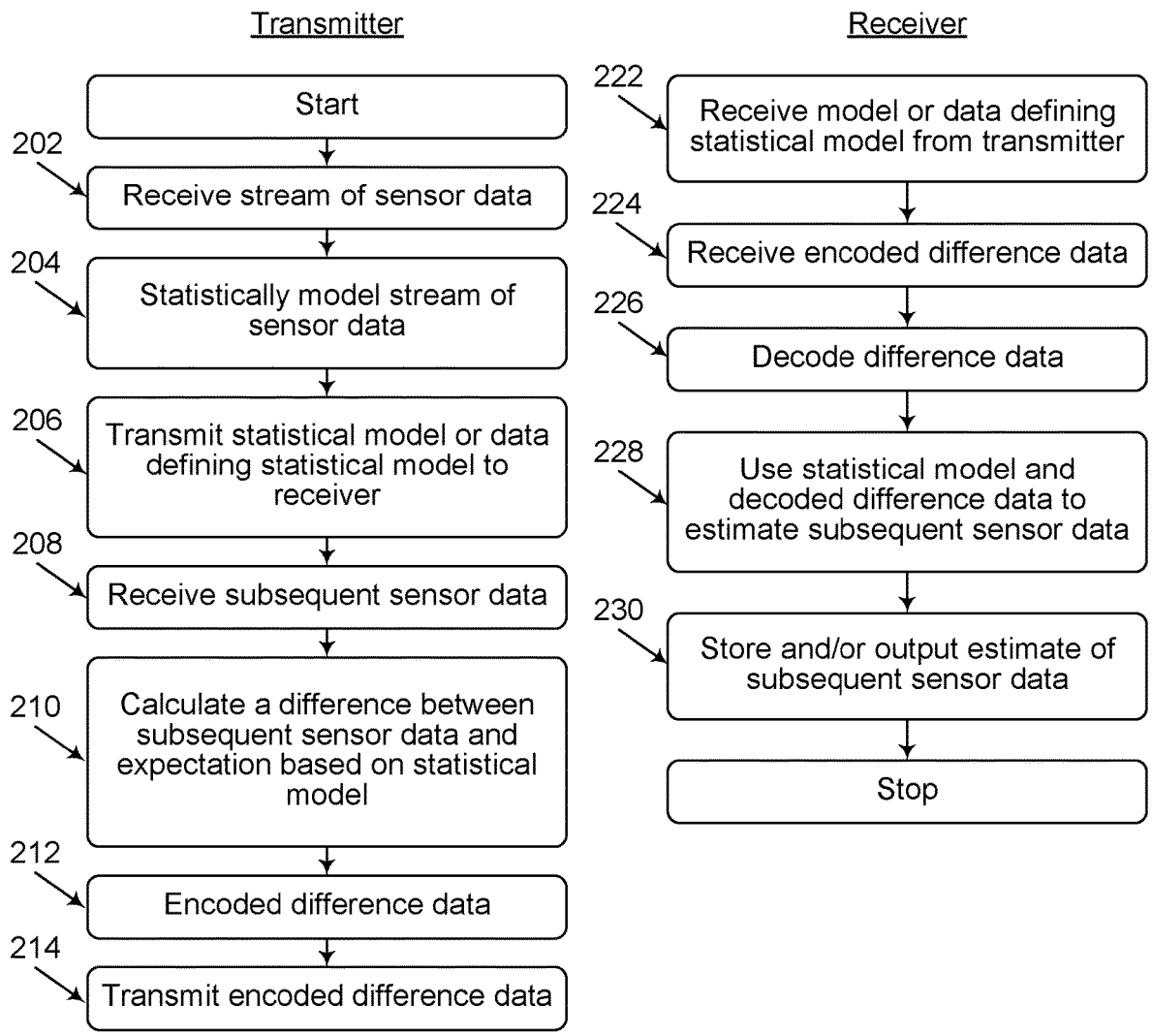
FIG. 2 shows a flowchart of actions performed by the transmitter and the receiver according to some embodiments of the presently disclosed technology.

FIG. 2 shows a flowchart of actions performed by the transmitter and the receiver of FIG. 1, according to some embodiments of the presently disclose technology.

As shown in FIG. 2, at block 202 the transmitter receives a stream of sensor data. At block 204, the transmitter receives inputs on or automatically generates statistical model(s) that describe or otherwise model the stream of sensor data. At block 206, the transmitter transmits to the receiver the statistical model(s) or data (e.g., model parameters) defining the statistical model(s). At block 208, the transmitter receives subsequent sensor data of the stream. At block 210, the transmitter calculates a difference between the subsequent sensor data and the expectation (e.g., predicted values) based on the statistical model(s). At block 212, the transmitter encodes the difference data (e.g., into bits representations). At block 214, the transmitter transmits the encoded difference data to the receiver.

With continued reference to FIG. 2, at block 222, the receiver receives from the transmitter the statistical model(s) or the data defining the statistical model(s). At block 224, the receiver receives the encoded difference data. At block 226, the receiver decodes the difference data. At block 228, the receiver uses the statistical model(s) and the decoded difference data to estimate the subsequent sensor data. At block 230, the receiver outputs the estimated subsequent sensor data.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. The various embodiments and optional features recited herein may be employed in any combination, subcombination, or permutation, consistent with the discussions herein. This application is intended to cover any adaptations or variations of the embodiments discussed herein, limited only by the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. In cases where any document incorporated by reference conflicts with the present application, the present application controls.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A computer-implemented method for communicating information between a transmitting device and a receiving device, comprising:

collecting, by the transmitting device, sensor data produced at least partially by a plurality of sensors;

communicating, from the transmitting device to the receiving device, information defining one or more predictive statistical models, wherein the one or more predictive statistical models have been trained, based at least partially on prior instances of a first category and a second category of the collected sensor data, to at least predict subsequent instances of the second category of the collected sensor data based at least partially on subsequent instances of the first category of the collected sensor data; and after communicating the information defining the one or more predictive statistical models, communicating, from the transmitting device to the receiving device, at least an error regarding the subsequent instances of the second category of the collected sensor data with respect to a prediction made using the one or more predictive statistical models based at least partially on the subsequent instances of the first category of the collected sensor data, for reconstructing at least the subsequent instances of the second category of the collected sensor data, wherein the error regarding the subsequent instances of the second category of the collected sensor data with respect to prediction made using the one or more predictive statistical models comprises a standardized training error mean, standardized by subtracting a training error mean from an instantaneous error between at least one of the subsequent instances of the second category, and at least a predicted value of the at least one of the subsequent instances of the second category, and dividing a difference resulted from the subtraction by a training error standard deviation for a respective sensor, to produce a z-score of a prediction error.

2. A computer-implemented method of communicating information between a transmitting device and a receiving device, comprising:

collecting, by the transmitting device, sensor data produced at least partially by a plurality of sensors;

obtaining information defining one or more predictive statistical models, wherein the one or more predictive statistical models have been trained, based at least partially on prior instances of sensor data, to predict at least one of subsequent instances of a second category of the collected sensor data based at least partially on one of subsequent instances of a first category of the collected sensor data; and communicating, from the transmitting device to the receiving device, at least error data associated with a prediction made using the one or more statistical predictive models based at least partially on one of the subsequent instances of the first category of the collected sensor data, wherein the error data comprises a standardized training error mean, standardized by subtracting a training error mean from an instantaneous error between at least one of the subsequent instances of the second category and at least one predicted value of the at least one of the subsequent instances of the second category, and dividing a difference resulted from the subtraction by a training error standard deviation for a respective sensor, to produce a z-score of a prediction error.

3. The method of claim 2, wherein the first category of the collected sensor data corresponds to independent variables of the one or more predictive statistical models and the second category of the collected sensor data corresponds to dependent variables of the one or more predictive statistical models.

4. The method of claim 2, wherein the error data associated with the prediction comprises an indication of difference between at least one of the subsequent instances of the second category of the collected sensor data and a prediction made using the one or more statistical models based on the at least one of the subsequent instances of the first category of the collected sensor data.

5. The method of claim 2, wherein the one or more predictive statistical models are trained based at least partially on prior instances of the first and second categories of sensor data.

6. The method of claim 2, further comprising updating the one or more predicative statistical models based at least partially on the subsequent instances of the first category of the collected sensor data and the subsequent instances of the second category of the collected sensor data.

7. A method of communicating information, comprising:
modeling a stream of prior sensor data, to produce parameters of a predictive statistical model for predicting a second subset of subsequent sensor data based at least in part on a first subset of the subsequent sensor data, wherein the stream of prior sensor data comprises sensor data from a plurality of sensors which are dependent on at least one common control variable;
collecting instances of the subsequent sensor data;
communicating, from a transmitter to a receiver, information defining the predictive statistical model including a representation of the at least one common control variable; and
after communicating the information defining the predictive statistical model to the receiver, communicating from the transmitter to the receiver, at least an error of the subsequent sensor data with respect to a prediction of the subsequent sensor data made using the statistical model based on at least one of the collected instances of the subsequent sensor data, including entropy-encoded standard errors of the subsequent sensor data.

8. The method of claim 7, further comprising calculating, at the receiver, the subsequent sensor data based at least partially on the error of the subsequent sensor data and the prediction of the subsequent sensor data.

9. The method of claim 7, further comprising acquiring a time series of the subsequent sensor data, and communicating from the transmitter to the receiver, information characterizing the time series of subsequent sensor data comprising a time series of errors of the subsequent sensor data time samples with respect to a prediction of the subsequent sensor data time samples by the predictive statistical model.

10. The method of claim 7, wherein the predictive statistical model is adaptive to the communicated information characterizing the subsequent sensor data.

11. The method of claim 7, further comprising storing information dependent on the predictive statistical model in a memory of the transmitter and a memory of the receiver.

12. The method of claim 7, further comprising determining a sensor data standard error based at least partially on a predicted sensor data error standard deviation.

13. The method of claim 7, wherein the predictive statistical model is derived based at least partially on relationships between independent and dependent variables represented in the prior sensor data.

14. The method of claim 13, wherein the predictive statistical model generates error statistics comprising a mean training error and a standard deviation of the mean training error for a stream of sensor data of a training data set in a training period.

15. The method of claim 14, further comprising computing a predicted stream of sensor data, a predicted stream of sensor data error means, and a predicted stream of sensor data error standard deviations, based at least partially on the predictive statistical model.

16. The method of claim 15, further comprising communicating the predicted stream of sensor data error means from the transmitter to the receiver.

17. The method of claim 16, further comprising receiving the predicted stream of sensor data error means at the receiver, and based at least partially on the predictive statistical model and the received stream of sensor data error means, reconstructing the stream of sensor data.

18. A system, comprising:
one or more processors; and
memory storing contents that, when executed by the one or more processors, cause the system to:
obtain information defining a predictive statistical model that models a stream of sensor data for predicting a second subset of subsequent sensor data based at least in part on a first subset of the subsequent sensor data, wherein the stream of sensor data comprises sensor data from a plurality of sensors which are dependent on at least one common control variable;
collect instances of the subsequent sensor data; and
communicate, from a transmitter to a receiver, a representation of the at least one common control variable and at least an error of the subsequent sensor data with respect to a prediction of the subsequent sensor data made using the statistical model based on at least one of the collected instances of the subsequent sensor data, wherein the at least an error includes entropy-encoded standard errors of the subsequent sensor data.

19. The system of claim 18, wherein the predictive statistical model is dependent on a correlation between portions of the sensor data from two or more different sensors of the plurality of sensors, and the contents, when executed by the one or more processors, further cause the system to:
calculate standard errors of the subsequent sensor data with respect to the predictive statistical model dependent on the correlation of the sensor data; and
entropy encoding the standard errors to generate the entropy-encoded standard errors.

20. The system of claim 18, wherein the stream of sensor data comprises timestamped data comprising at least one of engine speed, engine load, coolant temperature, coolant pressure, oil temperature, oil pressure, fuel pressure, or fuel actuator state.

21. The system of claim 18, wherein the predictive statistical model comprises at least one of a spline model, a neural network, a support vector machine, or a Generalized Additive Model (GAM).

22. The system of claim 18, wherein the stream of sensor data comprises temporally averaged sensor data for a series of timestamps.

23. The system of claim 18, wherein communications between the transmitter and the receiver are bandwidth constrained.

24. The system of claim 18, wherein the transmitter and receiver are asymmetric, wherein the transmitter is a data source and the receiver is a data sink, wherein the receiver is configured to receive communications from a plurality of transmitters.

25. The system of claim 18, wherein the at least an error of subsequent sensor data with respect to the prediction of the subsequent sensor data comprises a standardized training error mean, standardized by subtracting a training error mean from an instantaneous error between at least an instance of the subsequent sensor data and at least a predicted instance of the subsequent sensor data, and dividing a difference resulted from the subtraction by a training error standard deviation for a respective sensor, to produce a z-score of a prediction error.

26. The system of claim 18, wherein the error of the subsequent sensor data with respect to the prediction of the subsequent sensor data is statistically normalized and quantized with respect to units of standard deviation away from a predicted mean of the subsequent sensor data.

27. The system of claim 18, wherein the error of the subsequent sensor data with respect to the prediction of the subsequent sensor data is quantized in different sizes with respect to units of standard deviation away from a predicted mean of the subsequent sensor data.

28. The system of claim 18, wherein the error of the subsequent sensor data with respect to the prediction of the subsequent sensor data is represented in accordance with a deviation away from a predicted mean of the subsequent sensor data.

29. The system of claim 18, wherein the communicating information characterizing subsequent sensor data comprises communicating encrypted information representing independent variables and unencrypted information representing dependent variables.

* * * * *